(12) United States Patent
Suh et al.

(10) Patent No.: US 11,398,475 B2
(45) Date of Patent: Jul. 26, 2022

(54) INTEGRATED CIRCUIT DEVICES

(71) Applicant: SAMSUNG ELECTRONICS CO., LTD., Suwon-si (KR)

(72) Inventors: Dongchan Suh, Suwon-si (KR); Dahye Kim, Suwon-si (KR)

(73) Assignee: SAMSUNG ELECTRONICC CO. LTD, Suwon-si (KR)

( * ) Notice: Subject to any disclaimer, the term of this patent is extended or adjusted under 35 U.S.C. 154(b) by 38 days.

(21) Appl. No.: 16/704,448

(22) Filed: Dec. 5, 2019

(65) Prior Publication Data
US 2020/0381427 A1   Dec. 3, 2020

(30) Foreign Application Priority Data

May 29, 2019 (KR) .................. 10-2019-0063309

(51) Int. Cl.
*H01L 27/088* (2006.01)
*H01L 21/8234* (2006.01)
*H01L 29/78* (2006.01)

(52) U.S. Cl.
CPC .. *H01L 27/0886* (2013.01); *H01L 21/823412* (2013.01); *H01L 21/823431* (2013.01); *H01L 29/7851* (2013.01)

(58) Field of Classification Search
CPC ........... H01L 27/0886; H01L 29/42392; H01L 29/7851; H01L 29/78696
See application file for complete search history.

(56) References Cited

U.S. PATENT DOCUMENTS

| | | | |
|---|---|---|---|
| 4,894,349 A | 1/1990 | Saito et al. | |
| 5,893,949 A | 4/1999 | King et al. | |
| 6,054,739 A * | 4/2000 | Yamazaki | H01L 27/1296 257/347 |
| 7,566,364 B2 | 7/2009 | Xianyu et al. | |
| 8,580,624 B2 | 11/2013 | Bangsaruntip et al. | |
| 9,153,647 B1 * | 10/2015 | Cheng | H01L 21/823821 |
| 9,577,100 B2 | 2/2017 | Cheng et al. | |
| 10,332,881 B1 * | 6/2019 | Badaroglu | H01L 27/0207 |
| 10,510,871 B1 * | 12/2019 | More | H01L 29/7856 |
| 2007/0187668 A1 | 8/2007 | Noguchi et al. | |
| 2011/0073952 A1 * | 3/2011 | Kwok | H01L 29/7848 257/368 |

(Continued)

FOREIGN PATENT DOCUMENTS

IN   201834021486   3/2019
KR   10-1155176 B1   6/2012

*Primary Examiner* — Feifei Yeung Lopez
(74) *Attorney, Agent, or Firm* — Sughrue Mion, PLLC

(57) ABSTRACT

Provided is an integrated circuit device including: a plurality of fin-type active regions protruding from a top surface of a substrate and extending in a first horizontal direction; at least one semiconductor layer, each including a lower semiconductor layer and an upper semiconductor layer sequentially stacked on at least one of the plurality of fin-type active regions; and a plurality of gate electrodes extending in a second horizontal direction crossing the first horizontal direction on the plurality of fin-type active regions, wherein the lower semiconductor layer includes a same material as a material of the upper semiconductor layer, and wherein a semiconductor interface is provided between the lower semiconductor layer and the upper semiconductor layer.

16 Claims, 46 Drawing Sheets

(56) References Cited

U.S. PATENT DOCUMENTS

2014/0175374 A1    6/2014   Chang et al.
2014/0299934 A1*   10/2014   Kim ..................... H01L 29/785
                                                                                                                           257/347
2017/0104067 A1*   4/2017   Lee ................... H01L 21/30625

* cited by examiner

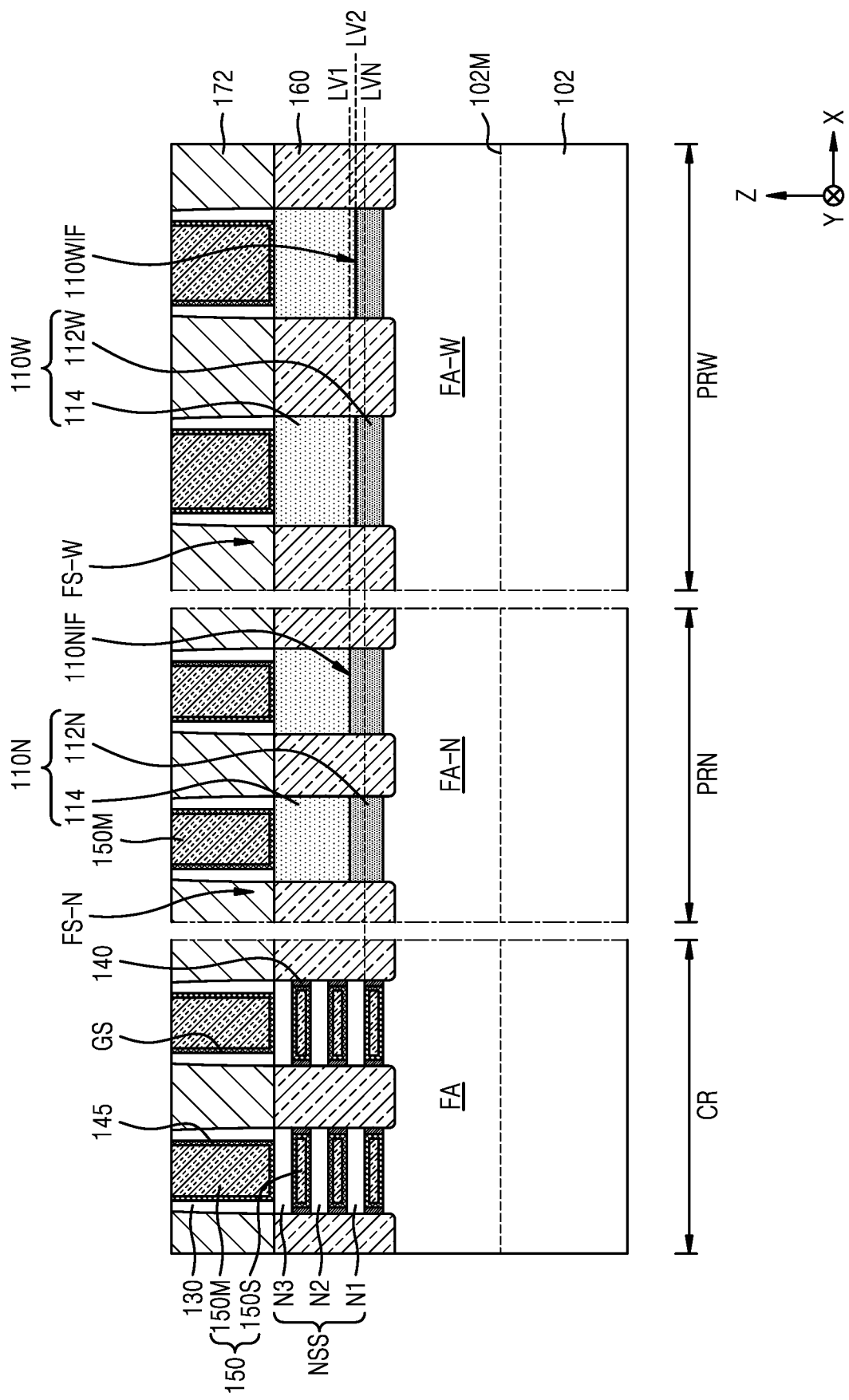

INTEGRATED CIRCUIT DEVICES

CROSS-REFERENCE TO RELATED APPLICATION

This application claims priority from Korean Patent Application Nos. 10-2019-0063309, filed on May 29, 2019 in the Korean Intellectual Property Office, the disclosure of which is incorporated herein in its entirety by reference.

BACKGROUND

Apparatuses and methods consistent with one or more exemplary embodiments relate to an integrated circuit device, and more particularly, to an integrated circuit device having a multi-gate metal-oxide-semiconductor field-effect transistor (MOSFET).

As the integration density of integrated circuit devices increases, sizes of devices have been reduced by as much as possible and the scaling of a device has reached its limit. Therefore, in order to improve the performance of a device, a change in the structure of the device is required. Also, a transistor having various characteristics needs to be provided within an integrated circuit device.

SUMMARY

Aspects of one or more exemplary embodiments provide an integrated circuit device having transistors having various characteristics, e.g., a multi-gate metal-oxide-semiconductor field-effect transistor (MOSFET).

According to an aspect of an exemplary embodiment, there is provided an integrated circuit device. The integrated circuit device includes: a plurality of fin-type active regions protruding from a top surface of a substrate and extending in a first horizontal direction; at least one semiconductor layer, each including a lower semiconductor layer and an upper semiconductor layer sequentially stacked on at least one of the plurality of fin-type active regions; and a plurality of gate electrodes extending in a second horizontal direction crossing the first horizontal direction on the plurality of fin-type active regions, wherein the lower semiconductor layer includes a same material as a material of the upper semiconductor layer, and wherein a semiconductor interface is provided between the lower semiconductor layer and the upper semiconductor layer.

According to an aspect of another exemplary embodiment, there is provided an integrated circuit device including: a plurality of first fin-type active regions extending from a top surface of a substrate, in a first peripheral circuit region, in a first horizontal direction; a plurality of second fin-type active regions extending from the top surface of the substrate, in a second peripheral circuit region, in the first horizontal direction; a plurality of first semiconductor layers on the plurality of first fin-type active regions and each including: a first lower semiconductor layer and a first upper semiconductor layer sequentially stacked on a corresponding first fin-type active region among the plurality of first fin-type active regions, and a first semiconductor interface between the first lower semiconductor layer and the first upper semiconductor layer; a plurality of second semiconductor layers on the plurality of second fin-type active regions and each including: a second lower semiconductor layer and a second upper semiconductor layer sequentially stacked on a corresponding second fin-type active region among the plurality of second fin-type active regions, and a second semiconductor interface between the second lower semiconductor layer and the second upper semiconductor layer; and a plurality of gate electrodes extending in a second horizontal direction crossing the first horizontal direction on the substrate, wherein a topmost level of the first semiconductor interface relative to the substrate in the vertical direction is higher than a topmost level of the second semiconductor interface relative to the substrate in the vertical direction.

According to an aspect of another exemplary embodiment, there is provided an integrated circuit device including: a plurality of fin-type active regions protruding from a top surface of a substrate, which includes a cell region and a peripheral circuit region, and extending in a first horizontal direction; a nano-sheet stacked structure including a plurality of nano-sheets stacked apart from one another above a top surface of a fin-type active region in the cell region, among the plurality of the fin-type active regions, and extending parallel to the top surface of the fin-type active region, each of the plurality of nan-sheets including a channel region; at least one semiconductor layer each including: a lower semiconductor layer and an upper semiconductor layer sequentially stacked on at least one of the plurality of fin-type active regions, and a semiconductor interface between the lower semiconductor layer and the upper semiconductor layer; and a plurality of gate electrodes extending in a second horizontal direction crossing the first horizontal direction on the plurality of fin-type active regions.

BRIEF DESCRIPTION OF THE DRAWINGS

Exemplary embodiments will be more clearly understood from the following detailed description taken in conjunction with the accompanying drawings in which:

FIGS. 21 to 32, 33A, 33B, 34 to 38, 39A, and 39B are cross-sectional views of operations of a method of manufacturing an integrated circuit device, according to one or more exemplary embodiments, and an integrated circuit device manufactured thereby.

DETAILED DESCRIPTION OF EXEMPLARY EMBODIMENTS

Hereinafter, it is understood that expressions such as "at least one of A and B," and the like include all possible combinations of the listed items. That is, "at least one of A and B" includes (1) at least one A, (2) at least one B, or (3) at least one A and at least one B.

FIGS. 1 to 13, 14A, 14B, 15 to 19, 20A, and 20B are cross-sectional views of operations of a method of manufacturing an integrated circuit device, according to example embodiments of the inventive concept, and an integrated circuit device manufactured thereby. In detail, FIGS. 1 to 13, 14A, and 20A are cross-sectional views taken along the YZ plane, FIGS. 14B, 15 to 19, and 20B are cross-sectional views taken along the XZ plane, FIG. 14B is a cross-sectional view taken along a line C-C and a line P-P' of FIG. 14A, FIGS. 15 to 19 are cross-sectional views taken along locations corresponding to the line C-C' and the line P-P' of FIG. 14A, and FIG. 20B is a cross-sectional view taken along a line C-C and a line P-P' of FIG. 20A.

Figure 1:
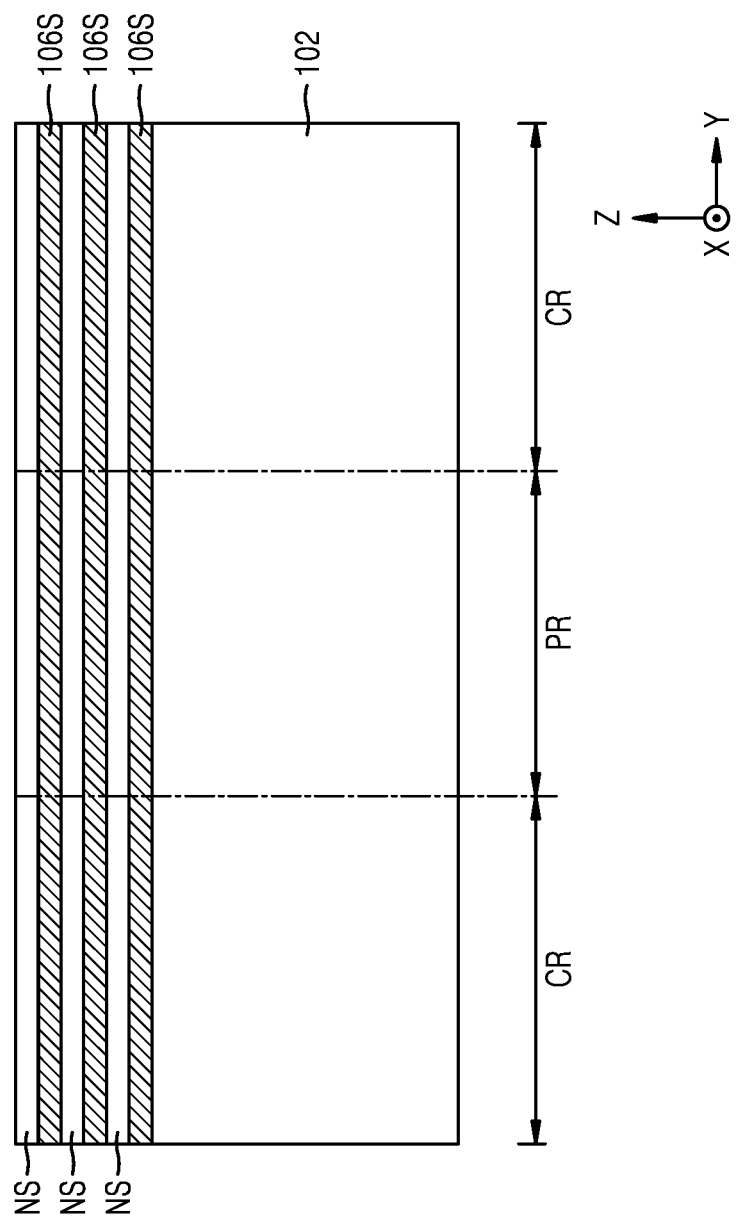
FIGS. 1 to 13, 14A, 14B, 15 to 19, 20A, and 20B are cross-sectional views of operations of a method of manufacturing an integrated circuit device, according to one or more exemplary embodiments, and an integrated circuit device manufactured thereby.

Referring to FIG. 1, a plurality of sacrificial semiconductor layers 106S and a plurality of nano-sheet semiconductor layers NS are alternately stacked one-by-one on a substrate 102 having a cell region CR and a peripheral circuit region PR. The sacrificial semiconductor layers 106S and the nano-sheet semiconductor layers NS may include different semiconductor materials. In some exemplary embodiments, the nano-sheet semiconductor layers NS may include a single material. Furthermore, in some exemplary embodiments, the nano-sheet semiconductor layers NS may include the same material as the material constituting the substrate 102. By way of example, the sacrificial semiconductor layers 106S may include SiGe, and the nano-sheet semiconductor layers NS may include Si, but it is understood that one or more other exemplary embodiments are not limited thereto.

The sacrificial semiconductor layers 106S may each have the same thickness, though one or more other exemplary embodiments are not limited thereto. For example, according to another exemplary embodiment, the thickness of the sacrificial semiconductor layer 106S closest to the substrate 102 from among the sacrificial semiconductor layers 106S may be greater than the thickness of the other sacrificial semiconductor layer 106S.

The substrate 102 may include a semiconductor material like Si or Ge or a compound semiconductor material like SiGe, SiC, GaAs, InAs, or InP. In some exemplary embodiments, the substrate 102 may include at least one of a Group III-V material and a Group IV material. The Group III-V material may be a binary, ternary, or quaternary compound including at least one Group III element and at least one Group V element. In some exemplary embodiments, in the case of forming an NMOS transistor on a portion of the substrate 102, the portion of the substrate 102 may include any one of the Group III-V materials described above. According to one or more other exemplary embodiments, in the case of forming a PMOS transistor on a portion of the substrate 102, the portion of the substrate 102 may include Ge. In another example, the substrate 102 may have a semiconductor-on-insulator (SOI) structure. The substrate 102 may include a conductive region, e.g., a well doped with an impurity or a structure doped with an impurity.

Figure 2:
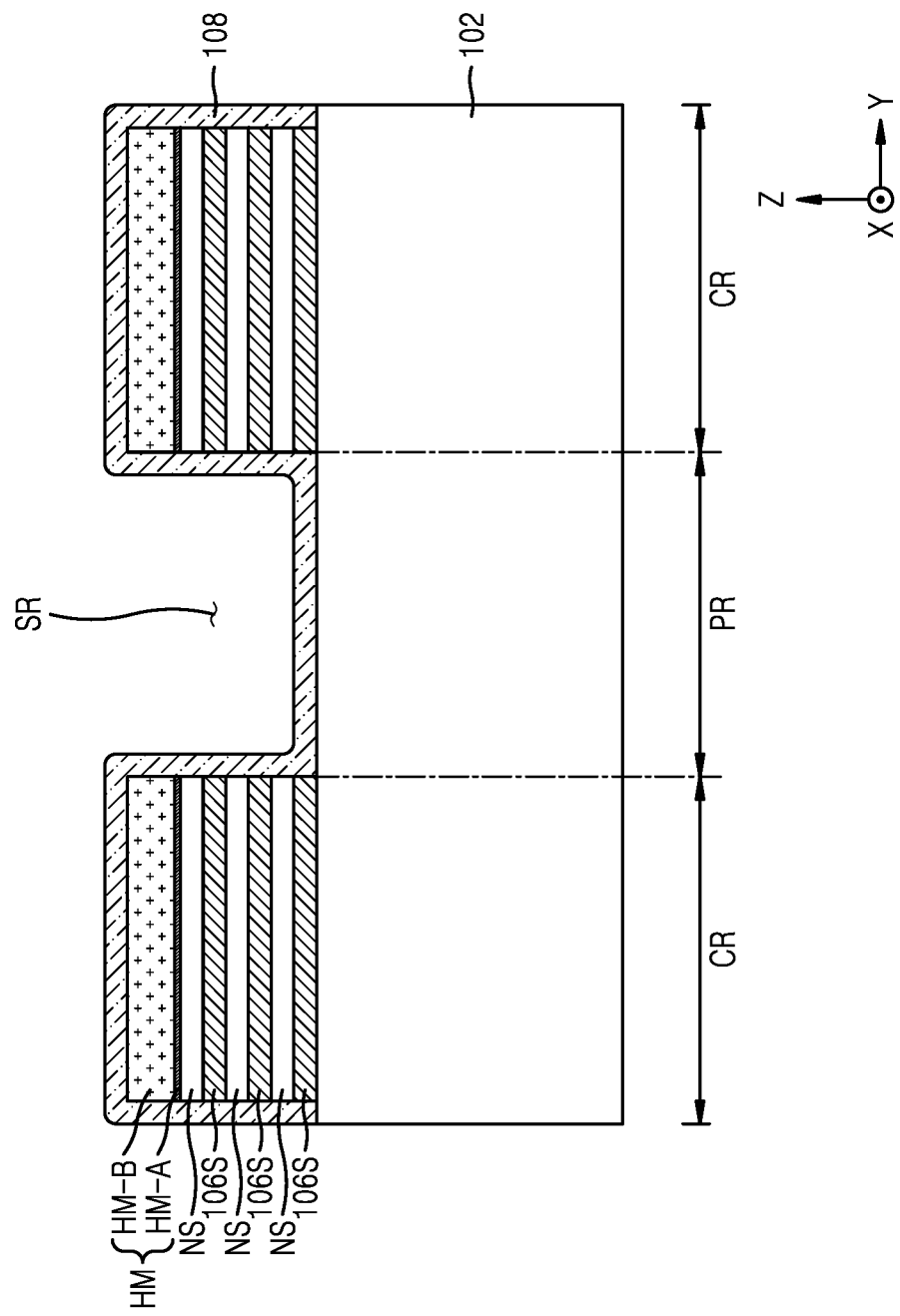

Referring to FIG. 2, a hard mask pattern HM is formed on a stacked structure including a plurality of sacrificial semiconductor layers 106S and a plurality of nano-sheet semiconductor layers NS in a cell region CR. The hard mask pattern HM may not cover the stacked structure including the sacrificial semiconductor layers 106S and the nano-sheet semiconductor layers NS in the peripheral circuit region PR and may cover the entire stacked structure including the semiconductor layers 106S and the nano-sheet semiconductor layers NS in the cell region CR.

The hard mask pattern HM may have a stacked structure including a first hard mask layer HM-A and a second hard mask layer HM-B. For example, the first hard mask layer HM-A may include a silicon oxide and the second hard mask layer HM-B may include a silicon nitride, polysilicon, a spin-on hard mask (SOH) material, or a combination thereof. It is understood, however, that one or more other exemplary embodiments are not limited thereto.

A stack recess SR is formed by removing a portion of the stacked structure including the sacrificial semiconductor layers 106S and the nano-sheet semiconductor layers NS in the peripheral circuit region PR by using the hard mask pattern HM as an etch mask. As a result, the top surface of the substrate 102 may be exposed in the peripheral circuit region PR.

After forming the stack recess SR, a cover insulation layer 108 conformally covering inner sidewalls and the bottom surface of the stack recess SR and surfaces of the stacked structure including the sacrificial semiconductor layers 106S and the nano-sheet semiconductor layers NS having formed thereon the hard mask pattern HM is formed. The cover insulation layer 108 may include, for example, a silicon oxide.

Figure 3:
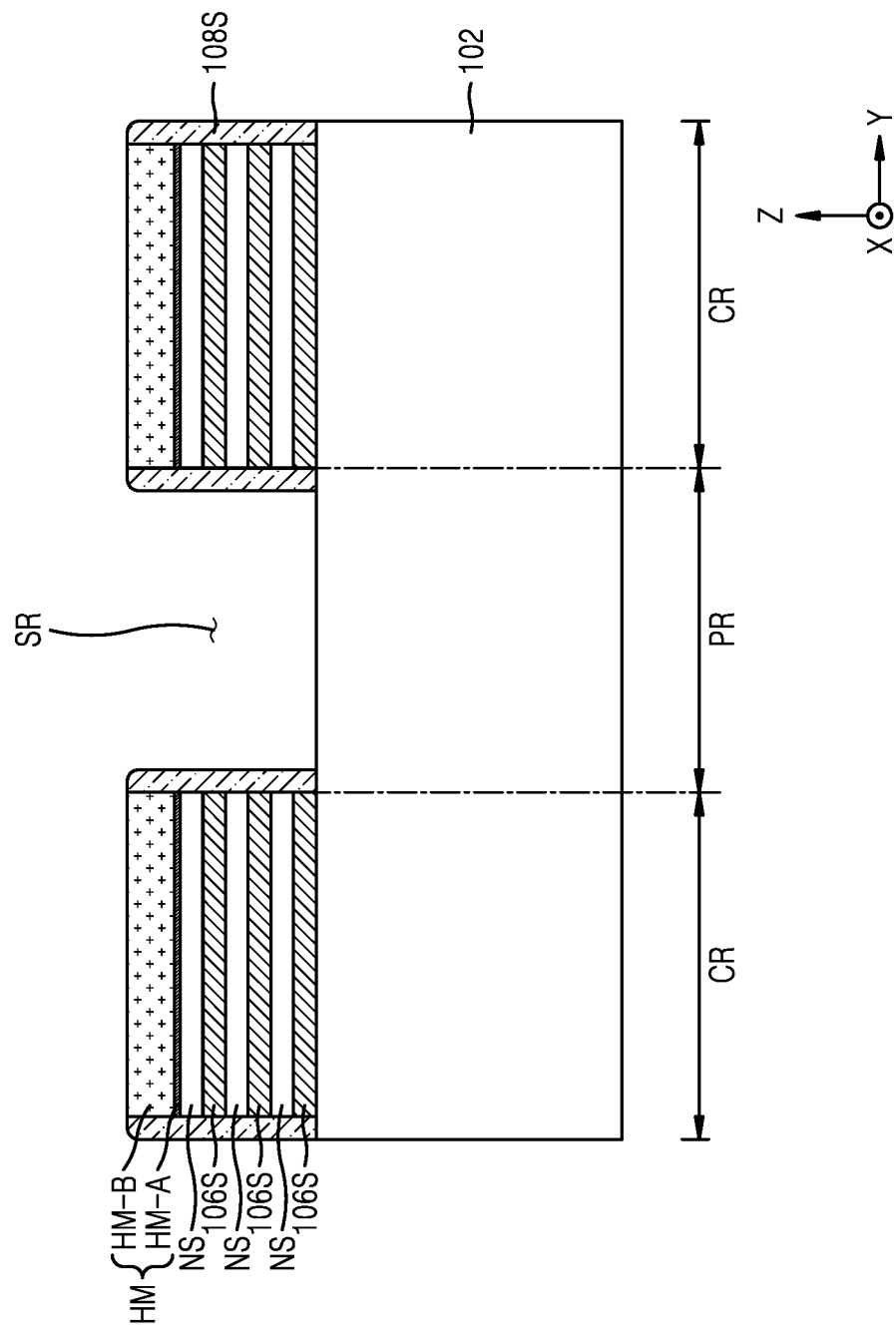

Referring to FIGS. 2 and 3, a portion of the cover insulation layer 108, for example, a portion of the cover insulation layer 108 on the top surface of the hard mask pattern HM in the cell region CR and a portion of the cover insulation layer 108 covering the top surface of the substrate 102 in the peripheral circuit region PR, are removed. As a result, a cover spacer 108S is formed, covering the outer sidewalls of the stacked structure including the sacrificial semiconductor layers 106S and the nano-sheet semiconductor layers NS having formed thereon the hard mask pattern HM, that is, the inner sidewalls of the stack recess RS.

Figure 4:
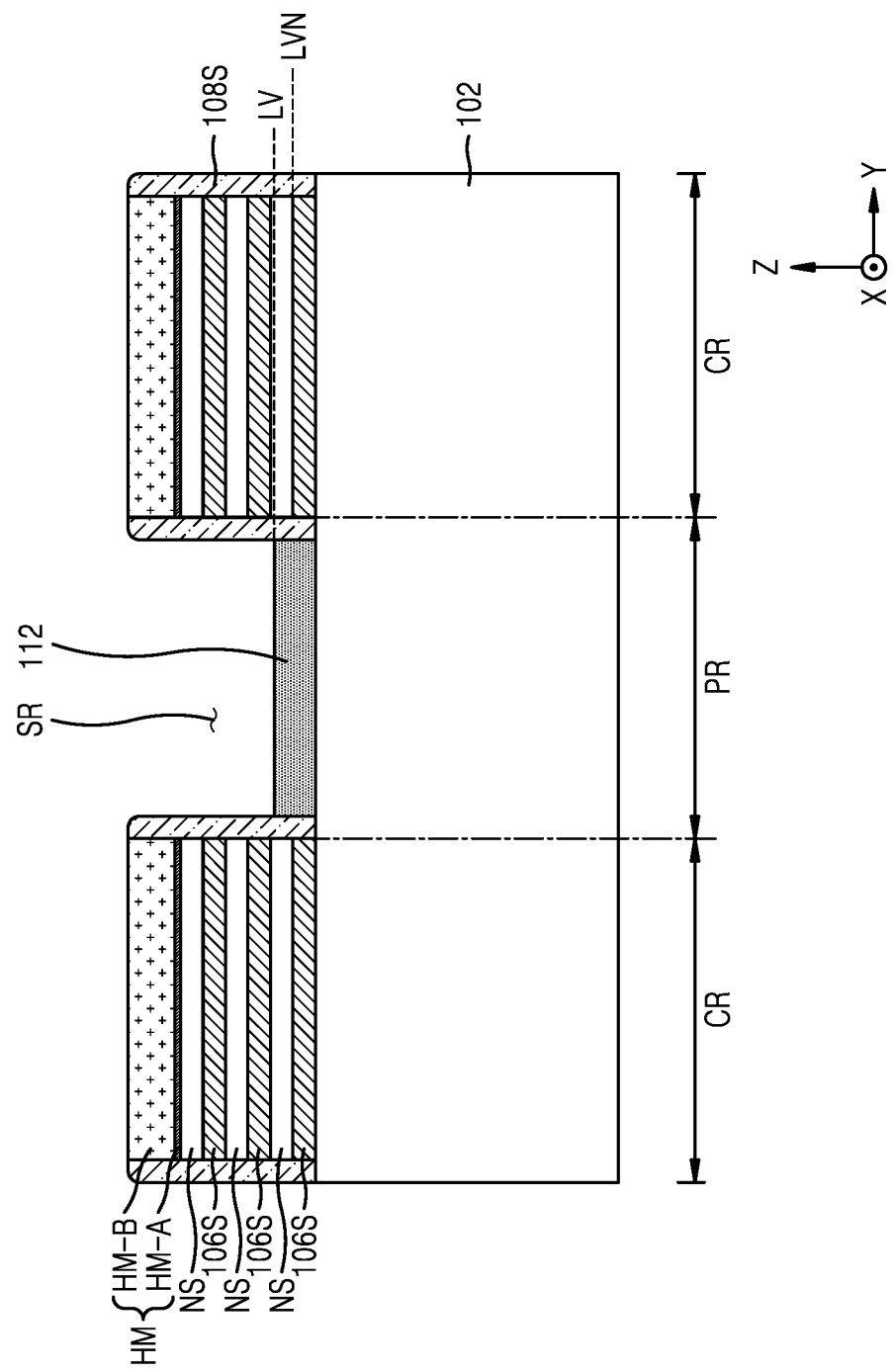

Referring to FIG. 4, a semiconductor epitaxial layer 112 is formed on the substrate 102 in the peripheral circuit region PR. The crystallinity of the semiconductor epitaxial layer 112 may be the same as that of the substrate 102. The semiconductor epitaxial layer 112 may be formed through an epitaxial growth at a first temperature by using the substrate 102 exposed in the peripheral circuit region PR as the seed. The first temperature may be, for example, from about 700° C. to about 800° C. In some exemplary embodiments, the semiconductor epitaxial layer 112 may include the same material as the substrate 102, but is not limited thereto in one or more other exemplary embodiments. For example, the substrate 102 may include Si, and the semiconductor epitaxial layer 112 may include Ge or a compound semiconductor.

The semiconductor epitaxial layer 112 may have a thickness greater than the sacrificial semiconductor layer 106S closest to the substrate 102 from among the sacrificial semiconductor layers 106S. In other words, the semiconductor epitaxial layer 112 may be grown such that the level LV of the top surface of the semiconductor epitaxial layer 112 is higher than the level LVN of the top surface of the sacrificial semiconductor layer 106S closest to the substrate 102 from among the sacrificial semiconductor layers 106S or the level LVN of the bottom surface of the nano-sheet semiconductor layer NS closest to the substrate 102 from among the nano-sheet semiconductor layers NS. In some exemplary embodiments, the level LV of the top surface of the semiconductor epitaxial layer 112 may be lower than the level of the top surface of the nano-sheet semiconductor layer NS closest to the substrate 102 from among the nano-sheet semiconductor layers NS.

In some exemplary embodiments, the top surface of the semiconductor epitaxial layer 112 may have a facet parallel to the top surface of the substrate 102. In one or more other exemplary embodiments, the top surface of the semiconductor epitaxial layer 112 may have a plurality of facets having different slopes.

Figure 5:
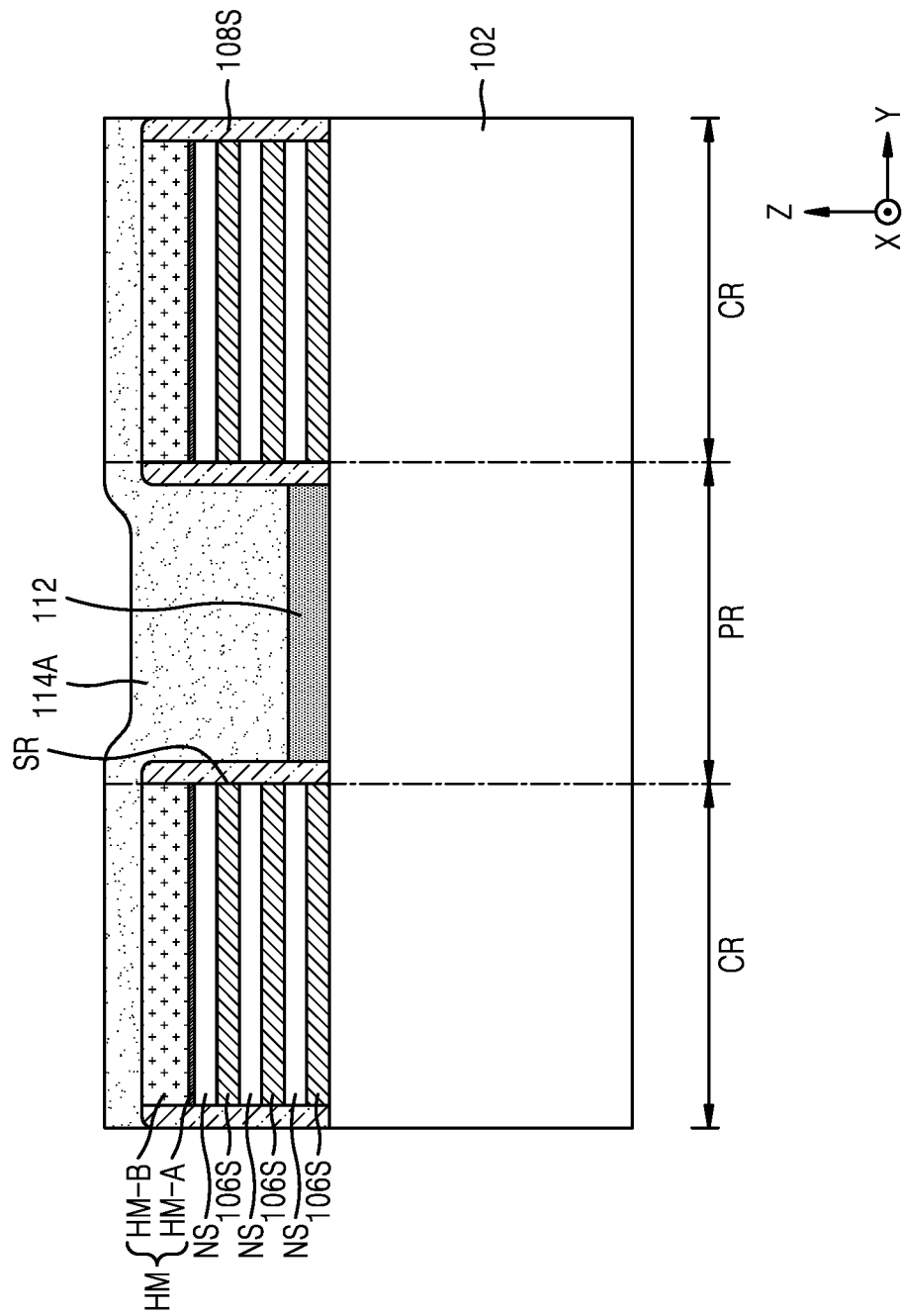

Referring to FIG. 5, a semiconductor amorphous layer 114A filling the stack recess SR is formed on the substrate 102. The semiconductor amorphous layer 114A may cover the sacrificial semiconductor layers 106S and the nano-sheet semiconductor layers NS having formed thereon the hard mask pattern HM and the semiconductor epitaxial layer 112 and fill the stack recess SR. The semiconductor amorphous layer 114A may include an amorphous semiconductor material. The semiconductor amorphous layer 114A may be formed at a second temperature. The second temperature may be lower than the first temperature, which is a temperature for growing the semiconductor epitaxial layer 112. The second temperature may be, for example, from about 500° C. to about 650° C. In some exemplary embodiments, the semiconductor amorphous layer 114A may include the same material as the semiconductor epitaxial layer 112.

Figure 6:
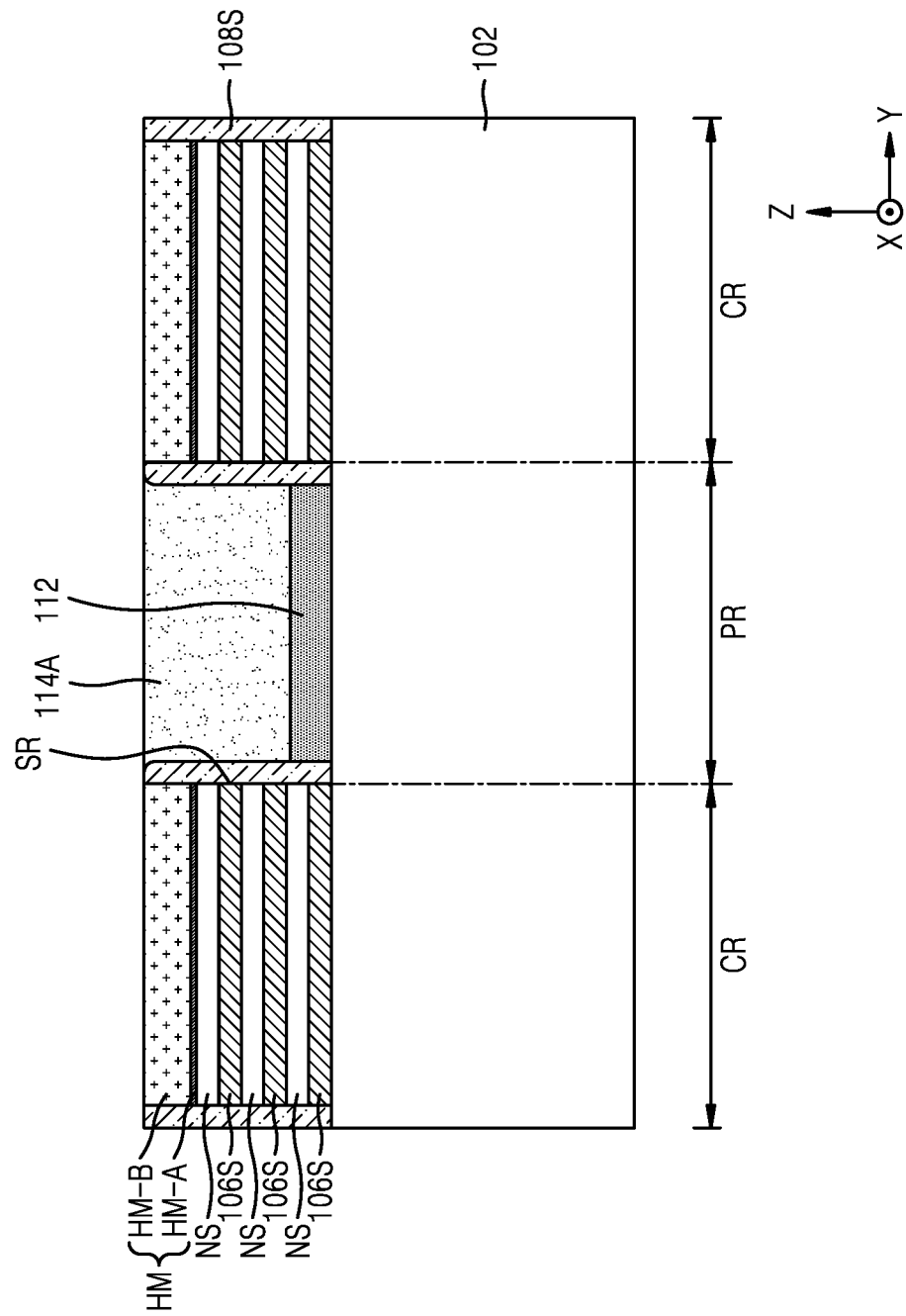

Referring to FIGS. 5 and 6, a portion of the semiconductor amorphous layer 114A outside the stack recess SR shown in FIG. 5, that is, a portion of the semiconductor amorphous layer 114A higher than the top surface of the hard mask pattern HM, may be removed. The semiconductor amorphous layer 114A may be partially removed through, for example, a chemical mechanical polishing (CMP) operation, such that the top surface of the semiconductor amorphous layer 114A is at the same level as the top surface of the hard mask pattern HM.

Figure 8:
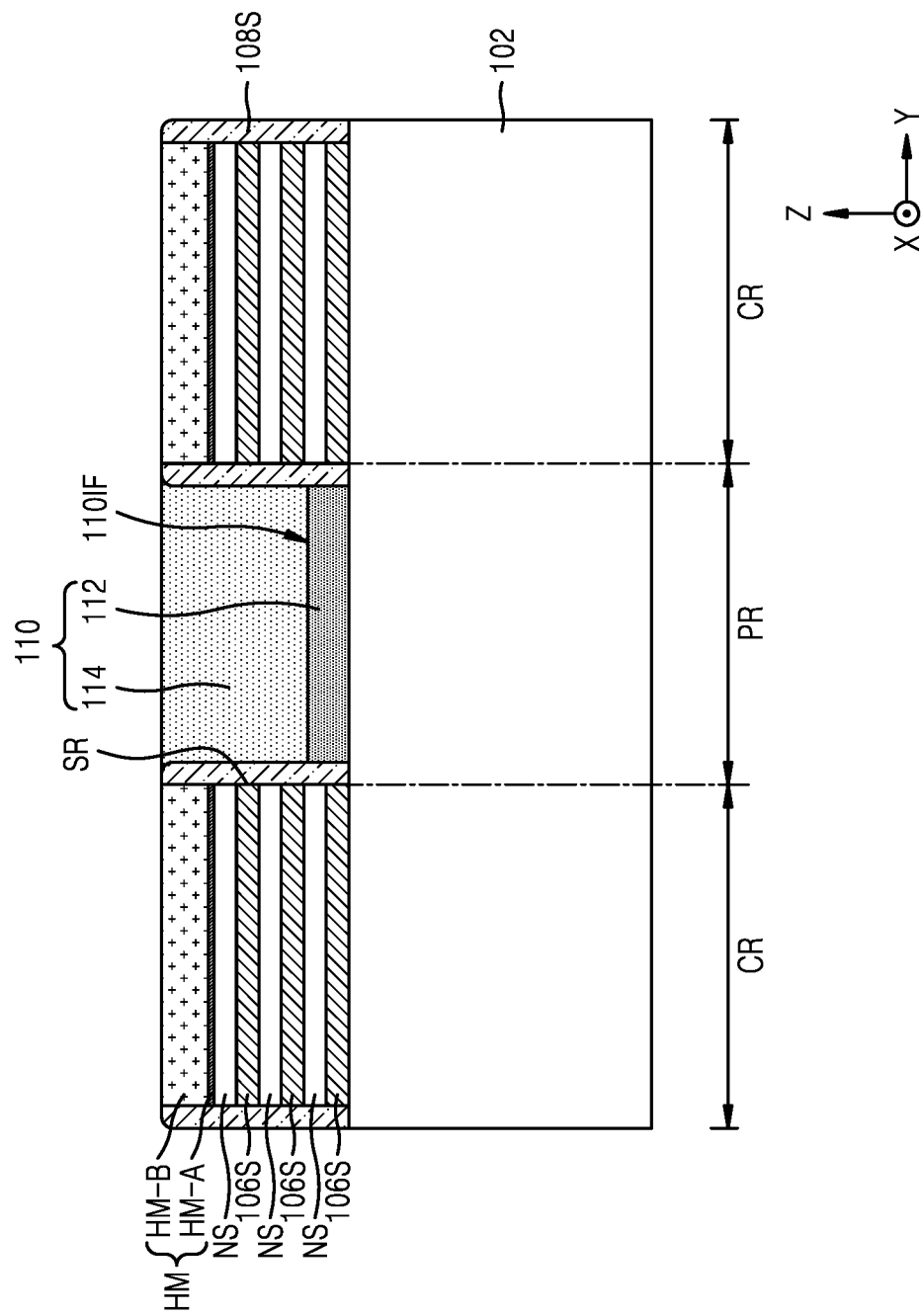

Referring to FIGS. 6 and 8, a semiconductor crystalline layer 114 may be formed by crystallizing the semiconductor amorphous layer 114A shown in FIG. 6 by performing heat treatment at a third temperature. The third temperature may be lower than the first temperature, which is a temperature for growing the semiconductor epitaxial layer 112, and higher than the second temperature, which is a temperature for forming the semiconductor amorphous layer 114A. For example, the third temperature may be lower than the first temperature and higher than the second temperature and be from about 600° C. to about 700° C.

The crystallinity of the semiconductor crystalline layer 114 may be the same as that of the semiconductor epitaxial layer 112. The semiconductor crystalline layer 114 may be formed as the semiconductor amorphous layer 114A is crystallized as the semiconductor epitaxial layer 112 serves as a seed during the heat treatment at the third temperature.

The semiconductor epitaxial layer 112 may be referred to as a lower semiconductor layer 112 and the semiconductor crystalline layer 114 may be referred to as an upper semiconductor layer 114, respectively. The upper semiconductor layer 114 may be stacked on the lower semiconductor layer 112 and constitute a semiconductor layer 110 including the lower semiconductor layer 112 and the upper semiconductor layer 114.

Hereinbelow, the semiconductor epitaxial layer 112 and the semiconductor crystalline layer 114 may be mainly used to describe a method of manufacturing an integrated circuit device, and the lower semiconductor layer 112 and the upper semiconductor layer 114 may be mainly used to describe the structure of the integrated circuit device.

A semiconductor interface 110IF may be provided between the semiconductor epitaxial layer 112 and the semiconductor crystalline layer 114. In some exemplary embodiments, the semiconductor interface 110IF may be along a plane parallel to the top surface of the substrate 102.

Figure 7:
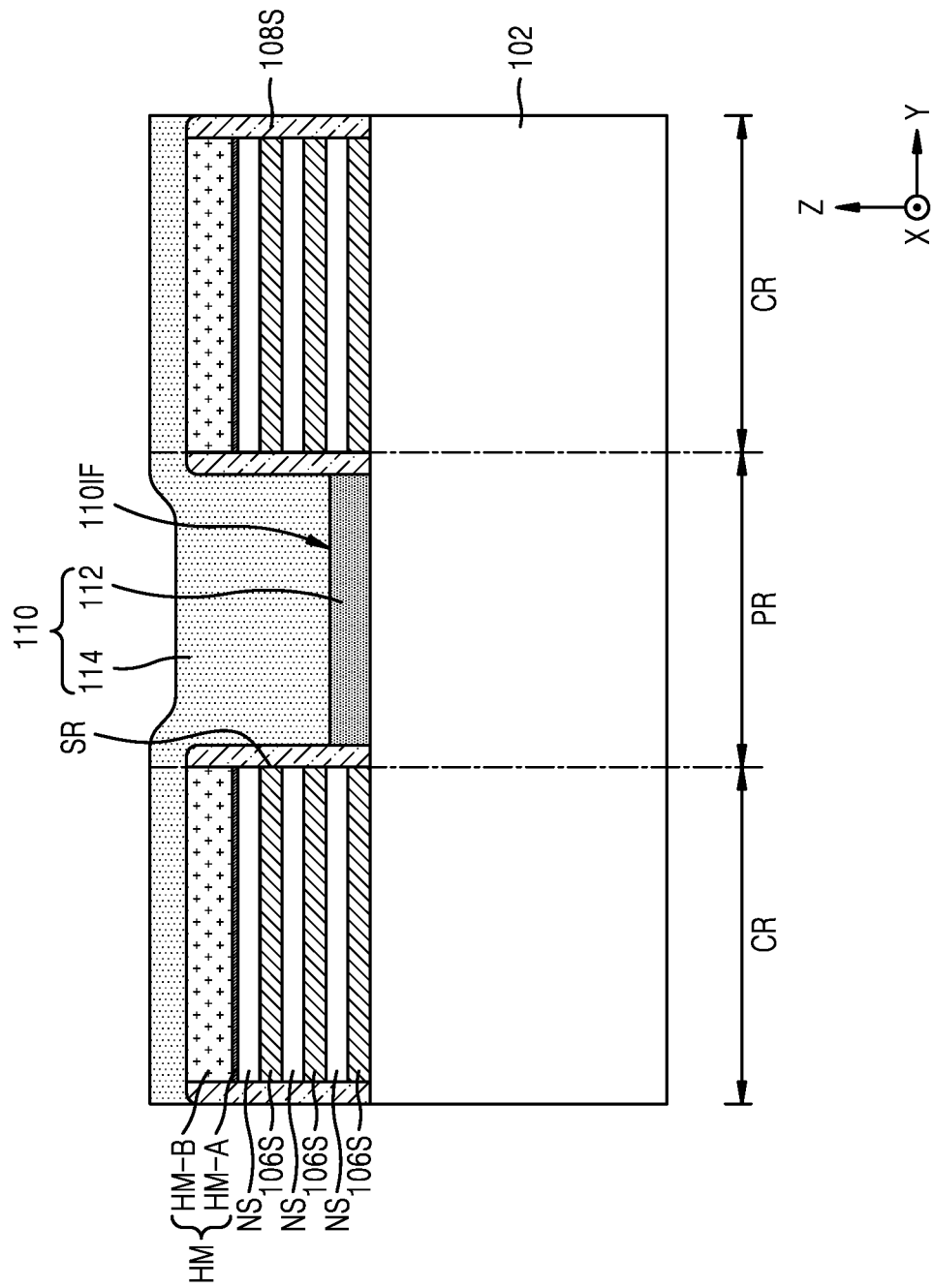

According to one or more other exemplary embodiments, referring to FIGS. 5 and 7 together, the semiconductor crystalline layer 114 is formed by crystallizing the semiconductor amorphous layer 114A shown in FIG. 5 first by performing heat treatment at the third temperature. Referring to FIGS. 7 and 8, a portion of the semiconductor crystalline layer 114 outside the stack recess SR shown in FIG. 7, that is, a portion of the semiconductor crystalline layer 114 higher than the top surface of the hard mask pattern HM, is removed. The semiconductor crystalline layer 114 may be partially removed through, for example, a CMP operation, such that the top surface of the semiconductor crystalline layer 114 is at the same level as the top surface of the hard mask pattern HM.

Figure 9:
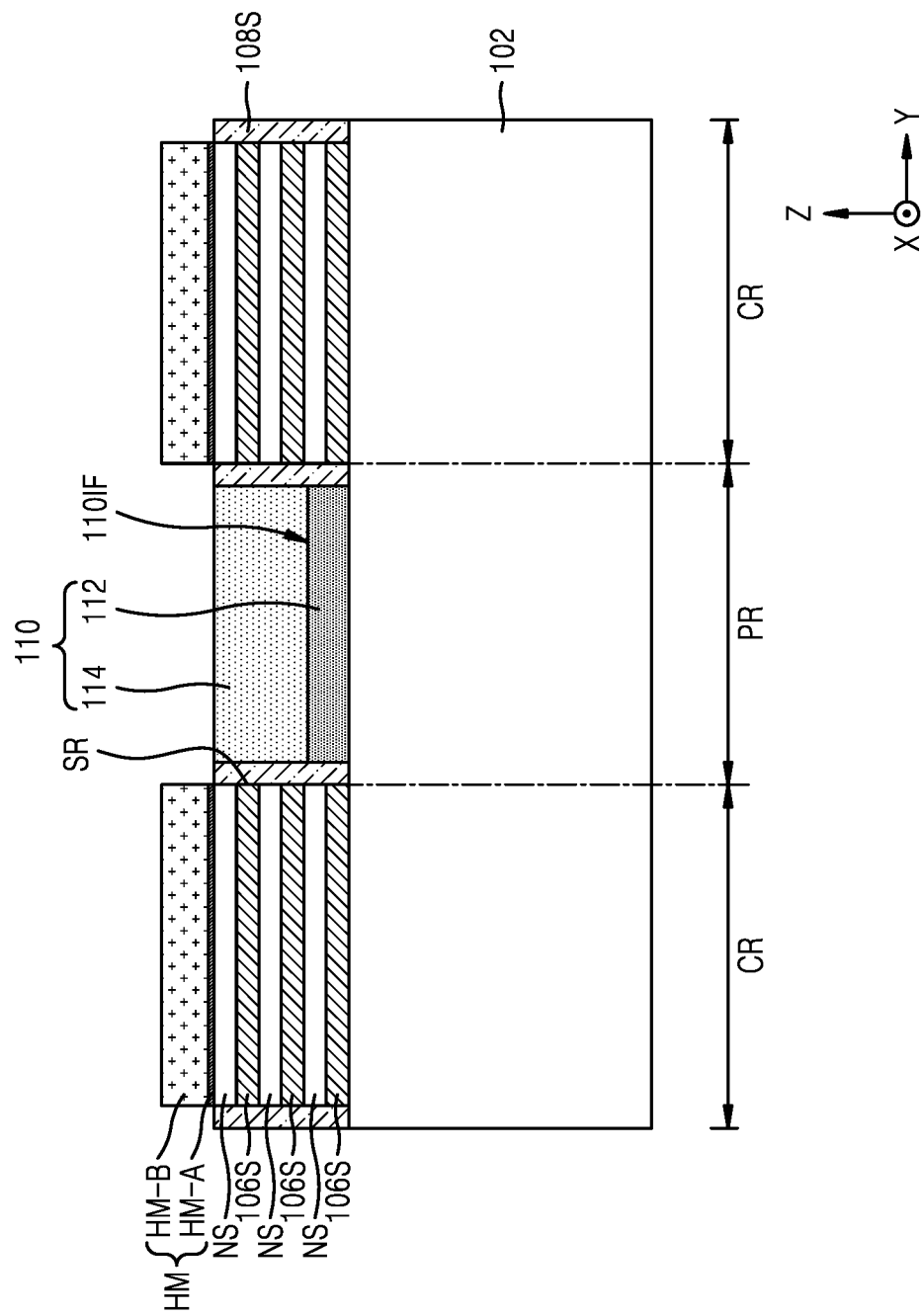

Referring to FIGS. 8 and 9 together, the upper portion of the semiconductor crystalline layer 114 shown in FIG. 8 is partially removed, such that the top surface of the semiconductor crystalline layer 114 is at the same level as the top surface of the stacked structure of the sacrificial semiconductor layers 106S and the nano-sheet semiconductor layers NS, that is, the top surface of the nano-sheet semiconductor layer NS farthest from the substrate 102 from among the nano-sheet semiconductor layers NS. The upper portion of the semiconductor crystalline layer 114 may be partially removed, for example, through an etch-back operation. The upper portion of the cover spacer 108S may also be partially removed during the operation for partially removing the upper portion of the semiconductor crystalline layer 114.

Figure 10:
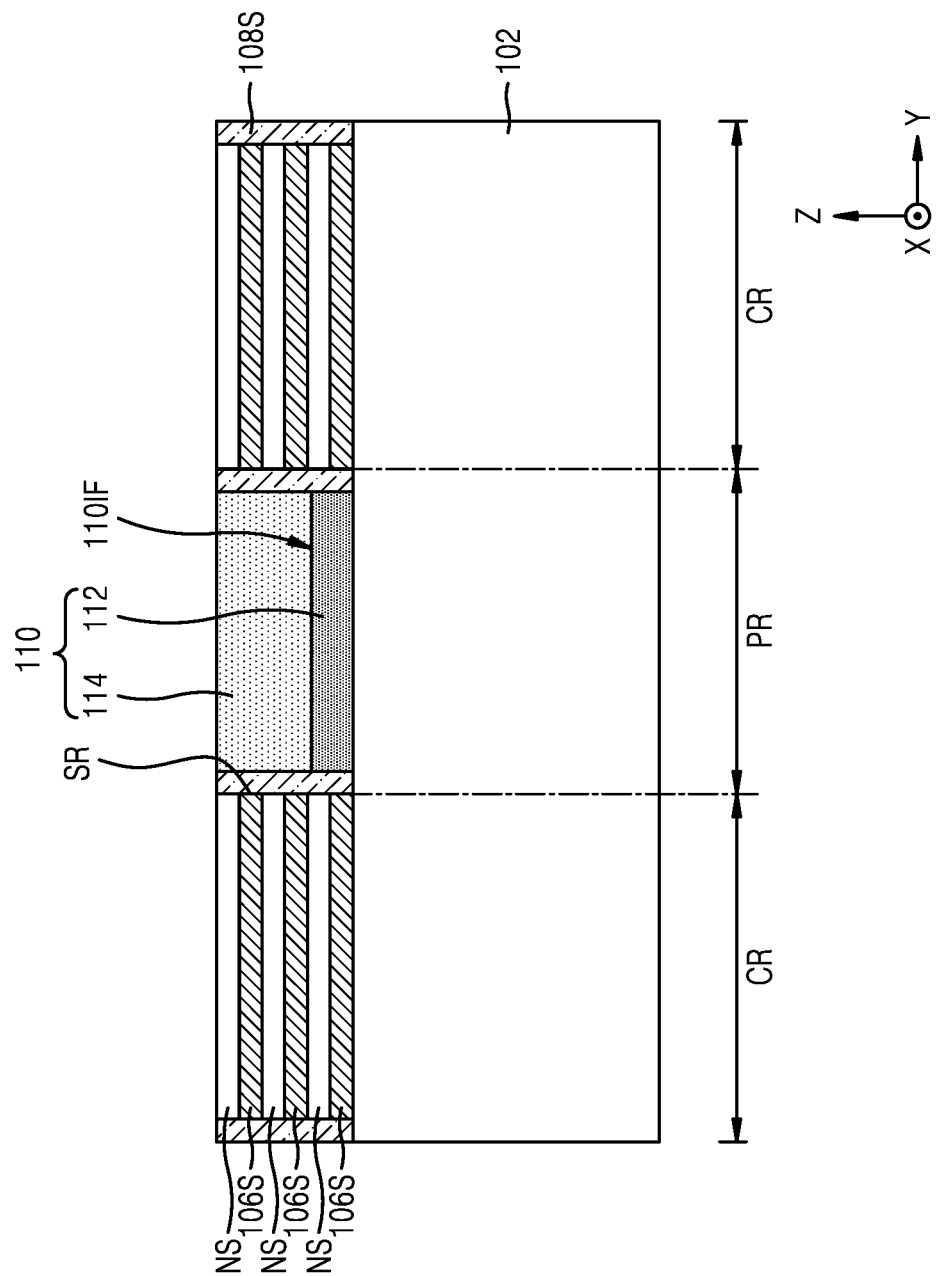

Referring to FIGS. 9 and 10 together, the hard mask pattern HM formed on the stacked structure including the sacrificial semiconductor layers 106S and the nano-sheet semiconductor layers NS in the cell region CR is removed. The top surface of the stacked structure of the sacrificial semiconductor layers 106S and the nano-sheet semiconductor layers NS, that is, the top surface of the nano-sheet semiconductor layer NS farthest from the substrate 102 from among the nano-sheet semiconductor layers NS, may be at the same level as the top surface of the semiconductor layer 110, that is, the top surface of the semiconductor crystalline layer 114, and may form a co-planar structure.

Figure 11:
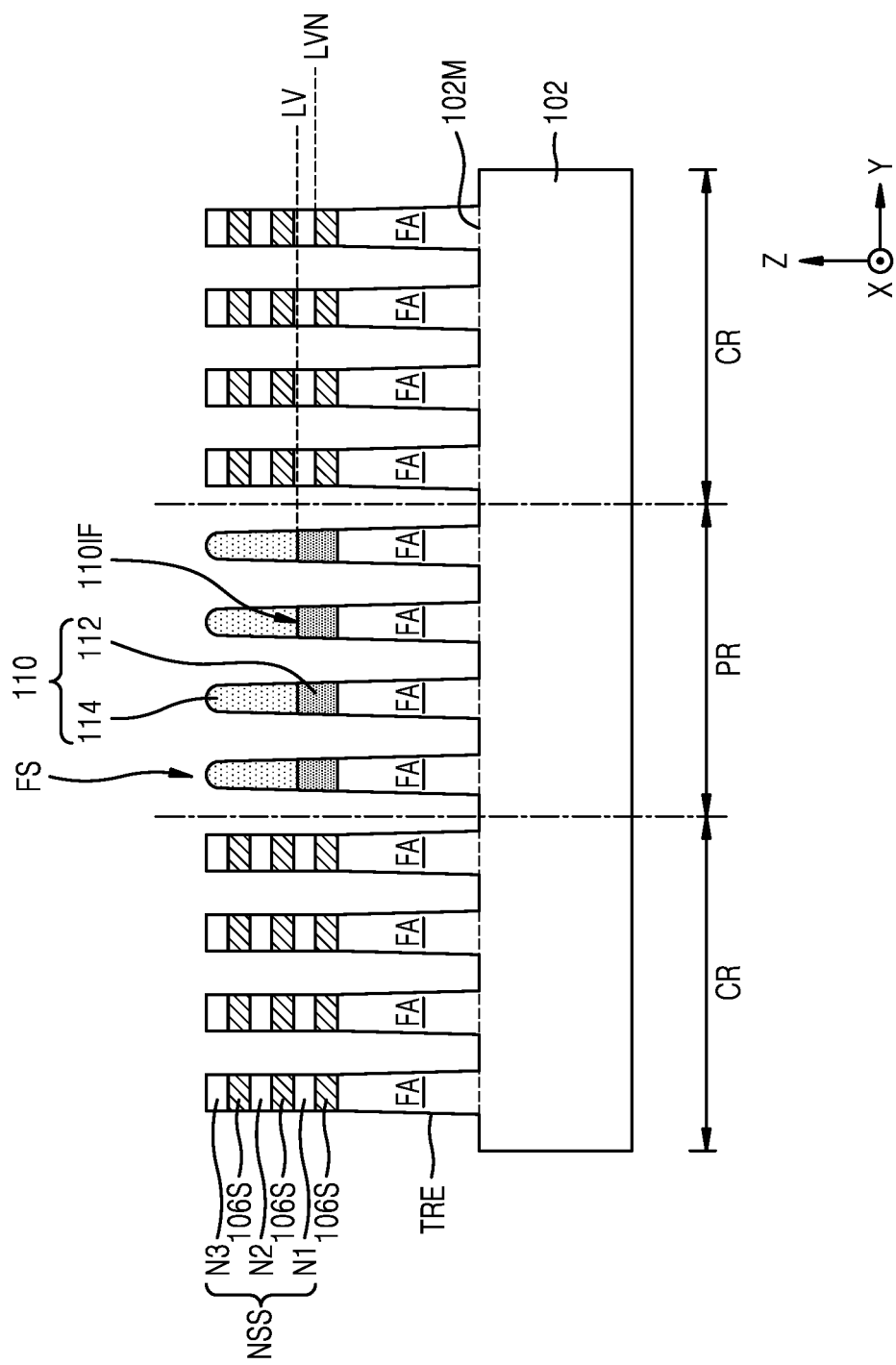

Referring to FIGS. 10 and 11 together, the stacked structure of the sacrificial semiconductor layers 106S and the nano-sheet semiconductor layers NS, the semiconductor layer 110 (which is the stacked structure of the semiconductor epitaxial layer 112 and the semiconductor crystalline layer 114), and a portion of the substrate 102 are etched to form a plurality of trenches TRE. As a result, a plurality of fin-type active regions FA defined by the trenches TRE may be formed in each of the cell region CR and the peripheral circuit region PR. The fin-type active regions FA may extend parallel to one another in a first horizontal direction (X direction). The fin-type active regions FA may protrude in the vertical direction (Z direction) upward from a main surface 102M (e.g., top surface) of the substrate 102. In the cell region CR, the fin-type active regions FA may be arranged at a constant pitch in a second horizontal direction (Y direction). In the peripheral circuit region PR, the fin-type active regions FA may be arranged at a constant pitch in the second horizontal direction (Y direction). In some exemplary embodiments, the fin-type active regions FA may be arranged at the same pitch in the second horizontal direction (Y direction) in each of the cell region CR and the peripheral circuit region PR, but it is understood that one or more other exemplary embodiments are not limited thereto. For example, the fin-type active regions FA may be arranged at a constant first pitch in the second horizontal direction (Y direction) in the cell region CR and may be arranged at a constant second pitch in the second horizontal direction (Y direction) in the peripheral circuit region PR, the second pitch being different from the first pitch.

The sacrificial semiconductor layers 106S and a stacked structure NSS of a plurality of nano-sheets N1, N2, and N3 may be disposed on the fin-type active regions FA in the cell region CR. The nano-sheet stacked structure NSS of the nano-sheets N1, N2, and N3 may be formed by removing a portion of the nano-sheet semiconductor layers NS by etching. The semiconductor layers 110, which are each a stacked structure of the lower semiconductor layer 112 and the upper semiconductor layer 114, may be disposed on the fin-type active regions FA in the peripheral circuit region PR.

During the formation of the nano-sheet stacked structure NSS of the nano-sheets N1, N2, and N3 and the fin-type active regions FA, the cover spacers 108S may all be removed.

In the nano-sheet stacked structure NSS of the nano-sheets N1, N2, N3 arranged on the fin-type active regions FA, the semiconductor layers 110 disposed on the fin-type active regions FA in the peripheral circuit region PR may be at substantially the same level.

Hereinbelow, portions of the substrate 102 defined by the trenches TRE in each of the cell region CR and the peripheral circuit region PR are referred to as the fin-type active regions FA. However, since a stacked structure of a portion of the substrate 102, the lower semiconductor layer 112, and the upper semiconductor layer 114 substantially functions as a fin-type active region constituting a Fin Field Effect Transistor (FinFET) in the peripheral circuit region PR, the stacked structure of the fin-type active region FA, the lower semiconductor layer 112, and the upper semiconductor layer 114 in the peripheral circuit region PR may be referred to as a fin-type stacked structure FS. The fin-type stacked structures FS may extend in parallel to one another in the first horizontal direction (X direction) and protrude in the vertical direction (Z direction) upward from the main surface 102M of the substrate 102.

Figure 12:
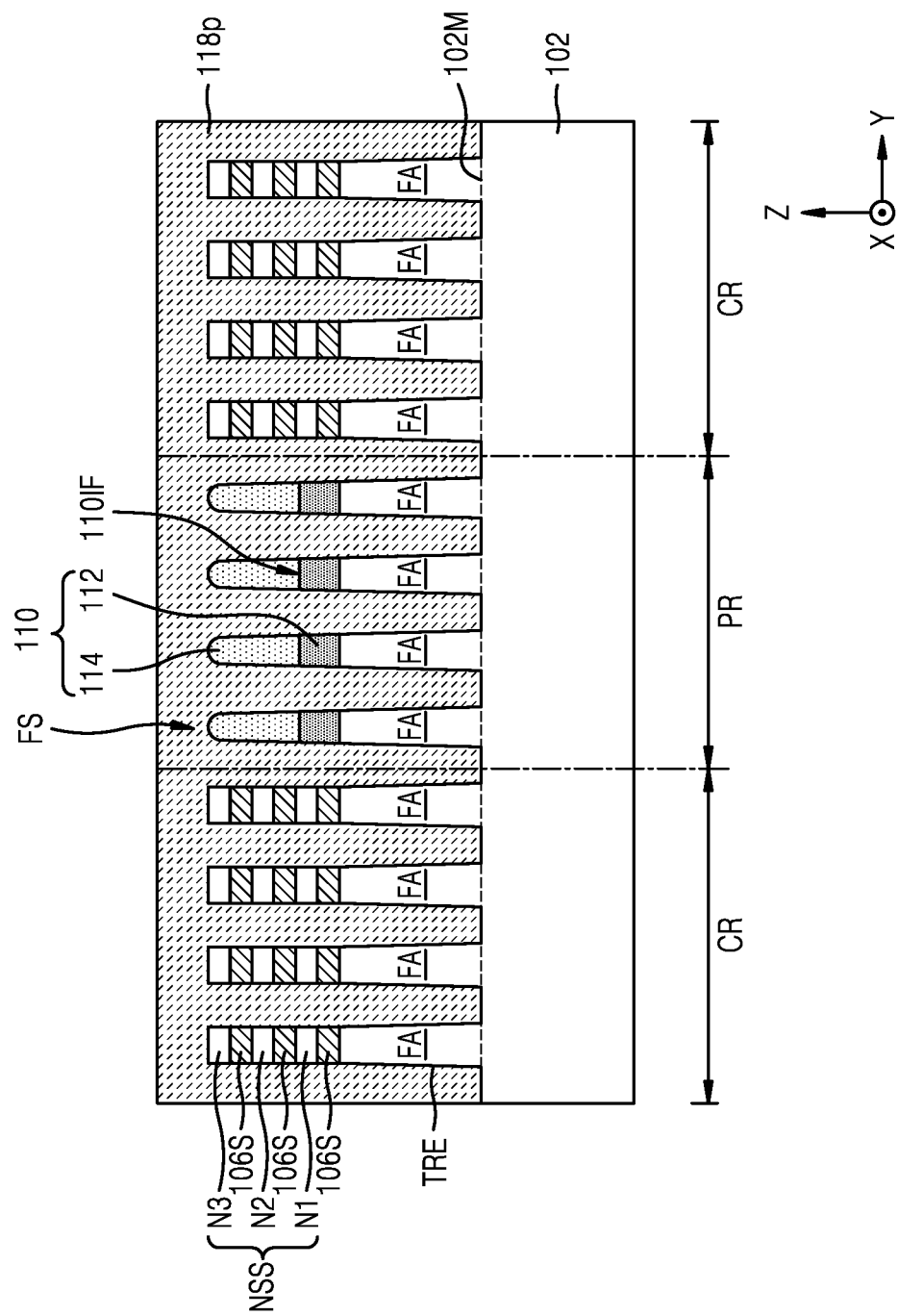

Referring to FIG. 12, a preliminary device isolation layer 118p filling the trenches TRE is formed. The preliminary device isolation layer 118p may be formed to cover sidewalls of the fin-type active regions FA, sidewalls and the top surface of the nano-sheet stacked structure NSS of the nano-sheets N1, N2, and N3, and sidewalls and the top surface of the semiconductor layers 110.

Figure 13:
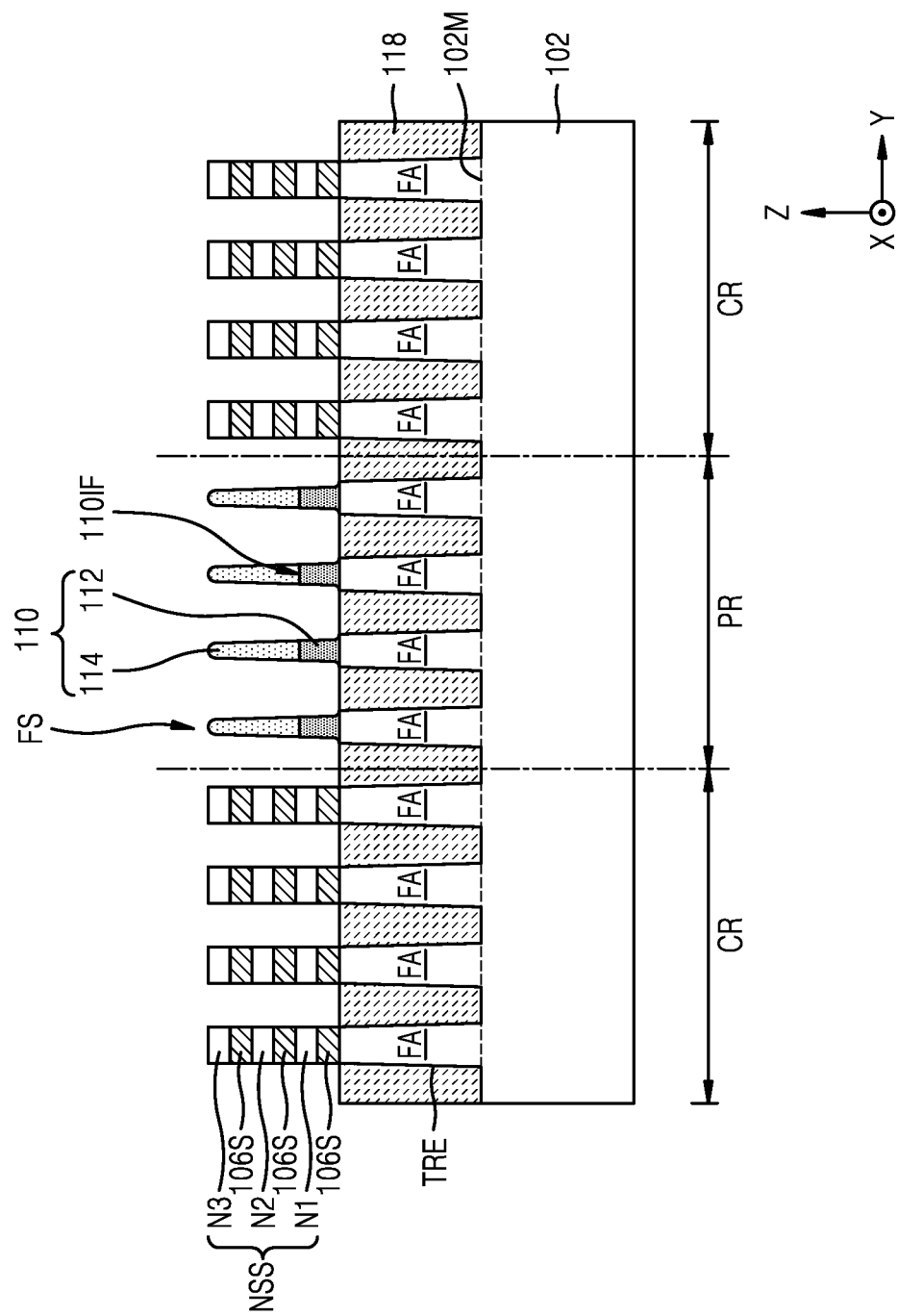
Figure 14A:
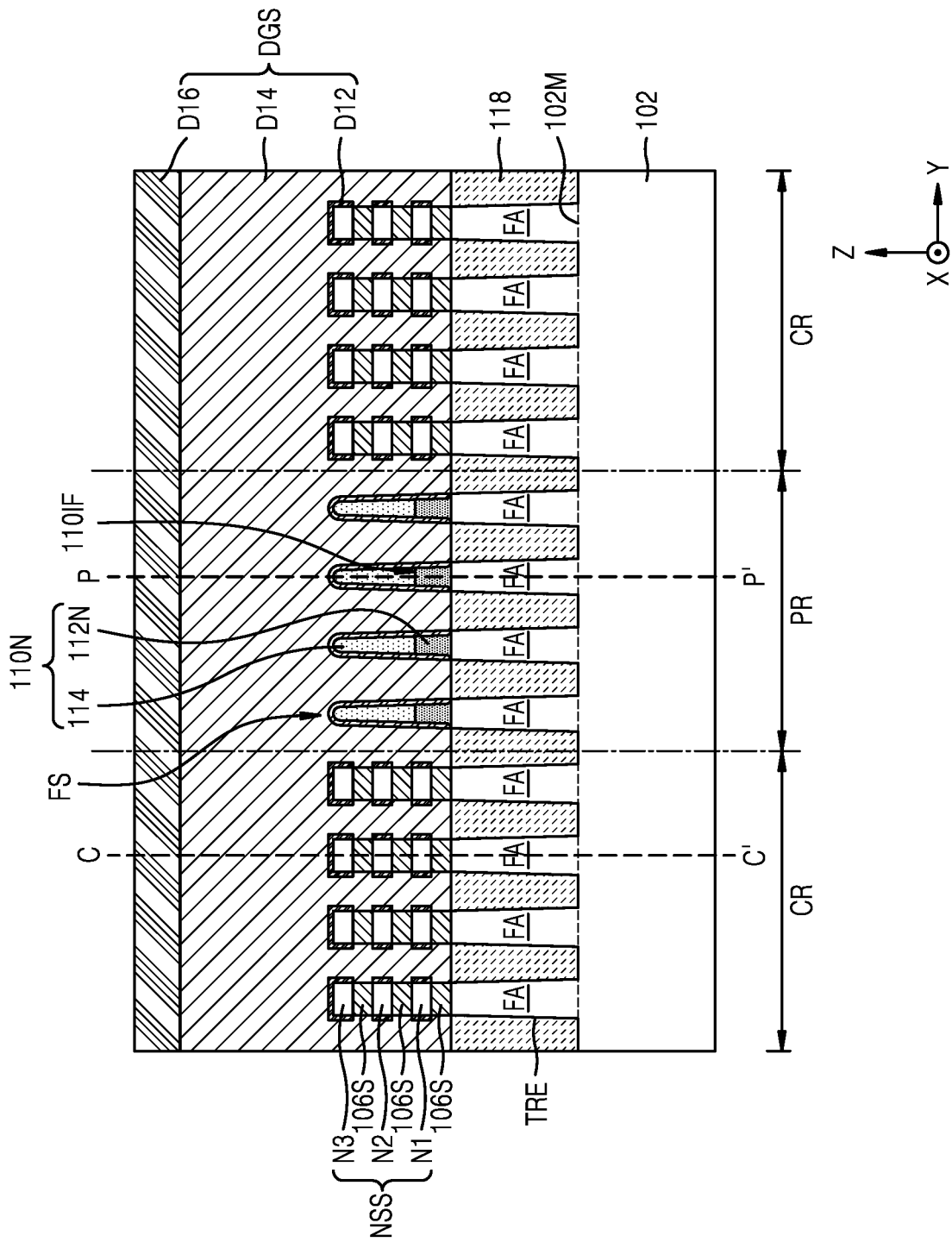
Figure 14B:
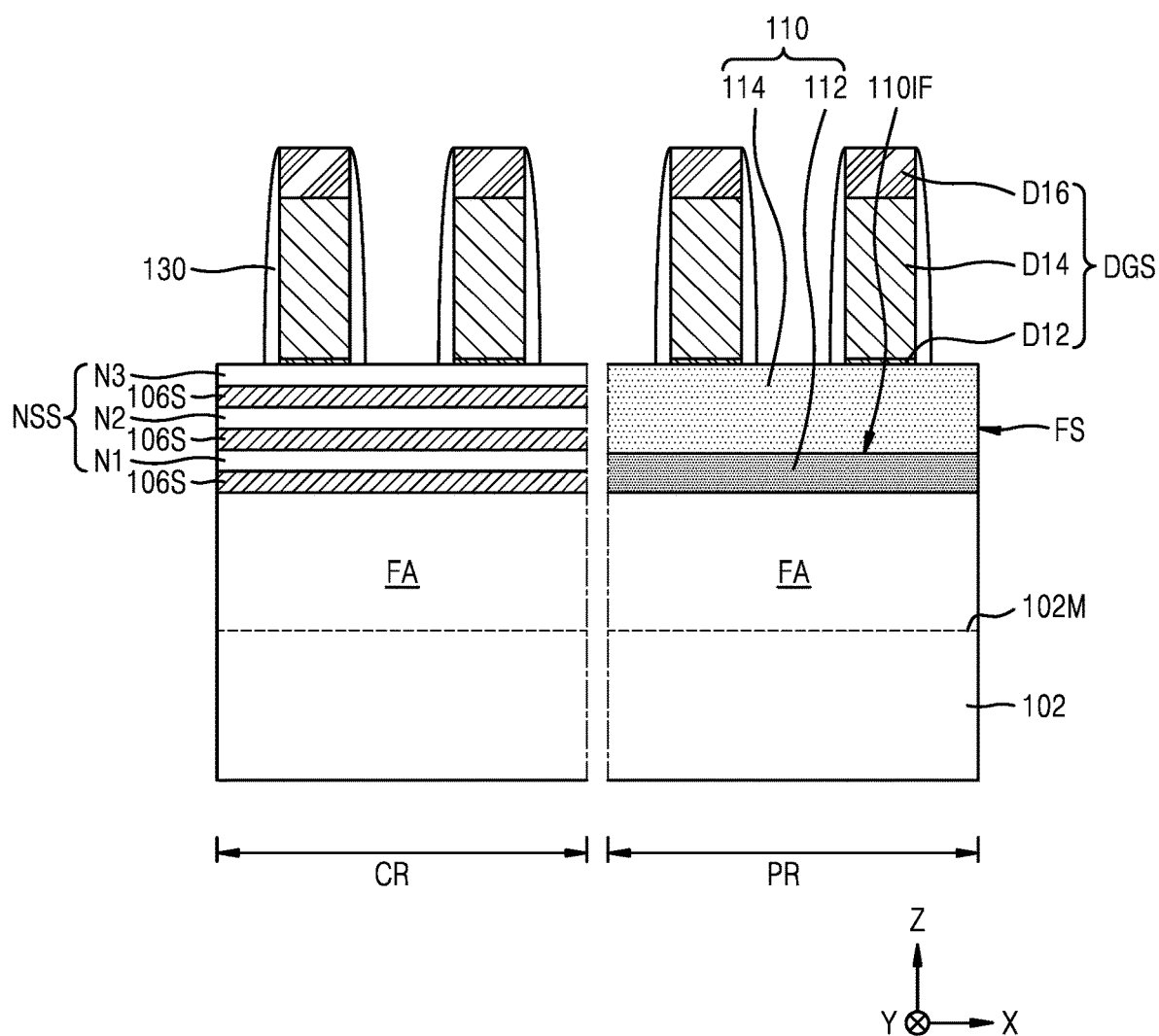

Referring to FIGS. 12 and 13 together, a device isolation layer 118 is formed by performing a recess operation to remove a portion of the preliminary device isolation layer 118p from the top surface thereof by a certain thickness. To perform the recess operation, a dry etching, a wet etching, or an etching process combining the dry etching and the wet etching may be used.

The recess operation may be performed, such that the top surface of the device isolation layer 118 is at the same level or a substantially similar level as the top surface of the fin-type active region FA. As a result, the sidewalls of the nano-sheet stacked structure NSS of the nano-sheets N1, N2, and N3 and the sacrificial semiconductor layers 106S on the fin-type active regions FA in the cell region CR, as well as the sidewalls of the semiconductor layers 110 on the fin-type active regions FA in the peripheral circuit region PR, may be exposed.

Referring to FIGS. 14A and 14B together, in the cell region CR and the peripheral circuit region PR, a plurality of dummy gate structures DGS extending and crossing at least some of the fin-type active regions FA on which the nano-sheet stacked structure NSS of the nano-sheets N1, N2, and N3 and the sacrificial semiconductor layers 106S are formed and the fin-type active regions FA on which the semiconductor layers 110 are formed. The dummy gate structures DGS may extend in parallel to one another in the second horizontal direction (Y direction).

The dummy gate structure DGS may have a structure in which an oxide film D12, a dummy gate layer D14, and a capping layer D16 are sequentially stacked. In an example for forming the dummy gate structure DGS, the oxide film D12, the dummy gate layer D14, and the capping layer D16 may be sequentially formed to respectively cover exposed surfaces of the nano-sheet stacked structure NSS of the nano-sheets N1, N2, and N3 and the sacrificial semiconductor layer 106S covering the fin-type active regions FA, exposed surfaces of the fin-type active regions FA, and the top surface of the device isolation layer 118. Additionally, the oxide film D12, the dummy gate layer D14, and the capping layer D16 may be patterned to only leave necessary portions thereof.

In some exemplary embodiments, the dummy gate layer D14 may include polysilicon and the capping layer D16 may include a silicon nitride, although it is understood that one or more other exemplary embodiments are not limited thereto.

Next, a gate spacer 130 covering both sidewalls of the dummy gate structure DGS is formed. To form the gate spacer 130, a spacer layer may be formed on the semiconductor substrate 102 having formed thereon the dummy gate structure DGS and the spacer layer may be etched back to leave the gate spacer 130. The gate spacer 130 may include, for example, a silicon nitride film.

Figure 15:
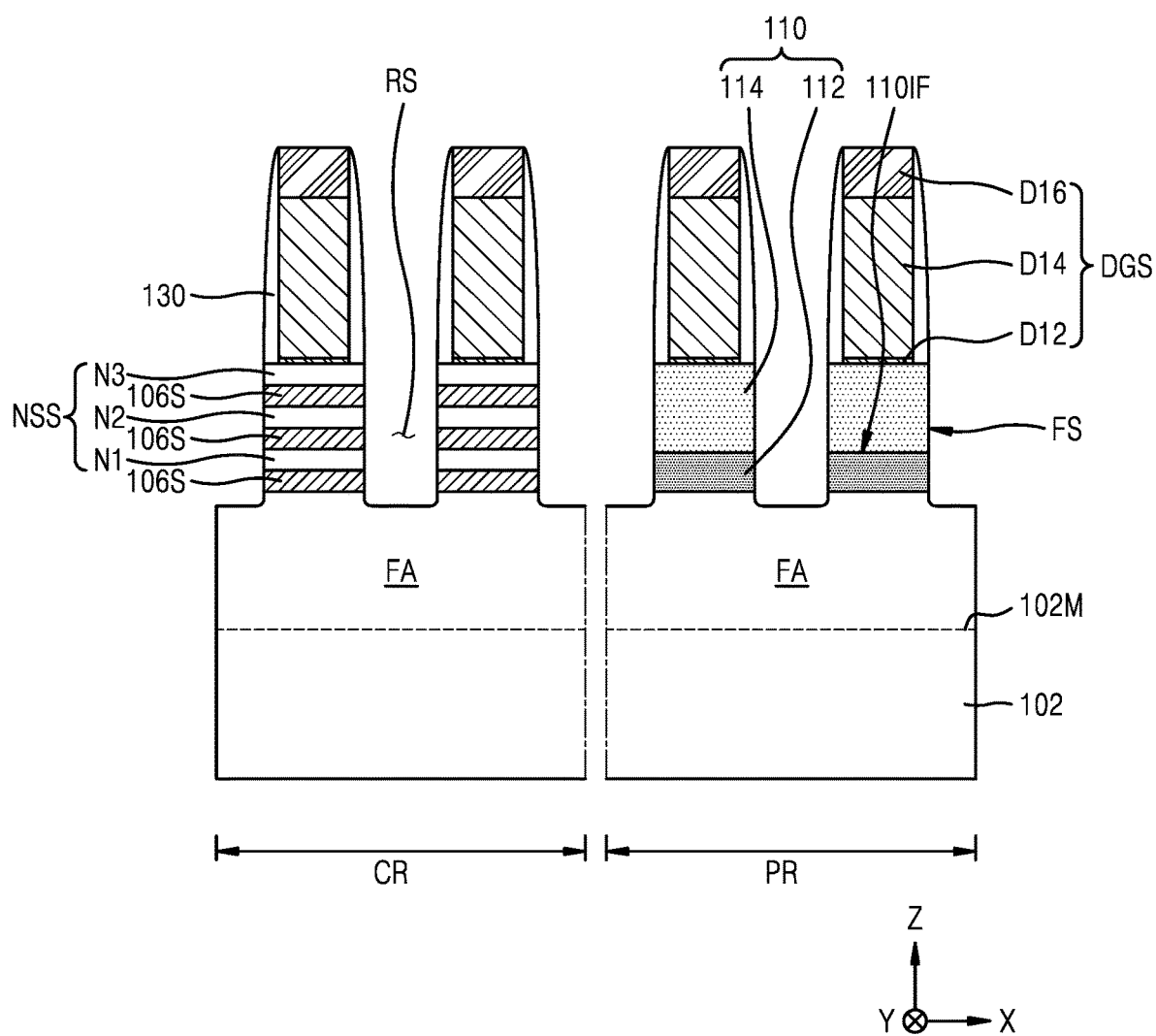

Referring to FIG. 15, the recessed region RS is formed by removing portions of the nano-sheet stacked structure NSS of the nano-sheets N1, N2, and N3 and the sacrificial semiconductor layers 106S and a portion of the semiconductor layers 110 through an etching operation using the dummy gate structure DGS and the gate spacer 130 as an etching mask. The fin-type active regions FA may be exposed at the bottom surface of the recessed region RS. In some exemplary embodiments, during the operation for etching the portions of the nano-sheet stacked structure NSS of the nano-sheets N1, N2, and N3 and the sacrificial semiconductor layers 106S and the portions of the semiconductor layers 110, the upper portions of the fin-type active regions FA may be partially removed together.

Figure 16:
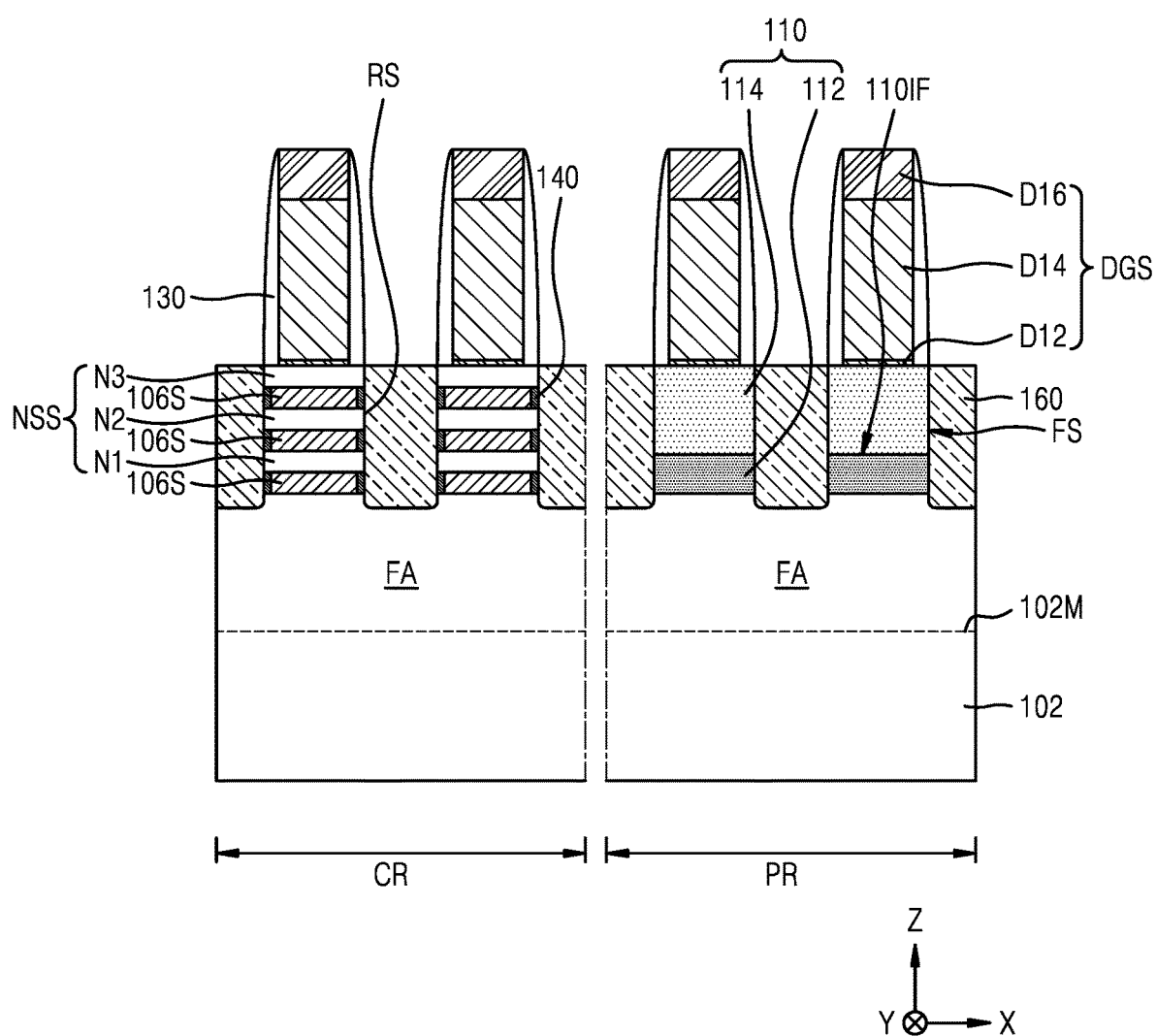

Referring to FIGS. 15 and 16 together, removed spaces are formed by removing portions of the semiconductor layers 106S exposed on both sides of the nano-sheet stacked structures NSS by, for example, performing an isotropic etching operation onto the cell region CR. Then, insulation spacers 140 filling the removed spaces formed between the nano-sheets N1, N2, and N3 in the cell region CR are formed. The insulation spacer 140 may include, for example, a silicon nitride film. In some exemplary embodiments, the insulation spacers 140 may be formed by stacking a plurality of insulating layers.

After the insulation spacers 140 are formed, a plurality of source/drain regions 160 are formed by epitaxially growing a semiconductor material from both exposed sidewalls of the nano-sheets N1, N2, and N3, the exposed surface of the fin-type active region FA, and the exposed surfaces of the fin-type active regions FA in the cell region CR.

In some exemplary embodiments, some of the source/drain regions 160 and the remaining ones of the source/drain regions 160 may include different materials, and the some of the source/drain regions 160 and the remaining ones of the source/drain regions 160 including different materials may be formed by performing separate epitaxial growth operations, respectively. For example, the some of the source/drain regions 160 may include Ge. In some exemplary embodiments, some of the source/drain regions 160 may include a multi-layer structure of a semiconductor material including Si and a semiconductor material including Ge.

For example, the remaining ones of the source/drain regions 160 may include Si but not Ge. In some exemplary embodiments, the remaining ones of the source/drain regions 160 may include a multi-layer structure of a semiconductor material like Si, and a compound semiconductor material like SiC.

Figure 17:
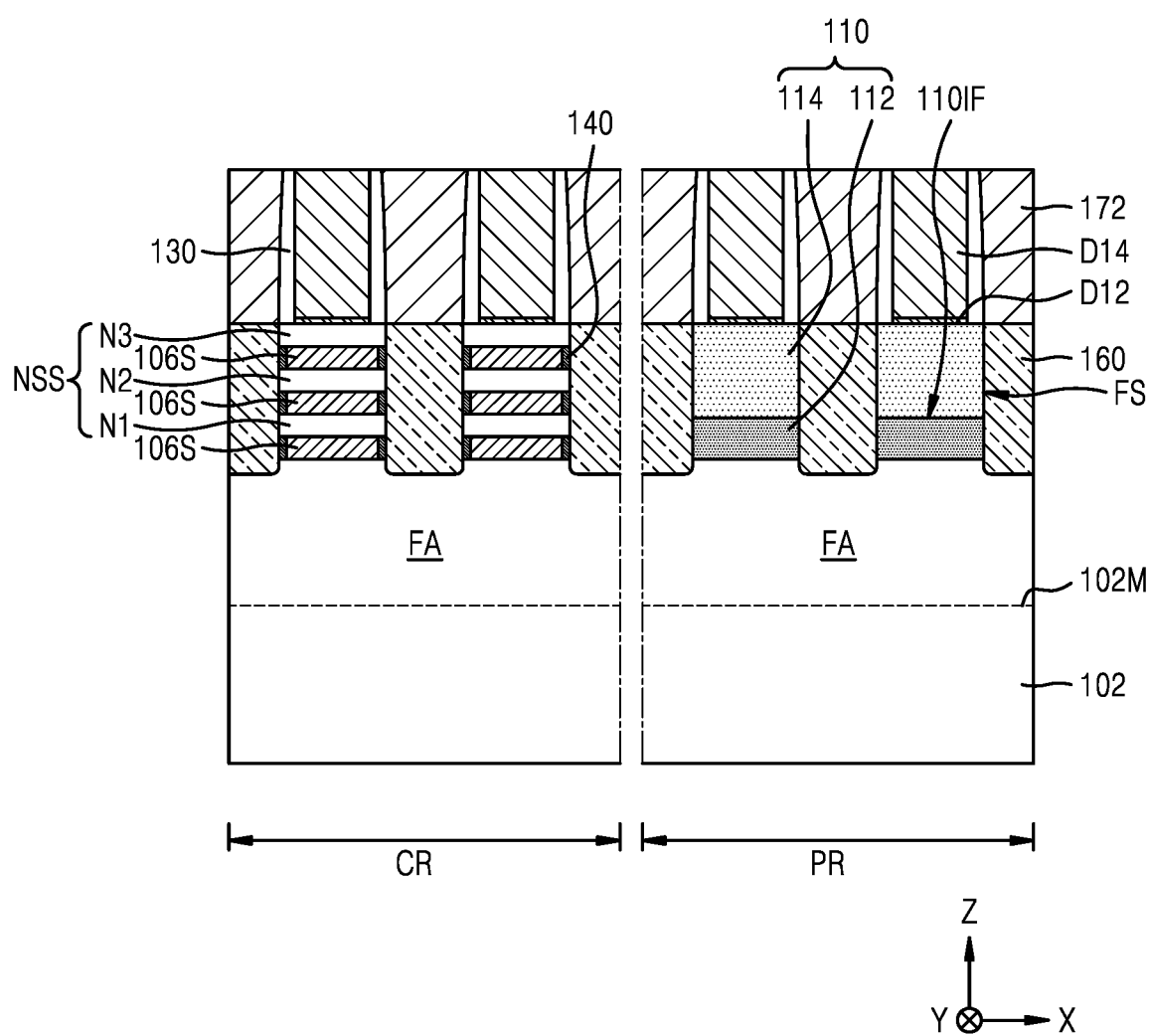

Referring to FIGS. 16 and 17 together, an inter-gate insulation film 172 is formed on the dummy gate structures DGS and the source/drain regions 160, the capping layer D16 covering the top surface of the dummy gate layer D14 is removed by planarizing the inter-gate insulation film 172, and the gate spacer 130, the protective film 138, and the inter-gate insulation film 172 around the capping layer D16 are polished from the top surfaces thereof by a portion of the thicknesses thereof. As a result, the top surface of the inter-gate insulation film 172 is at approximately the same level as the top surface of the dummy gate layer D14. In some exemplary embodiments, the inter-gate insulation film 172 may include a silicon oxide film.

Figure 18:
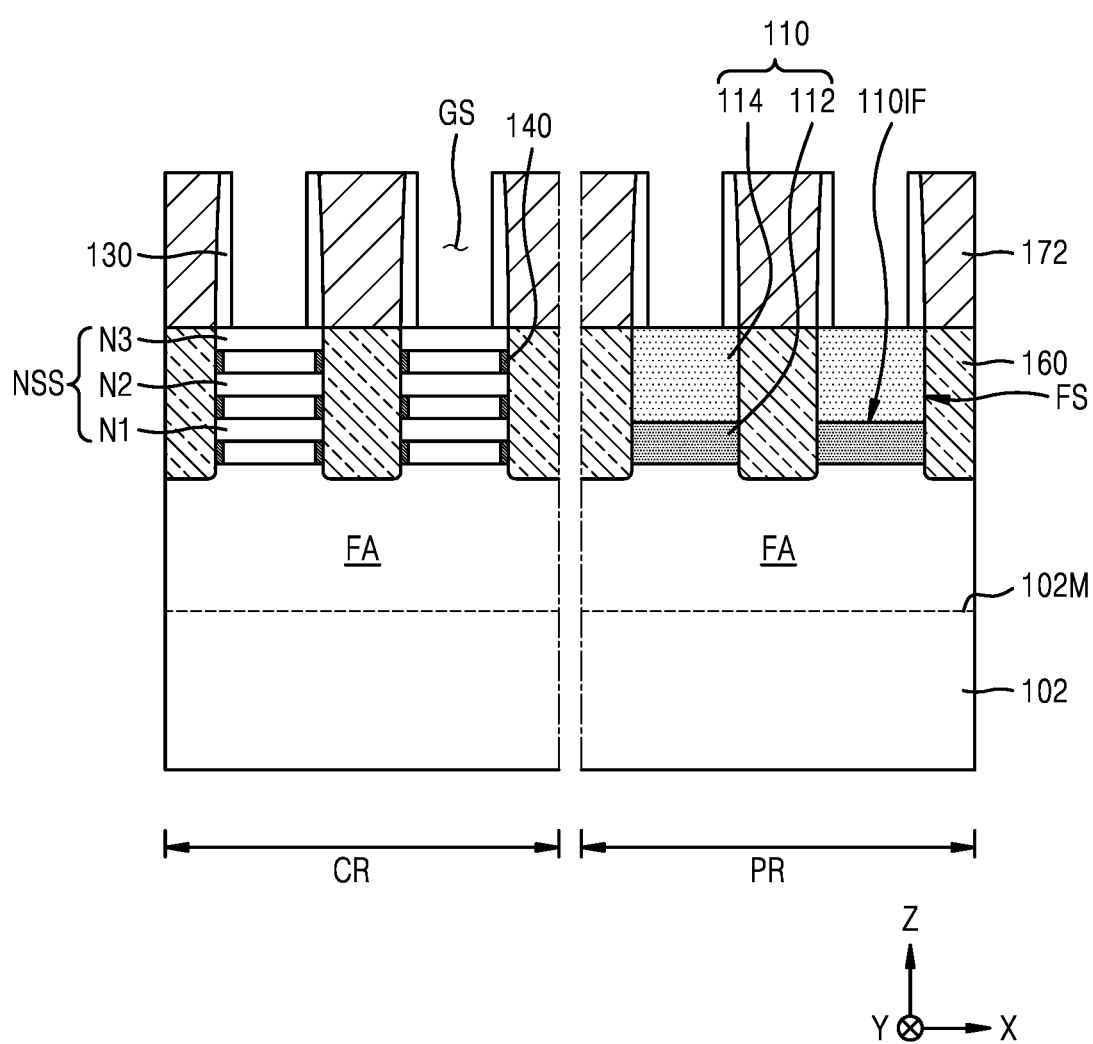

Referring to FIGS. 17 and 18 together, the dummy gate layer D14 exposed through the inter-gate insulation film 172 and the gate spacer 130, as well as the oxide film D12 below the dummy gate layer D14, are removed, and the sacrificial semiconductor layers 106S remaining on the fin-type active regions FA are at least partially removed, thereby forming a plurality of gate spaces GS. The surfaces of the nano-sheets N1, N2, and N3 and the top surface of the fin-type active region FA may be partially exposed in the cell region CR through the gate spaces GS, and the surfaces of the fin-type stacked structures FS may be exposed in the peripheral circuit region PR. In some exemplary embodiments, portions of the sacrificial semiconductor layers 106S may remain by not being removed.

Figure 19:
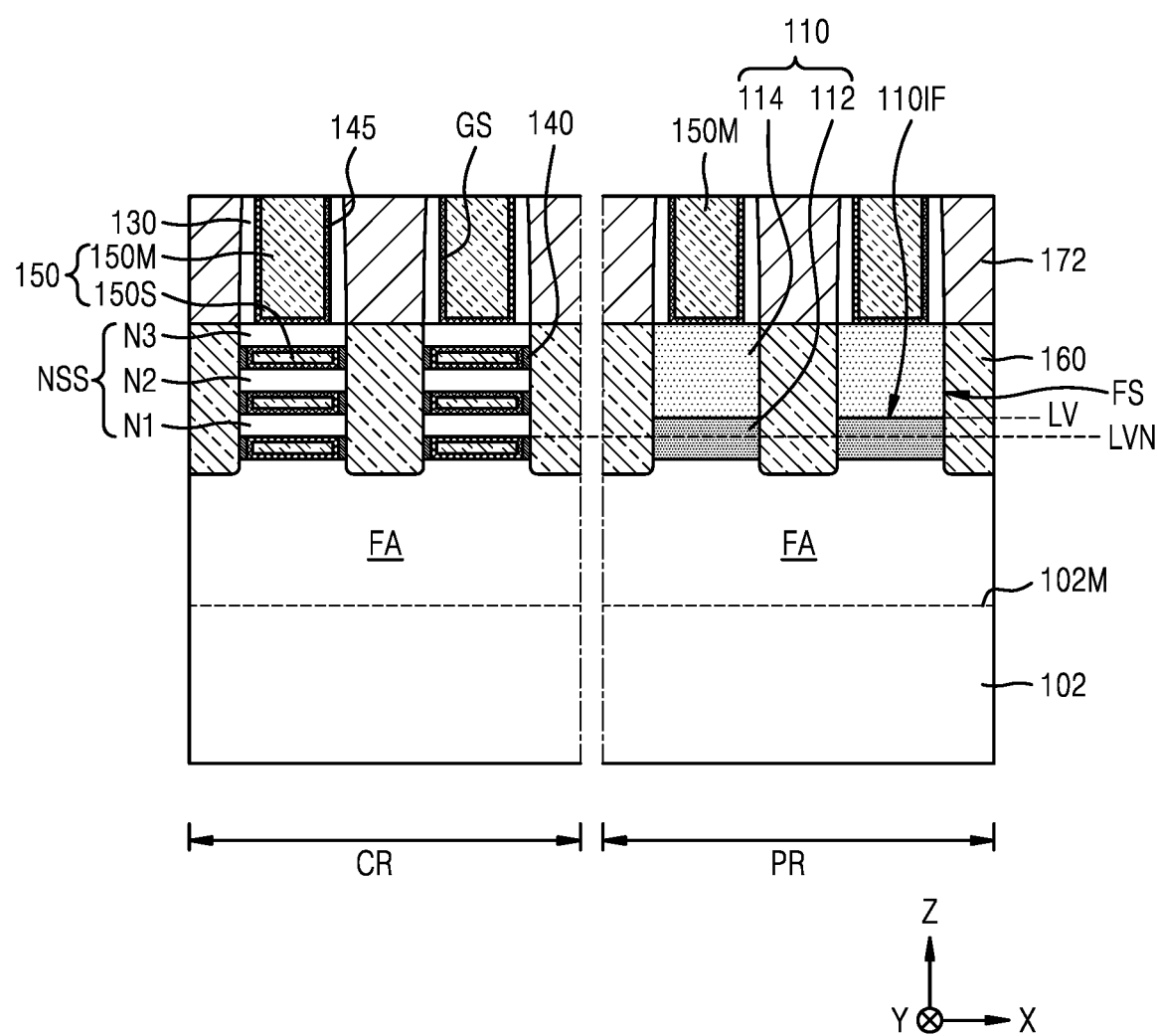

Referring to FIGS. 18 and 19 together, a gate dielectric film 145 is formed on surfaces exposed in the gate spaces GS and a plurality of gate electrodes 150 filling the gate spaces GS above the gate dielectric film 145 are formed. The gate electrodes 150 may extend in parallel to one another in the second horizontal direction (Y direction).

The gate dielectric film 145 may include a stacked structure of an interfacial layer and a high-k film. In some exemplary embodiments, the interfacial layer may include a low-k material layer having a dielectric constant of about 9 or less, e.g., a silicon oxide film, a silicon oxynitride film, or a combination thereof. In some exemplary embodiments, the interfacial layer may be omitted. The high-k film may include a material having a dielectric constant greater than that of a silicon oxide film. For example, the high-k film may have a dielectric constant from about 10 to about 25.

The gate electrode 150 may include a work-function controlling metal-containing layer and a gap-filling metal-containing layer for filling a space above the work-function controlling metal-containing layer. In some exemplary embodiments, the gate electrode 150 may have a structure in which a metal nitride layer, a metal layer, a conductive capping layer, and a gap-fill metal layer are sequentially stacked.

In the cell region CR, the gate electrode 150 may include a main gate portion 150M covering the top surface of the nano-sheet stacked structure NSS including the nano-sheets N1, N2, and N3, and a plurality of sub-gate portions 150S connected to the main gate portion 150M and formed in spaces between the nano-sheets N1, N2, and N3 and the fin-type active regions FA.

In the cell region CR, the insulation spacers 140 may be disposed on both ends of each of the sub-gate portions 150S with the gate dielectric film 145 therebetween.

In the peripheral circuit region PR, the gate electrode 150 may include the main gate portion 150M covering the top surfaces of the fin-type stacked structures FS and not include the sub-gate portions 150S.

Figure 20A:
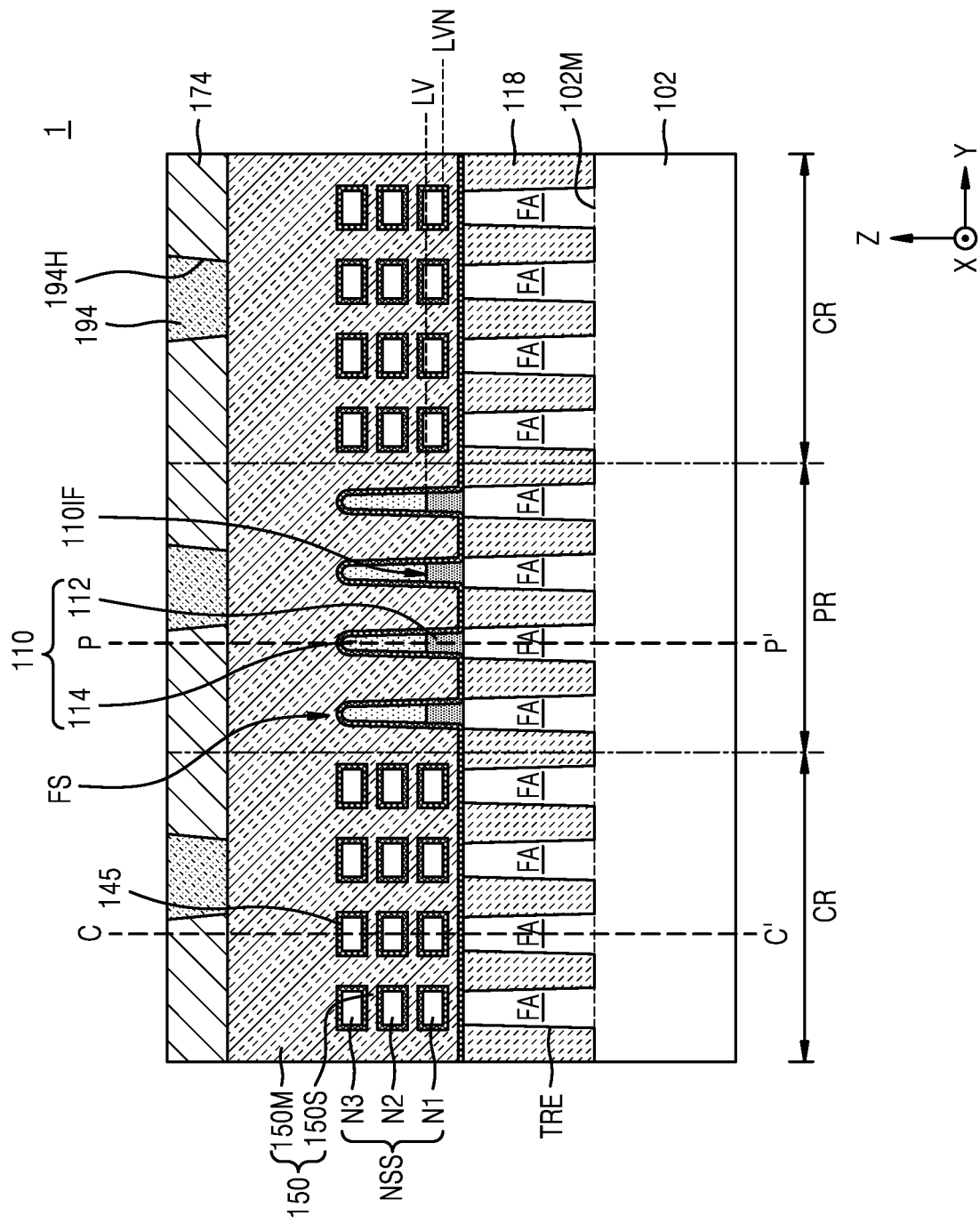
Figure 20B:
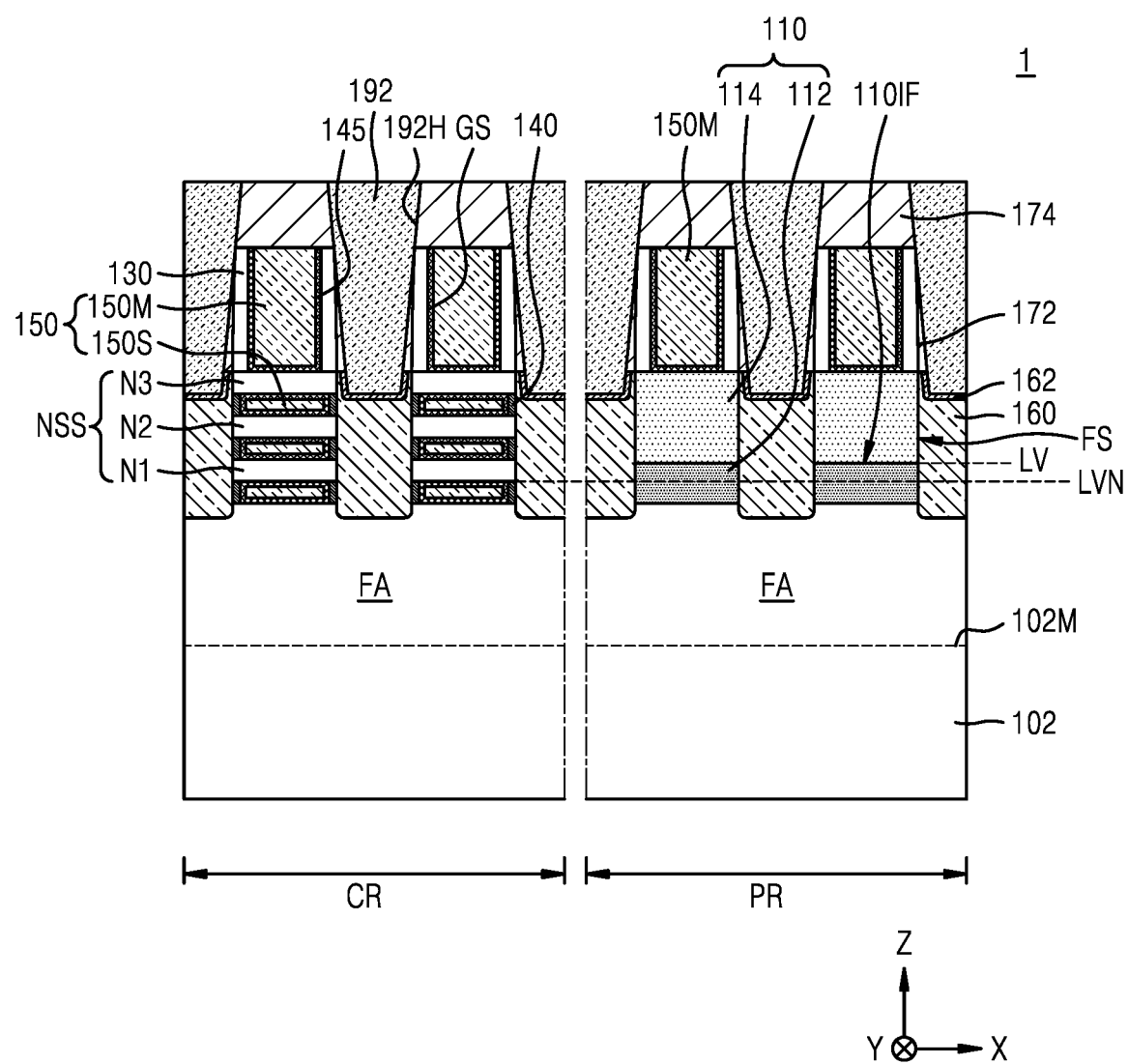

Referring to FIGS. 20A and 20B together, an interlayer insulation film 174 covering the gate electrodes 150 and the inter-gate insulation film 172 is formed. Then, a plurality of first contact holes 192H exposing the source/drain regions 160 is formed by partially etching the interlayer insulation film 174 and the inter-gate insulation film 172, and metal silicide films 162 are formed on the top surfaces of the source/drain regions 160 exposed through the first contact holes 192H, respectively. Also, a plurality of second contact holes 194H exposing the top surfaces of the gate electrodes 150, that is, the top surface of the main gate portion 150M, are formed by partially etching the interlayer insulation film 174. In some exemplary embodiments, the first contact holes 192H and the second contact holes 194H may be formed together through a single etching operation. It is understood, however, that one or more other exemplary embodiments are not limited thereto, and the first contact holes 192H and the second contact holes 194H may be formed through separate etching operations.

Next, a plurality of first contact plugs 192 filling the first contact holes 192H and a plurality of second contact plugs 194 filling the second contact holes 194H are formed, thereby forming the integrated circuit device 1.

The first contact plugs 192 may be connected to the source/drain regions 160 through the metal silicide films 162, and the second contact plugs 194 may be connected to the gate electrodes 150. In some exemplary embodiments, the first contact plugs 192 and the second contact plugs 194 may be formed together, but it is understood that one or more other exemplary embodiments are not limited thereto. For example, according to another exemplary embodiment, the plurality of first contact plugs 192 and the plurality of second contact plugs 194 may be formed through separate operations, respectively.

The integrated circuit device 1 includes a fin-type stacked structure FS including the fin-type active regions FA protruding in the vertical direction (Z direction) from the main surface 102M of the substrate 102 and extending in the first horizontal direction (X direction), the nano-sheet stacked structures NSS facing the top surfaces of the fin-type active regions FA at a position apart from the top surface of the fin-type active regions FA, and the semiconductor layers 110 respectively disposed on the fin-type active regions FA in the peripheral circuit region PR. The cell region CR may be provided with a multi-gate MOSFET and the peripheral circuit region PR may be provided with a single gate MOSFET.

The trenches TRE defining the fin-type active regions FA may be formed in the substrate 102. The sidewalls of the fin-type active regions FA may be covered with the device isolation layer 118 filling the trenches TRE. The levels of the top surfaces of the fin-type active regions FA and the top surface of the device isolator layer 118 may be identical or similar to each other.

The nano-sheet stacked structures NSS are apart from the top surface of the fin-type active regions FA. The nano-sheet stacked structures NSS may include the nano-sheets N1, N2, and N3 extending on the substrate 102 in parallel to the top surface of the fin-type active regions FA The nano-sheets N1, N2, and N3 constituting one nano-sheet stacked structure NSS are sequentially stacked one-by-one on the top surface of the fin-type active regions FA in the cell region CR. Although the present exemplary embodiment exemplifies a case in which the one nano-sheet stacked structure NSS includes three nano-sheets N1, N2, and N3, this is just an example and it is understood that one or more other exemplary embodiments are not limited thereto. Each of the nano-sheets N1, N2, and N3 may have a channel region. For example, the nano-sheets N1, N2, and N3 may include a single material. In some exemplary embodiments, the nano-sheets N1, N2, and N3 may include the same material as the material constituting the substrate 102 in the cell region CR.

The lower semiconductor layer 112 and the upper semiconductor layer 114 constituting one semiconductor layer 110 are sequentially stacked on the top surface of the fin-type active regions FA in the peripheral circuit region PR. For example, the lower semiconductor layer 112 and the upper semiconductor layer 114 may include a single material. In the peripheral circuit region PR, the fin-type active regions FA, the lower semiconductor layer 112, and the upper semiconductor layer 114 have the same crystallinity, wherein the top surface of the lower semiconductor layer 112 and the bottom surface of the upper semiconductor layer 114 contacting each other may have a semiconductor interface 110IF therebetween. In some exemplary embodiments, the lower semiconductor layer 112 and the upper semiconductor layer 114 may include the same material as the material constituting the fin-type active regions FA in the peripheral circuit region PR.

In some exemplary embodiments, the semiconductor interface 110IF may be along a plane parallel to the top surface or the main surface 102M of the substrate 102. For example, in the peripheral circuit region PR, the semiconductor interface 110IF of each of the semiconductor layers 110 stacked on the top surfaces of the fin-type active regions FA may be on the same plane parallel to the top surface or the main surface 102M of the substrate 102.

A level LV of the semiconductor interface 110IF may be higher than the level LVN of the bottom surface of a nano-sheet N1 closest to the substrate 102 from the nano-sheet stacked structure NSS of the nano-sheets N1, N2, and N3 in the vertical direction (Z direction). The level LVN of the bottom surface of the nano-sheet N1 closest to the substrate 102 from the nano-sheet stacked structure NSS of the nano-sheets N1, N2, and N3 may be referred to as a reference level LVN. In some embodiments, the level LV of the semiconductor interface 110IF may be higher than the reference level LVN, but lower than a level of the top surface of the nano-sheet N1 closest to the substrate 102 from the nano-sheet stacked structure NSS of the nano-sheets N1, N2, and N3.

In the nano-sheet stacked structure NSS of the nano-sheets N1, N2, N3 arranged on the fin-type active regions FA, the semiconductor layers 110 disposed on the fin-type active regions FA in the peripheral circuit region PR may be at substantially the same level.

On the fin-type active regions FA, the gate electrodes 150 may extend in the second horizontal direction (Y direction) intersecting with the first horizontal direction (X direction). The gate electrodes 150 may at least partially overlap the nano-sheet stacked structures NSS in the cell region CR in the vertical direction (Z direction) and may at least partially overlap the fin-type stacked structures FS in the peripheral circuit region PR in the vertical direction (Z direction).

Each of the gate electrodes 150 in the cell region CR may be formed to at least partially surround the nano-sheets N1, N2, and N3 while covering the nano-sheet stacked structure NSS. In the cell region CR, the gate electrode 150 may include the main gate portion 150M covering the top surface of the nano-sheet stacked structure NSS and the sub-gate portions 150S connected to the main gate portion 150M and formed in the spaces between the fin-type active regions FA and the nano-sheets N1, N2, and N3, that is, below the nano-sheets N1, N2, and N3. The gate dielectric film 145 is formed between the nano-sheet stacked structure NSS and the gate electrode 150.

In the peripheral circuit region PR, the gate electrodes 150 may be formed to cover the surface of the fin-type stacked structure FS. In the peripheral circuit region PR, the gate electrodes 150 may include only the main gate portion 150M and may not include the sub-gate portions 150S. The gate dielectric film 145 is formed between the fin-type stacked structure FS and the gate electrode 150.

The source/drain regions 160 are formed on the fin-type active regions FA in the cell region CR and the peripheral circuit region PR. In the cell region CR, the source/drain regions 160 are connected to one of the ends of neighboring nano-sheets N1, N2, and N3. In the peripheral circuit region PR, the source/drain regions 160 are connected to the sidewalls of neighboring fin-type stacked structures FS.

The gate spacers 130 sequentially covering the sidewalls of the gate electrodes 150 are formed on the nano-sheet stacked structures NSS and the fin-type stacked structures FS. The gate spacer 130 may include a silicon nitride film, but is not limited thereto in one or more other exemplary embodiments. The gate spacer 130 may cover the sidewalls of the main gate portion 150M of the gate electrode 150.

In the cell region CR, the insulation spacers 140 contacting the source/drain regions 160 are formed in the spaces between the nano-sheets N1, N2, and N3 The insulation spacers 140 may be disposed between the sub-gate portions 150S and the source/drain regions 160 in the spaces between the fin-type active region FA and the nano-sheets N1, N2, and N3.

On the source/drain regions 160, the inter-gate insulation film 172 and the interlayer insulation film 174 are sequentially formed. The inter-gate insulation film 172 and the interlayer insulation film 174 may each include a silicon oxide film, although it is understood that one or more other exemplary embodiments are not limited thereto.

The first contact plugs 192 may be connected to the source/drain regions 160. The first contact plugs 192 may be connected to the source/drain regions 160 through the interlayer insulation film 174 and the inter-gate insulation film 172. The metal silicide film 162 may be between the source/drain regions 160 and the first contact plugs 192. In some exemplary embodiments, the metal silicide film 162 may be omitted.

The second contact plugs 194 may be connected to the gate electrodes 150. The second contact plugs 194 may be connected to the gate electrodes 150 through the interlayer insulation film 174.

The first contact plug 192 and the second contact plug 194 may each include a metal, a conductive metal nitride, or a combination thereof.

In the integrated circuit device 1 according to an exemplary embodiment, the lower semiconductor layer 112 of the semiconductor layers 110 substantially at the same level as the nano-sheet stacked structure NSS of the nano-sheets N1, N2, and N3 may be formed through an epitaxial growth at the first temperature. Meanwhile, the upper semiconductor layer 114 may be formed by forming a semiconductor amorphous layer at the second temperature lower than the first temperature and crystallizing the semiconductor amorphous layer through a heat treatment at the third temperature, which is lower than the first temperature and higher than the second temperature. Therefore, as compared to the case of forming all the semiconductor layers (110 of FIG. 10) of the fin-type stacked structures FS at the first temperature, the semiconductor layers 110 may be formed at a relatively low temperature range. As a result, changes of thicknesses of the sacrificial semiconductor layers (106S of FIG. 10) and the nano-sheet semiconductor layers (NS of FIG. 10) due to diffusions occurring in the stacked structure of the sacrificial semiconductor layers 106S and the nano-sheet semiconductor layers NS may be prevented, thereby securing the reliability of the integrated circuit device 1.

FIGS. 21 to 32, 33A, 33B, 34 to 38, 39A, and 39B are cross-sectional views of operations of a method of manufacturing an integrated circuit device, according to one or more exemplary embodiments, and an integrated circuit device manufactured thereby. Descriptions identical or substantially similar to those given above with reference to FIGS. 1 to 13, 14A, 14B, 15 to 19, 20A, and 20B may be omitted below. In detail, FIGS. 21 to 32, 33A, and 39A are cross-sectional views taken along the YZ plane, FIGS. 33B, 34 to 38, and 39B are cross-sectional views taken along the XZ plane, FIG. 33B is a cross-sectional view taken along a line C-C', a line P1-P1', and a line P2-P2' of FIG. 33A, FIGS. 34 to 38 are cross-sectional views taken along locations corresponding to the line C-C', the line P1-P1', and the line P2-P2' of FIG. 33A, and FIG. 39B is a cross-sectional view taken along a line C-C', a line P1-P1', and a line P2-P2' of FIG. 39A.

Figure 21:
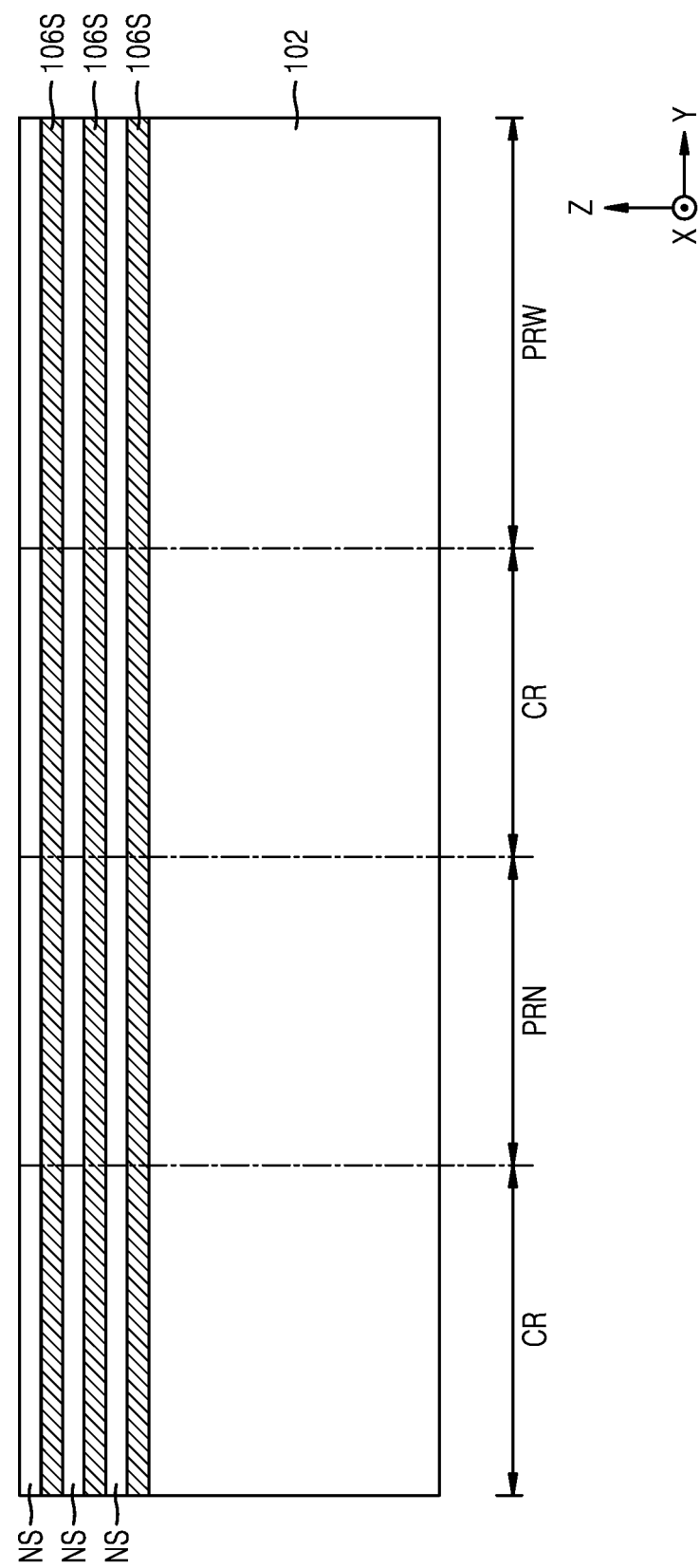

Referring to FIG. 21, the sacrificial semiconductor layers 106S and the nano-sheet semiconductor layers NS are alternately stacked one-by-one on a substrate 102 having a cell region CR, a first peripheral circuit region PRN, and a second peripheral circuit region PRW. In some exemplary embodiments, the width of the second peripheral circuit region PRW may be greater than the width of the first peripheral circuit region PRN in the second horizontal direction (Y direction).

Figure 22:
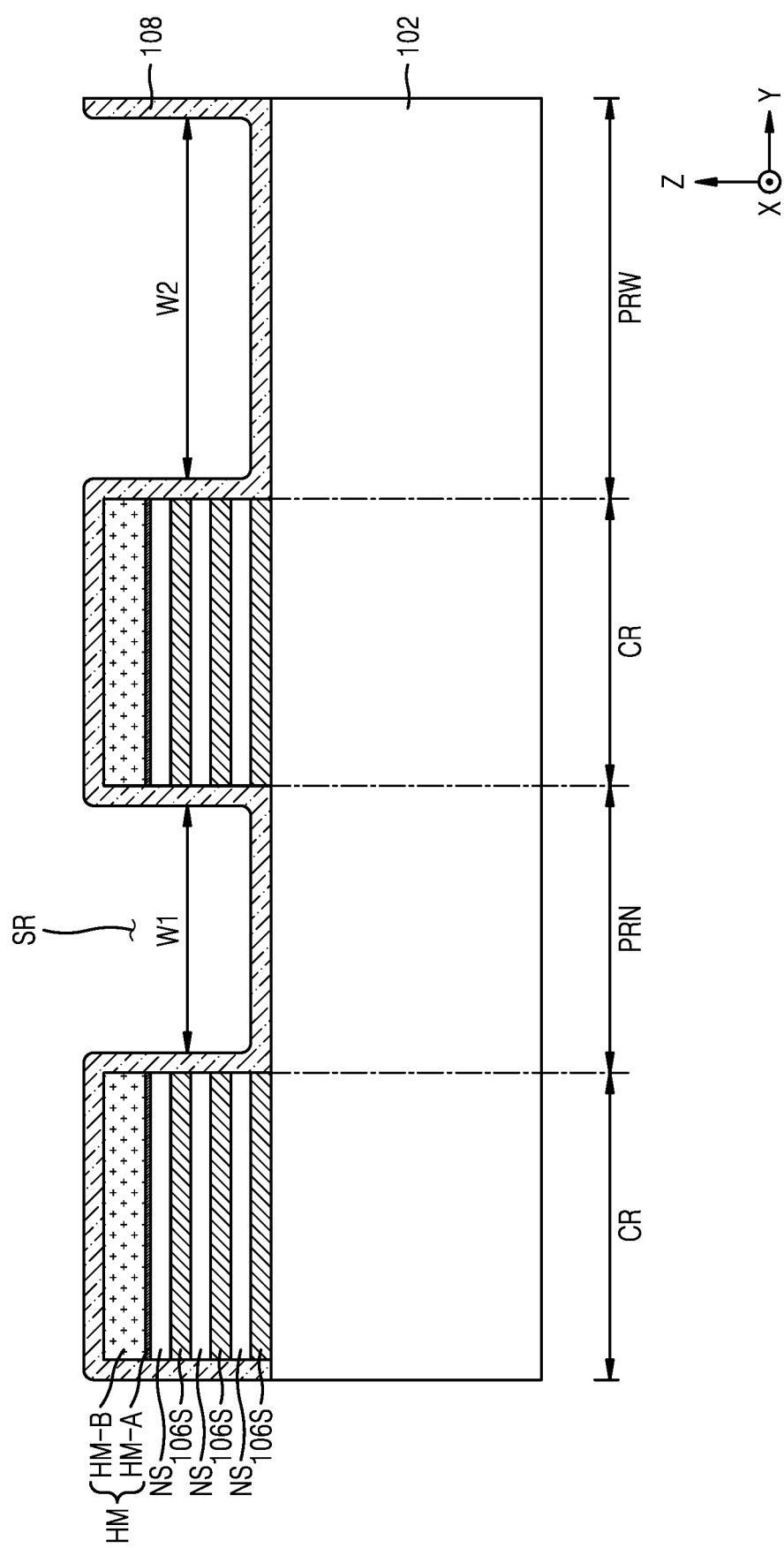

Referring to FIG. 22, a hard mask pattern HM is formed on a stacked structure including a plurality of sacrificial semiconductor layers 106S and a plurality of nano-sheet semiconductor layers NS in a cell region CR. The hard mask pattern HM may have a stacked structure including a first hard mask layer HM-A and a second hard mask layer HM-B.

A stack recess SR is formed by removing portions of the stacked structure including the sacrificial semiconductor layers 106S and the nano-sheet semiconductor layers NS in the first peripheral circuit region PRN and the second peripheral circuit region PRW by using the hard mask pattern HM as an etch mask. As a result, the top surface of the substrate 102 may be exposed in the peripheral circuit region PR.

After forming the stack recess SR, a cover insulation layer 108 conformally covering inner sidewalls and the bottom surface of the stack recess SR and surfaces of the stacked structure including the sacrificial semiconductor layers 106S and the nano-sheet semiconductor layers NS having formed thereon the hard mask pattern HM is formed.

In some exemplary embodiments, a first width W1 of the stack recess SR in the first peripheral circuit region PRN defined by the cover insulation layer 108 in the second horizontal direction (Y direction) may be less than a second width W2 of the second peripheral circuit region PRW.

Figure 23:
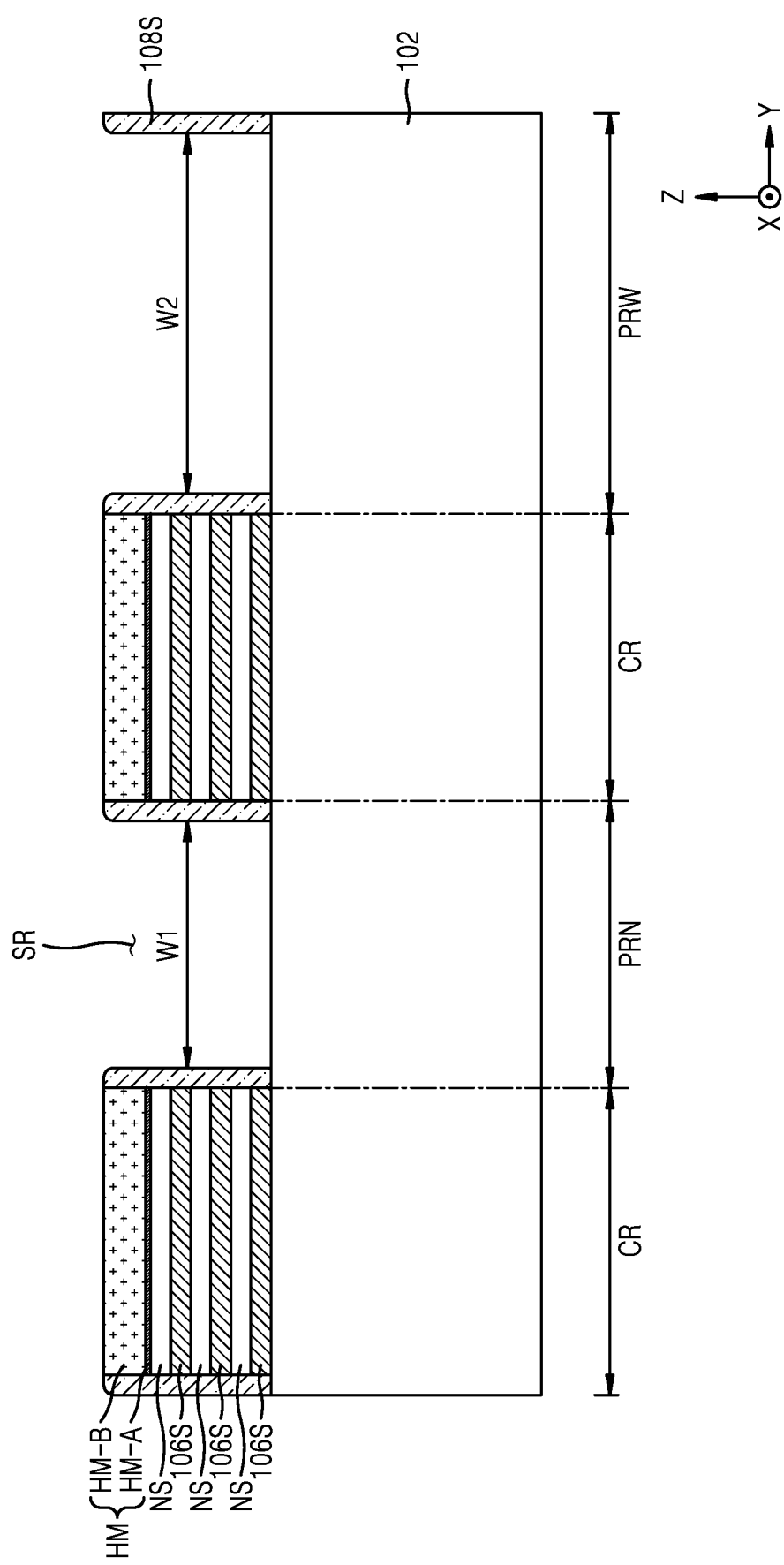

Referring to FIGS. 22 and 23, a portion of the cover insulation layer 108, for example, a portion of the cover insulation layer 108 on the top surface of the hard mask pattern HM in the cell region CR and a portion of the cover insulation layer 108 covering the top surface of the substrate 102 in the peripheral circuit region PR, are removed to form a cover spacer 108S covering the outer sidewalls of the stacked structure including the sacrificial semiconductor layers 106S and the nano-sheet semiconductor layers NS having formed thereon the hard mask pattern HM, that is, the inner sidewalls of the stack recess RS.

Figure 24:
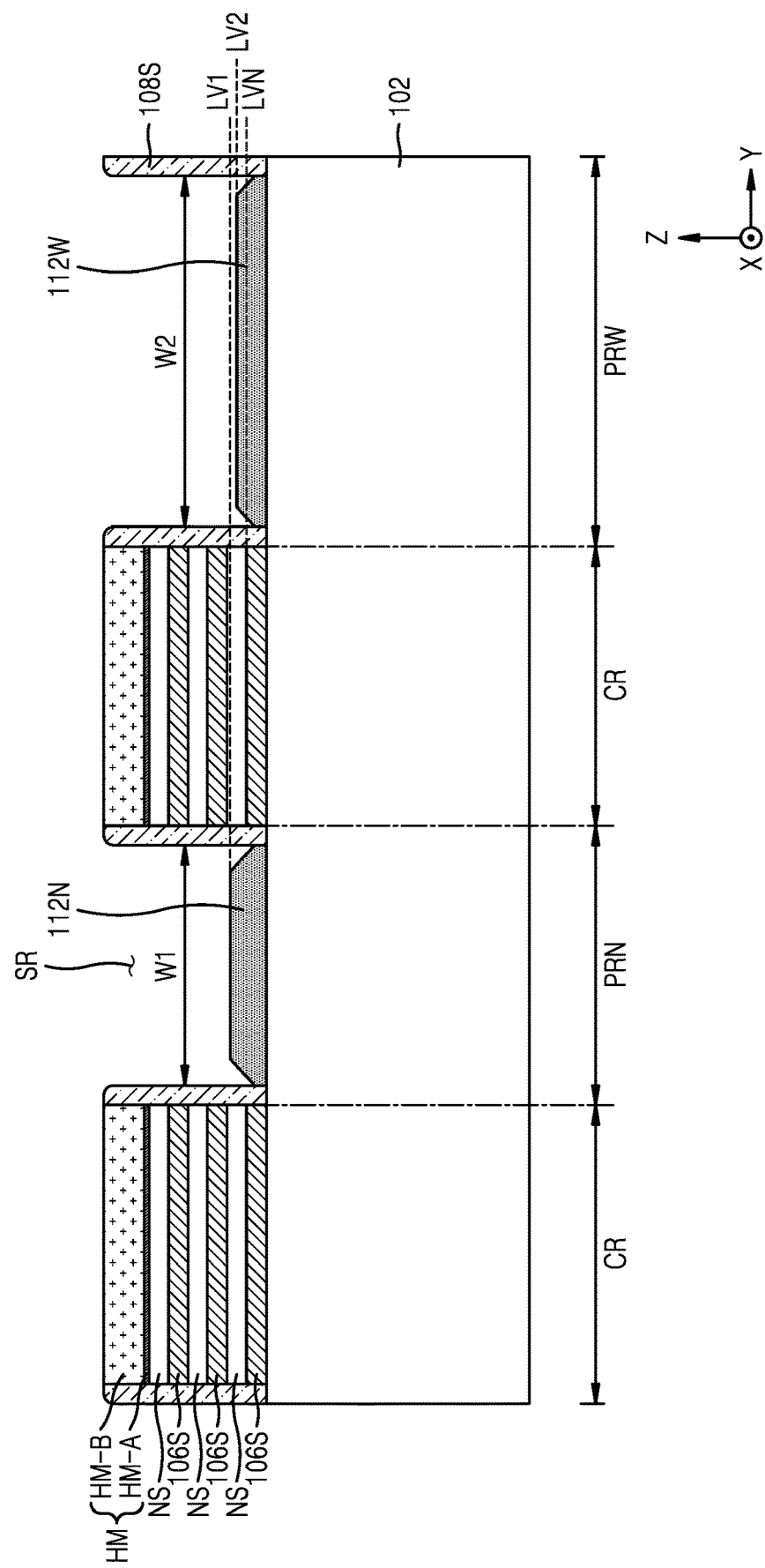

Referring to FIG. 24, a first semiconductor epitaxial layer 112N is formed on the substrate 102 in the first peripheral circuit region PRN and a second semiconductor epitaxial layer 112W is formed on the substrate 102 in the second peripheral circuit region PRW. Each of the first semiconductor epitaxial layer 112N and the second semiconductor epitaxial layer 112W may be formed through an epitaxial growth at a first temperature to have the same crystallinity as that of the substrate 102 therebelow. The first temperature may be, for example, from about 700° C. to about 800° C.

Each of the first semiconductor epitaxial layer 112N and the second semiconductor epitaxial layer 112W may be formed to have a thickness greater than the sacrificial semiconductor layer 106S closest to the substrate 102 from among the sacrificial semiconductor layers 106S. In other words, a first level LV1, which is the topmost level of the top surface of the first semiconductor epitaxial layer 112N, and a second level LV2, which is the topmost level of the top surface of the second semiconductor epitaxial layer 112W, may be higher than the level LVN of the sacrificial semiconductor layer 106S closest to the substrate 102 from among the sacrificial semiconductor layers 106S and the level LVN of the bottom surface of the nano-sheet semiconductor layer NS closest to the substrate 102 from among the nano-sheet semiconductor layers NS. In some exemplary embodiments, the first level LV1 may be higher than the second level LV2. In other words, the thickness of the first semiconductor epitaxial layer 112N may be greater than the thickness of the second semiconductor epitaxial layer 112W.

In some exemplary embodiments, the top surfaces of the first semiconductor epitaxial layer 112N and the second semiconductor epitaxial layer 112W may each have a plurality of facets having different slopes from one another. For example, the top surfaces of the first semiconductor epitaxial layer 112N and the second semiconductor epitaxial layer 112W may each have a facet parallel to the top surface of the substrate 102 and at least one facet having a slope with respect to the top surface of the substrate 102.

Figure 25:
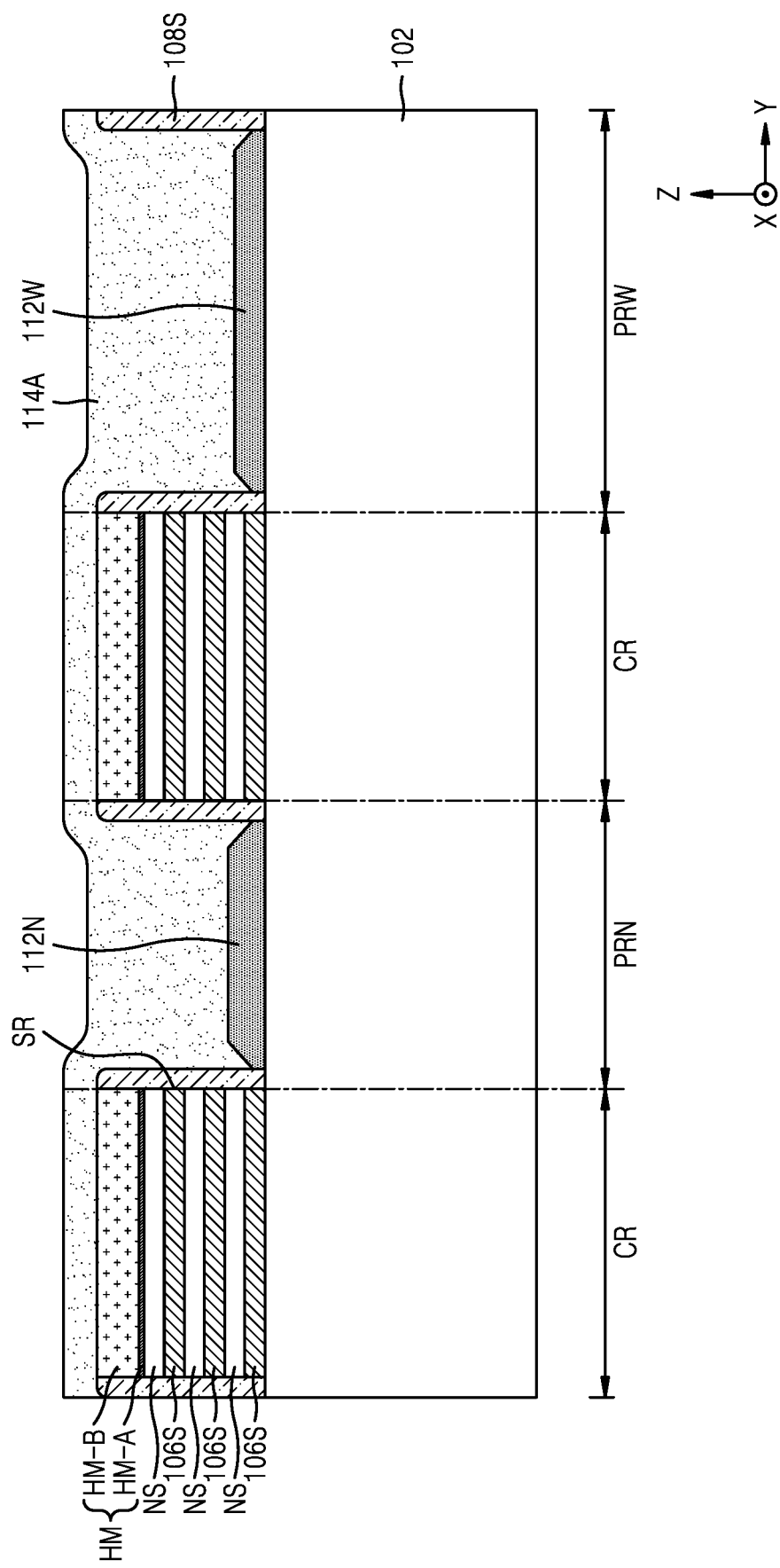

Referring to FIG. 25, a semiconductor amorphous layer 114A filling the stack recess SR is formed on the substrate 102. The semiconductor amorphous layer 114A may be formed at a second temperature to cover the sacrificial semiconductor layers 106S and the nano-sheet semiconductor layers NS having formed thereon the hard mask pattern HM, the first semiconductor epitaxial layer 112N, and the second semiconductor epitaxial layer 112W and fill the stack recess SR. The second temperature may be lower than the first temperature. The second temperature may be, for example, from about 500° C. to about 650° C.

Figure 26:
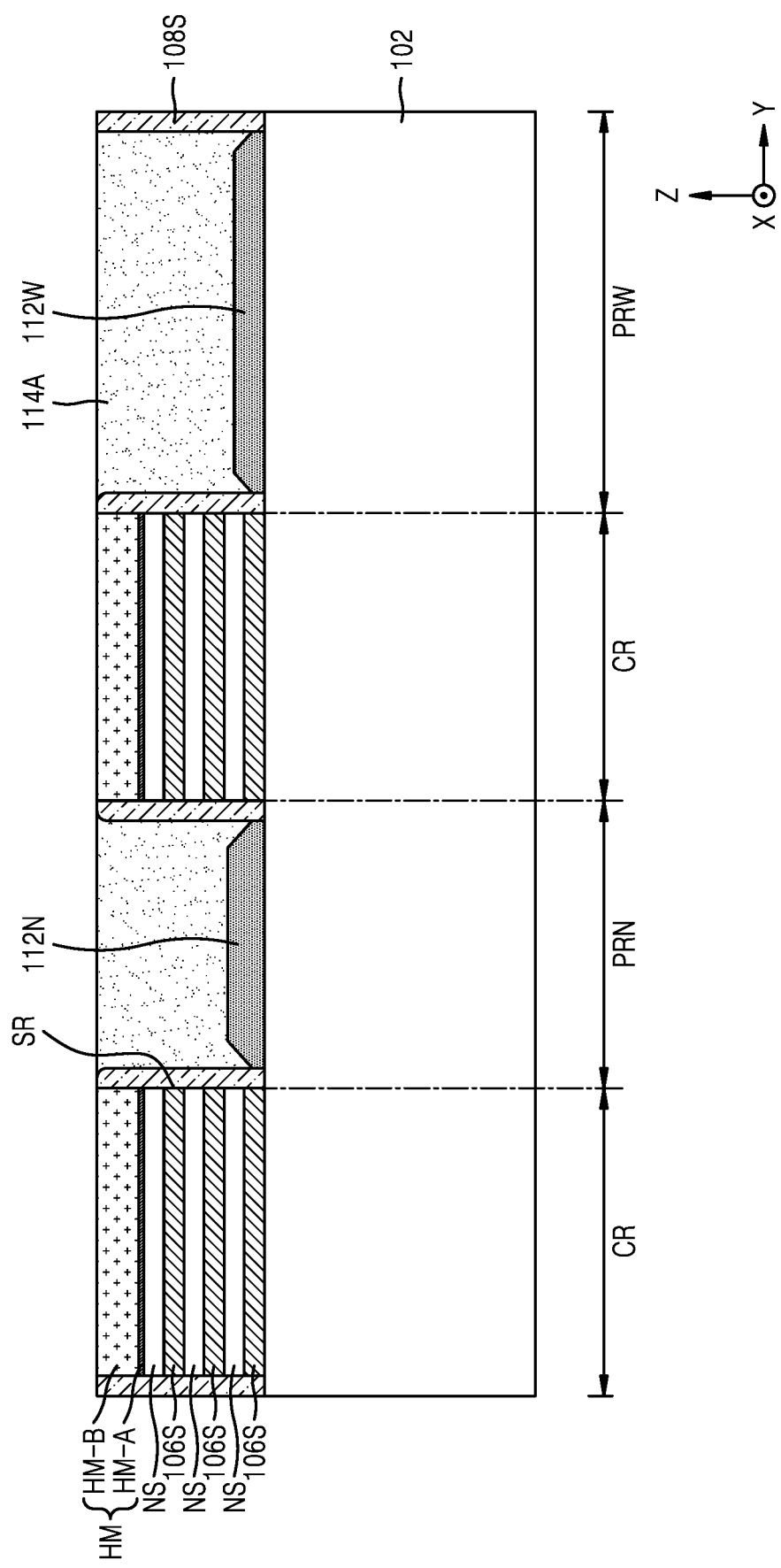

Referring to FIG. 26, a portion of the semiconductor amorphous layer 114A outside the stack recess SR shown in FIG. 25, that is, a portion of the semiconductor amorphous layer 114A higher than the top surface of the hard mask pattern HM, is removed.

Figure 27:
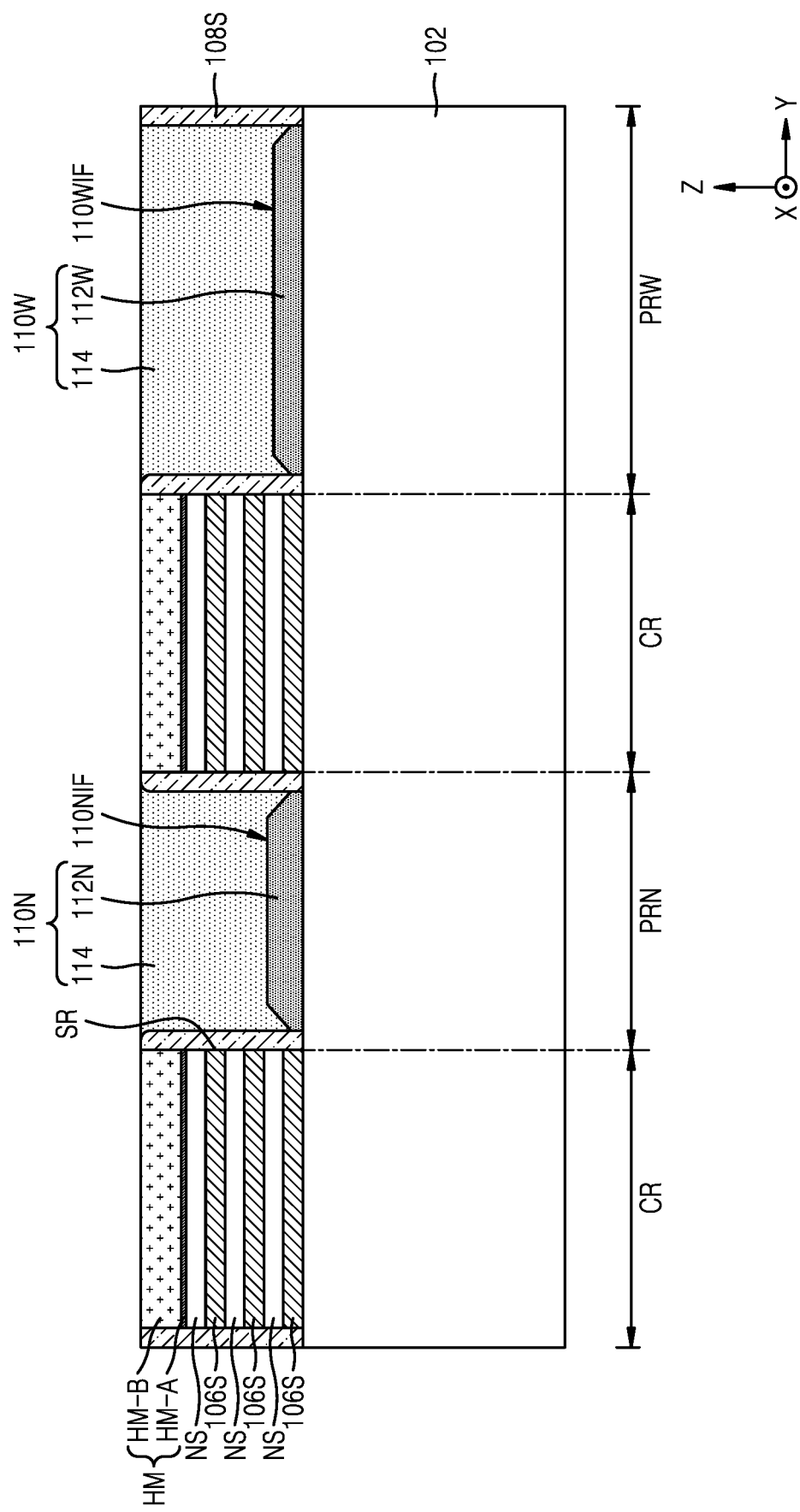

Referring to FIGS. 26 and 27, the semiconductor crystalline layer 114 is formed by crystallizing the semiconductor amorphous layer 114A by performing heat treatment at a third temperature. The third temperature may be lower than the first temperature and higher than the second temperature. For example, the third temperature may be from about 600° C. to about 700° C.

In some exemplary embodiments, as shown in FIGS. 5, 7, and 8, after the semiconductor amorphous layer 114A shown in FIG. 25 is crystallized, a portion thereof corresponding to a level higher than that of the top surface of the hard mask pattern HM may be removed, thereby forming the semiconductor crystalline layer 114.

The first semiconductor epitaxial layer 112N and the semiconductor crystalline layer 114 in the first peripheral circuit region PRN may be referred to as a first lower semiconductor layer 112N and a first upper semiconductor layer 114, respectively, and may constitute a first semiconductor layer 110N including the first lower semiconductor layer 112N and the first upper semiconductor layer 114 in the first peripheral circuit region PRN. The second semiconductor epitaxial layer 112W and the semiconductor crystalline layer 114 in the second peripheral circuit region PRW may be referred to as a second lower semiconductor layer 112W and a second upper semiconductor layer 114 and may constitute a second semiconductor layer 110W including the second lower semiconductor layer 112N and the second upper semiconductor layer 114 in the second peripheral circuit region PRW.

A first semiconductor interface 110NIF and a second semiconductor interface 110WIF may be observed between the first semiconductor epitaxial layer 112N and the semiconductor crystalline layer 114 and between the second semiconductor epitaxial layer 112W and the semiconductor crystalline layer 114. In some exemplary embodiments, the first semiconductor interface 110NIF and the second semiconductor interface 110WIF may each include a plurality of planes having different slopes. For example, the first semiconductor interface 112NIF and the second semiconductor interface 112WIF may each have a surface parallel to the top surface of the substrate 102 and at least one surface having a slope with respect to the top surface of the substrate 102.

Figure 28:
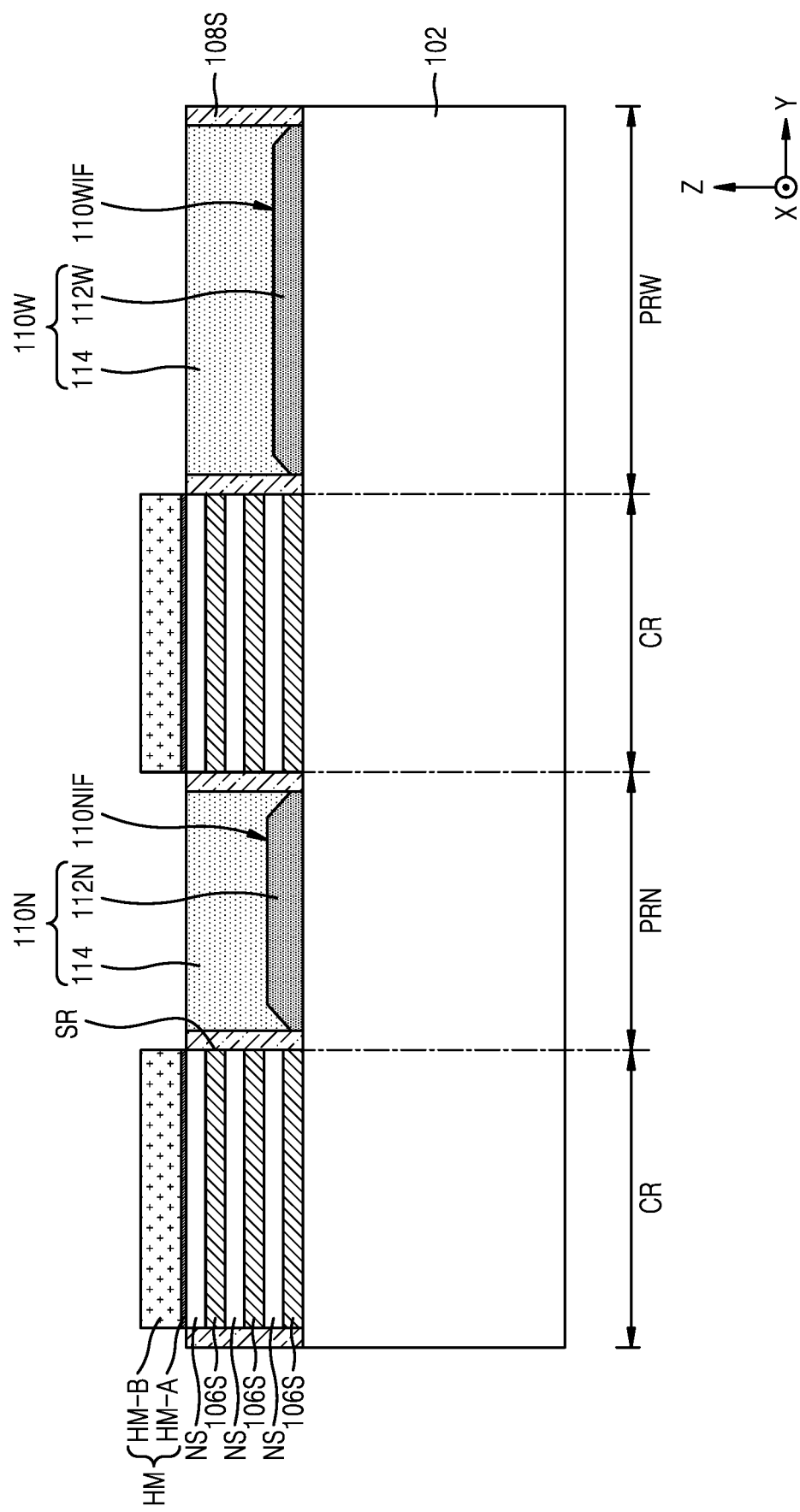

Referring to FIGS. 27 and 28 together, the upper portion of the semiconductor crystalline layer 114 shown in FIG. 27 is partially removed, such that the top surface of the semiconductor crystalline layer 114 is at the same level as the top surface of the stacked structure of the sacrificial semiconductor layers 106S and the nano-sheet semiconductor layers NS, that is, the top surface of the nano-sheet semiconductor layer NS farthest from the substrate 102 from among the nano-sheet semiconductor layers NS. The upper portion of the cover spacer 108S may also be partially removed during the operation for partially removing the upper portion of the semiconductor crystalline layer 114.

Figure 29:
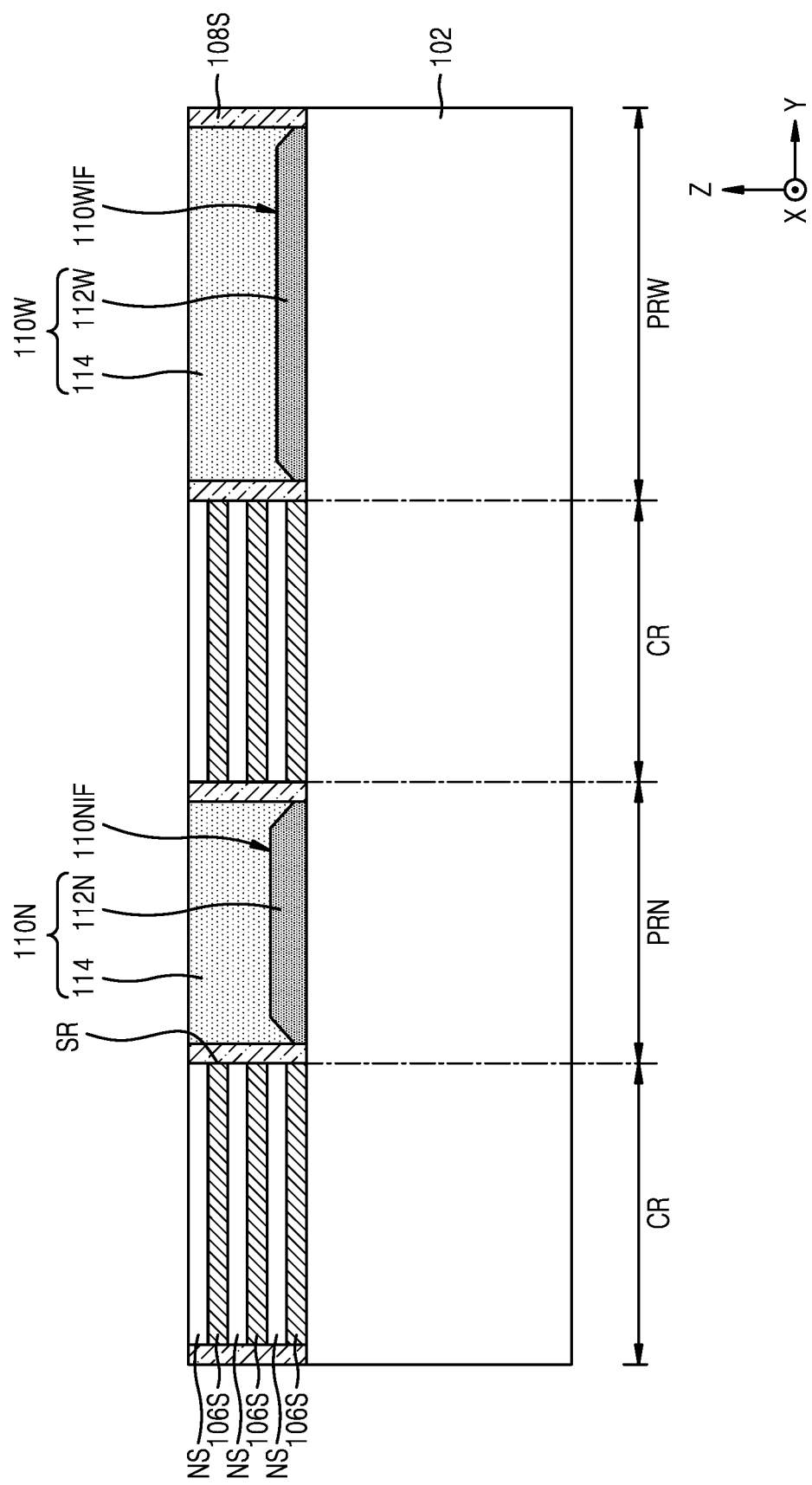

Referring to FIGS. 28 and 29 together, the hard mask pattern HM formed on the stacked structure including the sacrificial semiconductor layers 106S and the nano-sheet semiconductor layers NS in the cell region CR is removed.

Figure 30:
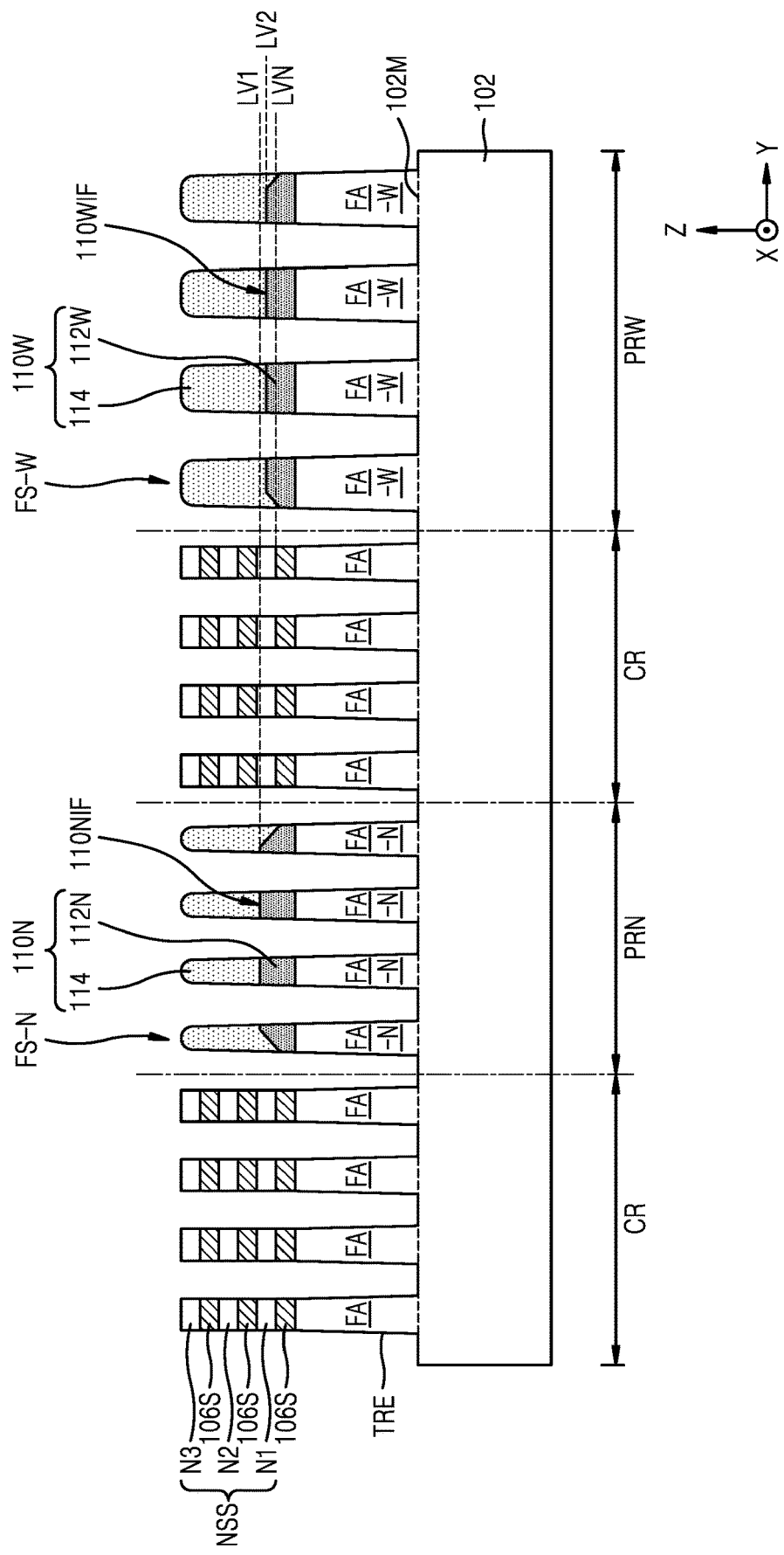

Referring to FIGS. 29 and 30 together, the stacked structure of the sacrificial semiconductor layers 106S and the nano-sheet semiconductor layers NS, the first semiconductor layer 110N, the second semiconductor layer 110W, and a portion of the substrate 102 are etched to form the trenches TRE. As a result, a plurality of first fin-type active regions FA-N defined by the trenches TRE may be formed in the first peripheral circuit region PRN, a plurality of second fin-type active regions FA-W defined by the trenches TRE may be formed in the second peripheral circuit region PRW, and a plurality of third fin-type active regions FA defined by the trenches TRE may be formed in the cell region CR. The first fin-type active regions FA-N, the second fin-type active regions FA-W, and the third fin-type active regions FA may extend in the first horizontal direction (X direction) parallel to one another. The first fin-type active regions FA-N, the second fin-type active regions FA-W, and the third fin-type active regions FA may protrude in the vertical direction (Z direction) upward from the main surface 102M of the substrate 102 in the first peripheral circuit region PRN, the second peripheral circuit region PRW, and the cell region CR, respectively.

The first semiconductor layers 110N, which are a stacked structure of the first lower semiconductor layer 112N and the first upper semiconductor layer 114, may be arranged on the first fin-type active regions FA-N in the first peripheral circuit region PRN. The second semiconductor layers 110W, which are a stacked structure of the second lower semiconductor layer 112W and the second upper semiconductor layer 114, may be arranged on the second fin-type active regions FA-W in the second peripheral circuit region PRW. In the second horizontal direction (Y direction), the width of the first semiconductor layer 110N may be less than the width of the second semiconductor layer 110W.

The sacrificial semiconductor layers 106S and a stacked structure NSS of a plurality of nano-sheets N1, N2, and N3 may be disposed on the third fin-type active regions FA in the cell region CR.

The nano-sheet stacked structure NSS of the nano-sheets N1, N2, and N3 arranged on the third fin-type active regions FA in the cell region CR, the first semiconductor layers 110N arranged on the first fin-type active regions FA-N in the first peripheral circuit region PRN, and the second semiconductor layers 110W arranged on the second fin-type active region FA-W in the second peripheral circuit region PRW may be at substantially the same level.

The cover spacers 108S may all be removed during the formations of the nano-sheet stacked structure NSS of the nano-sheets N1, N2, and N3, the first semiconductor layers 110N, and the second semiconductor layers 110W.

Each of the first semiconductor layers 110N may have the first semiconductor interface 110NIF between the first lower semiconductor layer 112N and the first upper semiconductor layer 114. In some exemplary embodiments, some of the first semiconductor interfaces 110NIF may be along a plane having a slope with respect to the top surface or the main surface 102M of the substrate 102. Further, some of the first semiconductor interfaces 110NIF may be along a plane parallel to the top surface or the main surface 102M of the substrate 102. Additionally, the first semiconductor interface 110NIF of at least one outer first semiconductor layer 110N from among the first semiconductor layers 110N arranged in the first peripheral circuit region PRN may be along a plane having a slope with respect to the top surface or the main surface 102M of the substrate 102, and the first semiconductor interface 110NIF of at least one inner first semiconductor layer 110N from among the first semiconductor layers 110N may be along a plane parallel to the top surface or the main surface 102M of the substrate 102

Each of the second semiconductor layers 110W may have the second semiconductor interface 110WIF between the second lower semiconductor layer 112W and the second upper semiconductor layer 114. In some exemplary embodiments, some of the second semiconductor interfaces 110WIF may be along a plane having a slope with respect to the top surface or the main surface 102M of the substrate 102. Further, some of the second semiconductor interfaces 110WIF may be along a plane parallel to the top surface or the main surface 102M of the substrate 102. Additionally, the second semiconductor interface 110WIF of at least one outer second semiconductor layer 110W from among the second semiconductor layers 110W arranged in the second peripheral circuit region PRW may have a plurality of surfaces having different slopes from one another. For example, the second semiconductor interface 110WIF of at least one outer second semiconductor layer 110W from among the second semiconductor layers 110W arranged in the second peripheral circuit region PRW may have both a surface having a slope with respect to the top surface or the main surface 102M of the substrate 102 and a surface parallel to the top surface or the main surface 102M of the substrate 102. In some exemplary embodiments, the second semiconductor interface 110WIF of at least one inner second semiconductor layer 110W from among the second semiconductor layers 110W arranged in the second peripheral circuit region PRW may be along a plane parallel to the top surface or the main surface 102M of the substrate 102.

Also, the second semiconductor interface 110WIF of at least another semiconductor layer 110W disposed between the second semiconductor layer 110W including the second semiconductor interface 110WIF having a plurality of surfaces with different slopes and the second semiconductor layer 110W including the second semiconductor interface 110WIF having a surface parallel to the top surface or the main surface 102M of the substrate 102 from among the second semiconductor layers 110W arranged in the second peripheral circuit region PRW may be along a plane having a slope with respect to the top surface or the main surface 102M of the substrate 102.

A stacked structure of the first fin-type active regions FA-N, the first lower semiconductor layer 112N, and the first upper semiconductor layer 114 in the first peripheral circuit region PRN may be referred to as a first fin-type stacked structure FS-N, whereas a stacked structure of the second fin-type active regions FA-W, the second lower semiconductor layer 112W, and the second upper semiconductor layer 114 in the second peripheral circuit region PRW may be referred to as a second fin-type stacked structure FS-W.

Figure 31:
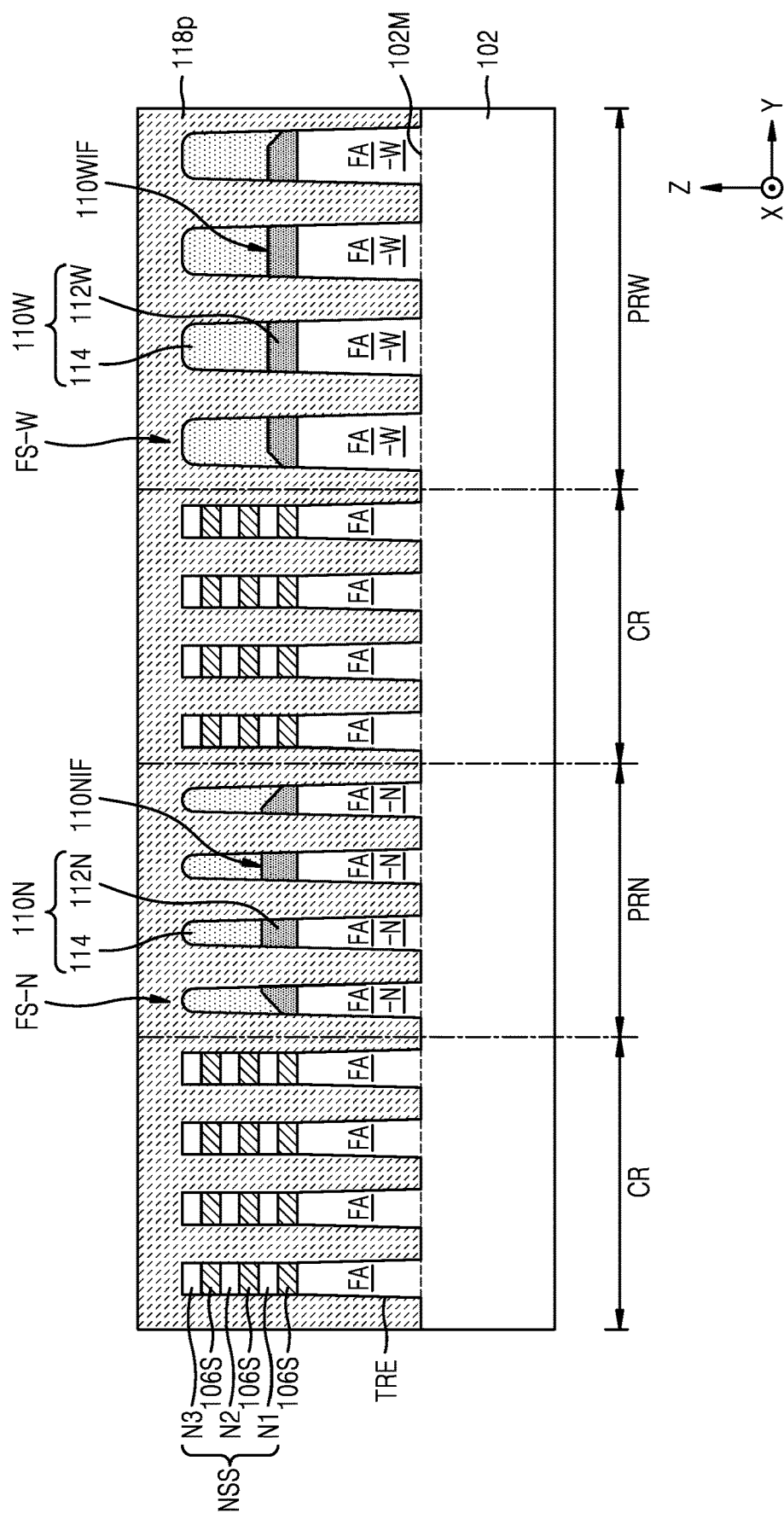

Referring to FIG. 31, a preliminary device isolation layer 118p filling the trenches TRE is formed. The preliminary device isolation layer 118p may be formed to cover the sidewalls and the top surface of the third fin-type active regions FA and the nano-sheet stacked structure NSS of the nano-sheets N1, N2, and N3 in the cell region CR, the sidewalls and the top surface of the first fin-type stacked structure FS-N in the first peripheral circuit region PRN, and the sidewalls and the top surface of the second fin-type stacked structure FS-W in the second peripheral circuit region PRW.

Figure 32:
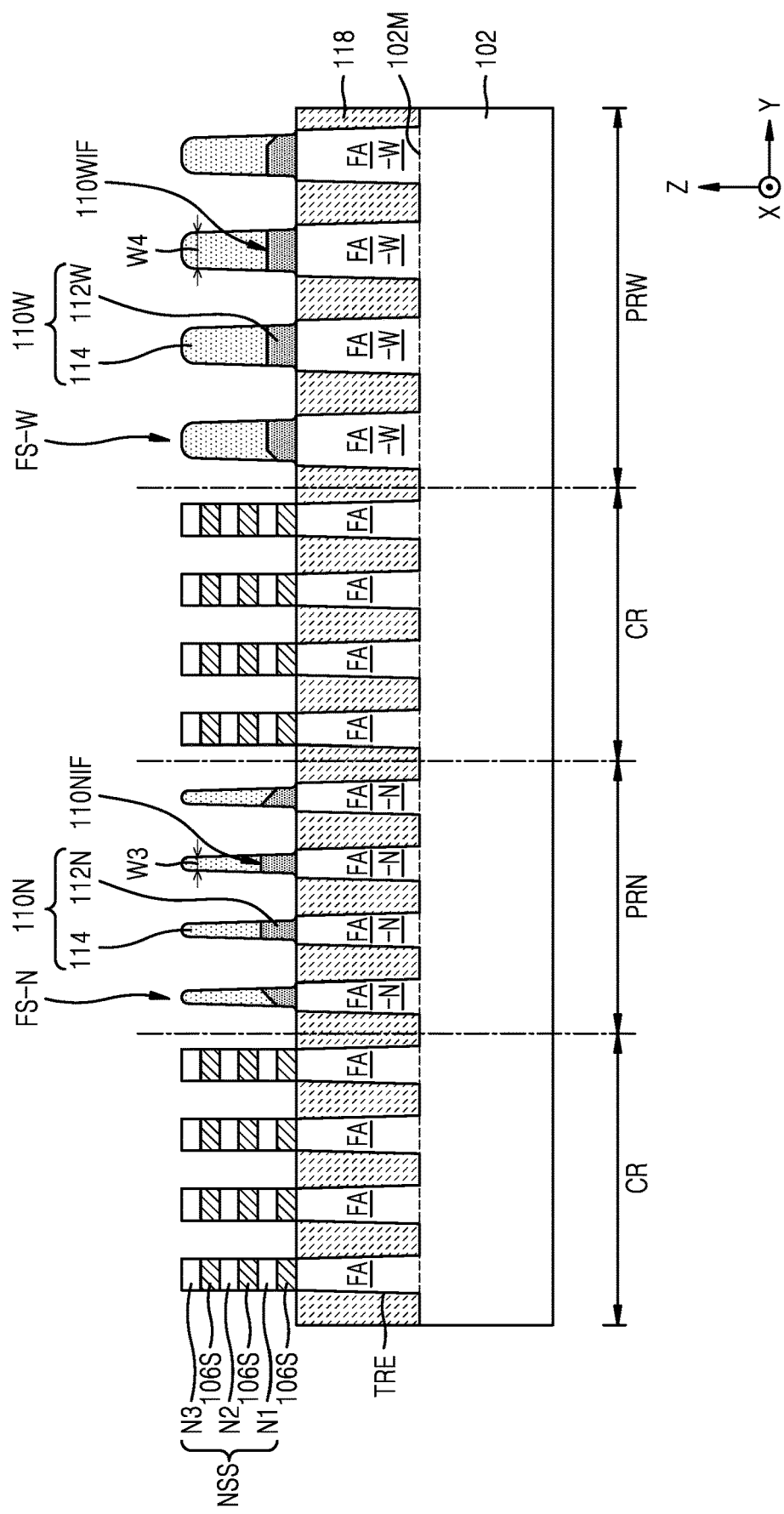
Figure 33A:
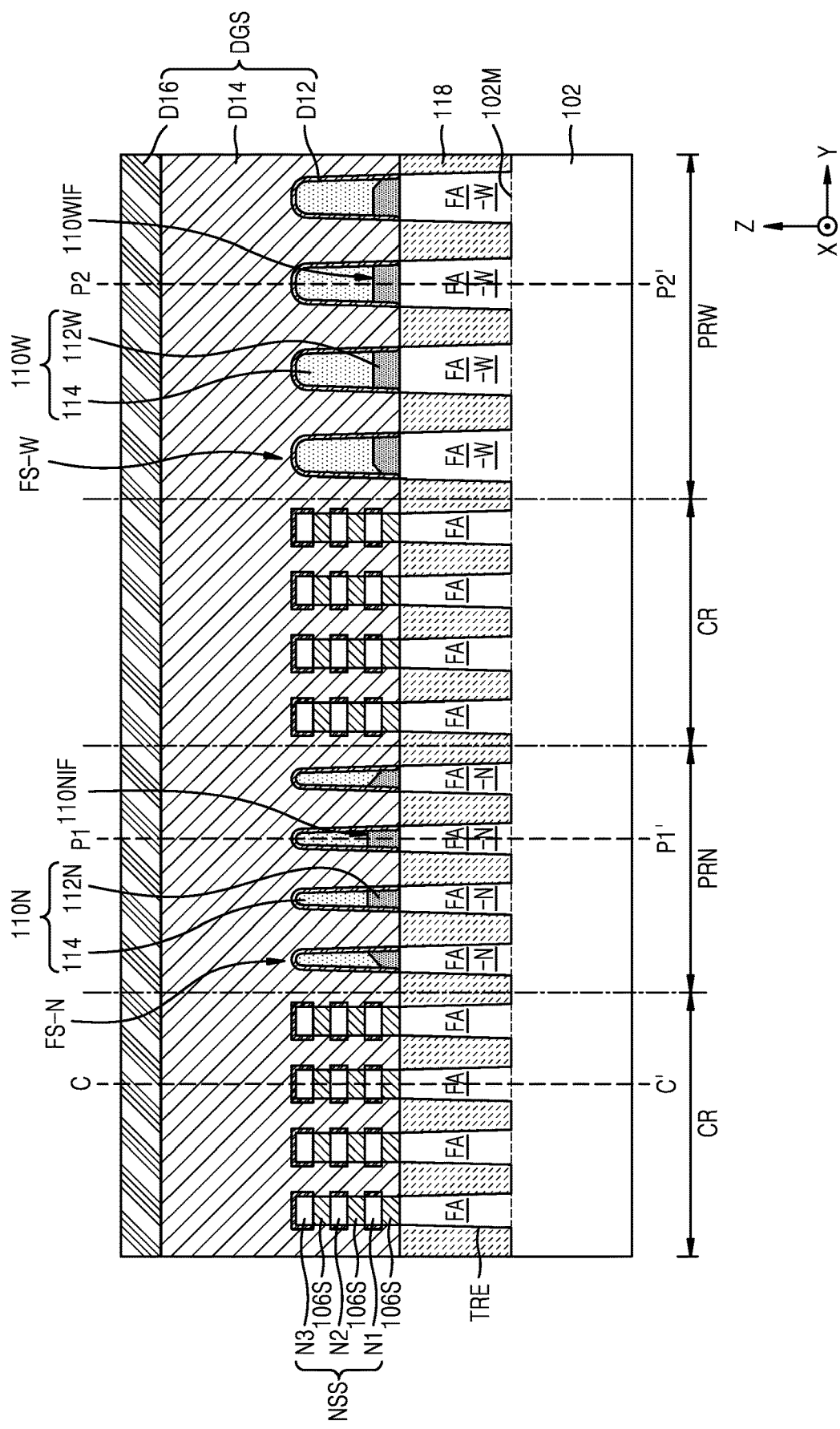
Figure 33B:
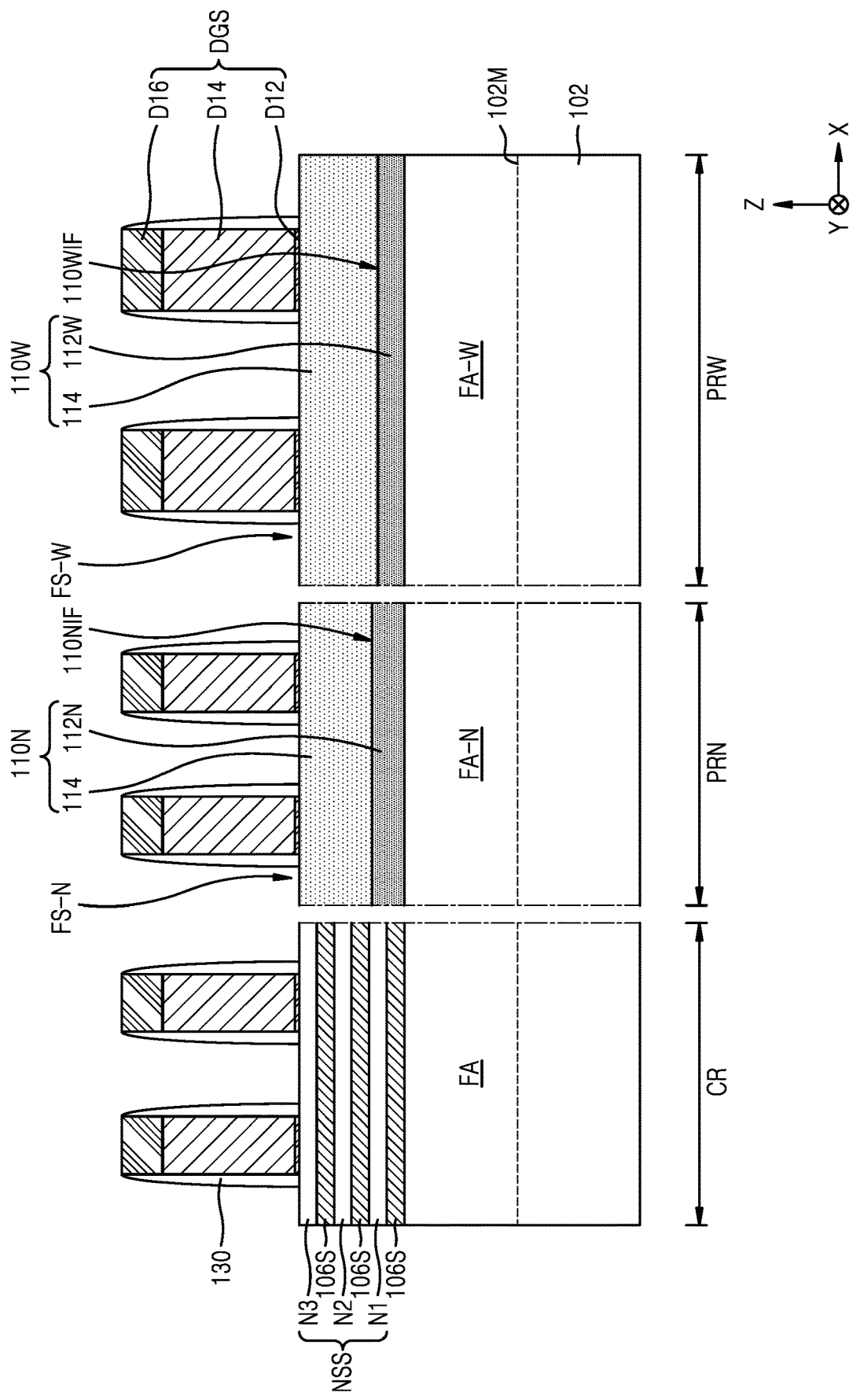

Referring to FIGS. 31 and 32 together, a device isolation layer 118 is formed by performing a recess operation to remove a portion of the preliminary device isolation layer 118p from the top surface thereof by a certain thickness. The sidewalls of the nano-sheet stacked structure NSS of the nano-sheets N1, N2, and N3 and the sacrificial semiconductor layers 106S in the cell region CR, the sidewalls of the first semiconductor layers 110N in the first peripheral circuit region PRN, and the sidewalls of the second semiconductor layers 110W in the second peripheral circuit region PRW may be exposed without being covered by the device isolation layer 118.

In the second horizontal direction (Y direction), a third width w3 of the first semiconductor layer 110N may be less than a fourth width w4 of the second semiconductor layer 110W. Also, the width of the first fin-type active region FA-N in the second horizontal direction (Y direction) may be generally similar to or slightly greater than the third width W3, and the width of the second fin-type active region FA-W in the second horizontal direction (Y direction) may be generally similar to or slightly greater than the fourth width W4. In other words, the width of the first fin-type active region FA-N may be less than the width of the second fin-type active region FA-W in the second horizontal direction (Y direction).

Referring to FIGS. 33A and 33B together, the dummy gate structures DGS extending and intersecting with at least portions of the first fin-type active regions FA-N having formed thereon the first semiconductor layers 110N in the first peripheral circuit region PRN, the second fin-type active regions FA-W having formed thereon the second semiconductor layers 110W in the second peripheral circuit region PRW, and the third fin-type active regions FA having formed thereon the nano-sheet stacked structure NSS of the nano-sheets N1, N2, and N3 and the sacrificial semiconductor layers 106S in the cell region CR are formed. The dummy gate structures DGS may extend parallel to one another in the second horizontal direction (Y direction). The dummy gate structure DGS may have a structure in which an oxide film D12, a dummy gate layer D14, and a capping layer D16 are sequentially stacked. Next, a gate spacer 130 covering both sidewalls of the dummy gate structure DGS is formed.

Figure 34:
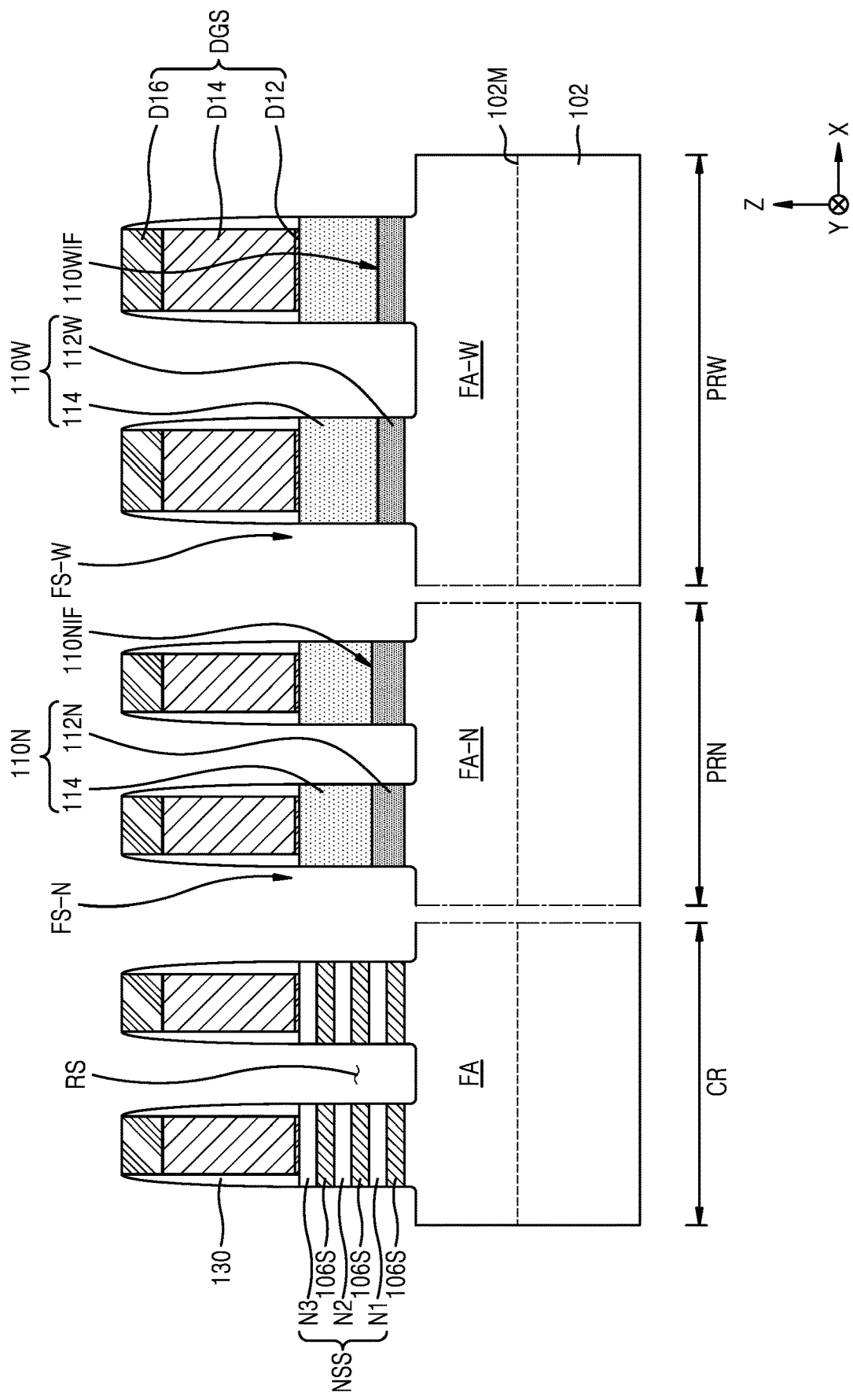

Referring to FIG. 34, the recessed region RS is formed by removing portions of the nano-sheet stacked structure NSS of the nano-sheets N1, N2, and N3 and the sacrificial semiconductor layers 106S, a portion of the first semiconductor layers 110n, and a portion of the second semiconductor layers 110w through an etching operation using the dummy gate structure DGS and the gate spacer 130 as an etching mask. In some exemplary embodiments, during the formation of the recessed region RS, upper portions of the first fin-type active regions FA-N, the second fin-type active regions FA-W, and the third fin-type active regions FA may be partially removed together.

Figure 35:
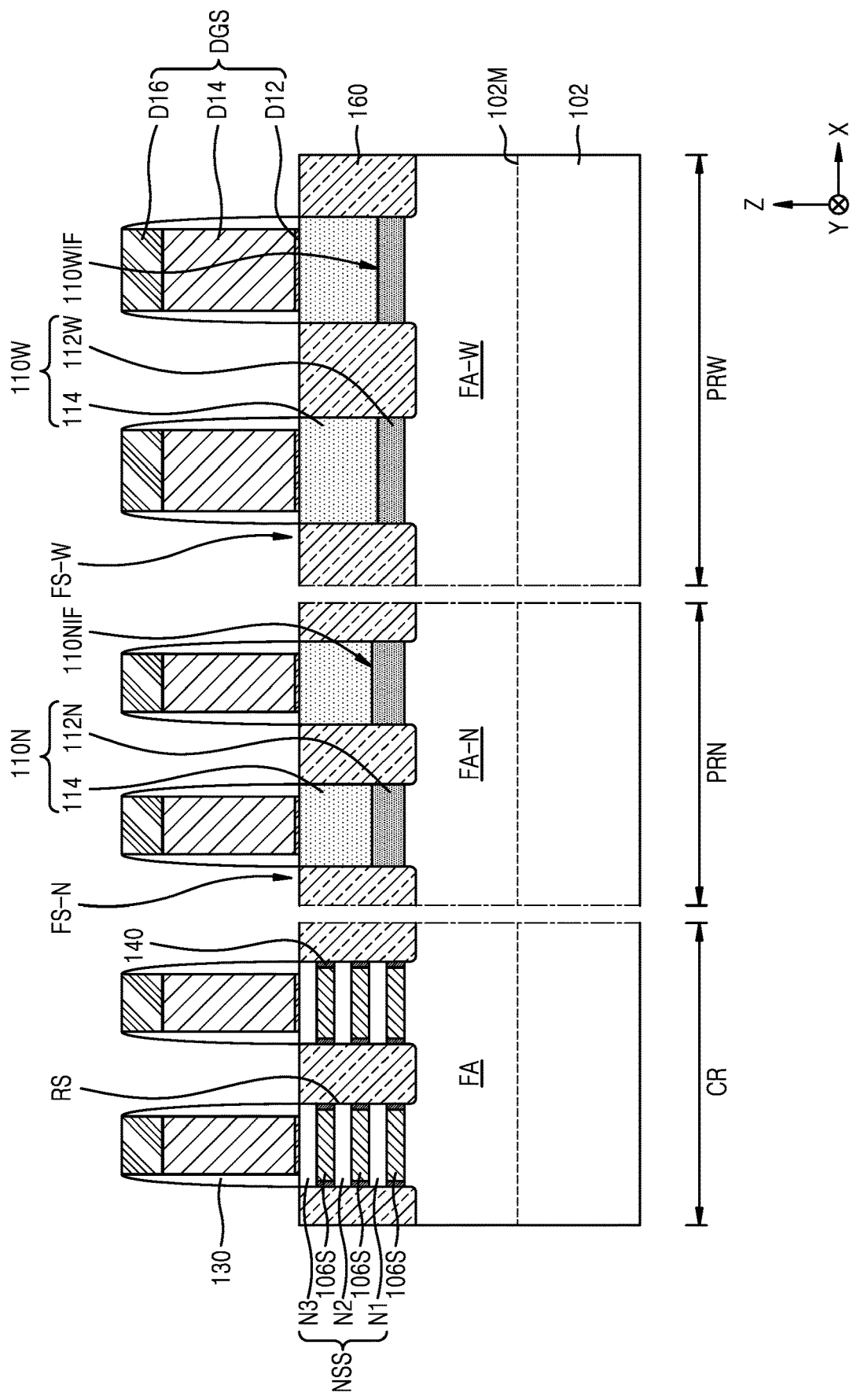

Referring to FIGS. 34 and 35 together, after forming removed spaces by removing portions of the semiconductor layers 106S exposed on both sides of the nano-sheet stacked structures NSS by performing an isotropic etching operation onto the cell region CR, insulation spacers 140 filling the removed spaces formed between the nano-sheets N1, N2, and N3 are formed.

Next, the source/drain regions 160 are formed by epitaxially growing a semiconductor material from exposed sidewalls of the nano-sheets N1, N2, and N3 and the exposed surfaces of the third fin-type active regions FA in the cell region CR, the exposed surface of the first fin-type stacked structure FS-N in the first peripheral circuit region PRN, and the exposed surface of the second fin-type stacked structure FS-W in the second peripheral circuit region PRW.

Figure 36:
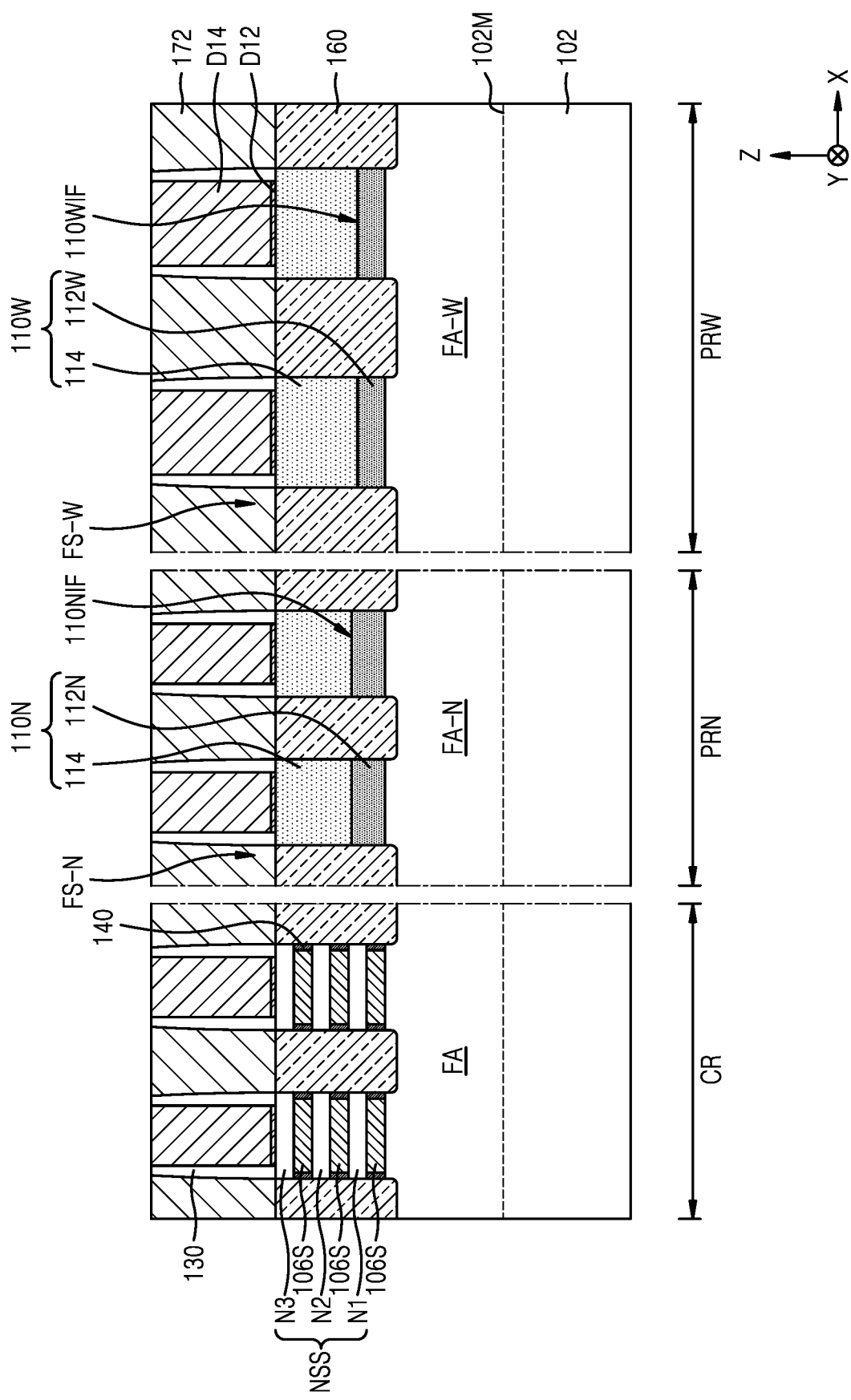

Referring to FIGS. 35 and 36 together, an inter-gate insulation film 172 is formed on the dummy gate structures DGS and the source/drain regions 160, the capping layer D16 covering the top surface of the dummy gate layer D14 is removed by planarizing the inter-gate insulation film 172, and the gate spacer 130, the protective film 138, and the inter-gate insulation film 172 around the capping layer D16 are polished from the top surfaces thereof by a portion of the thicknesses thereof. As a result, the top surface of the inter-gate insulation film 172 is at approximately the same level as the top surface of the dummy gate layer D14.

Figure 37:
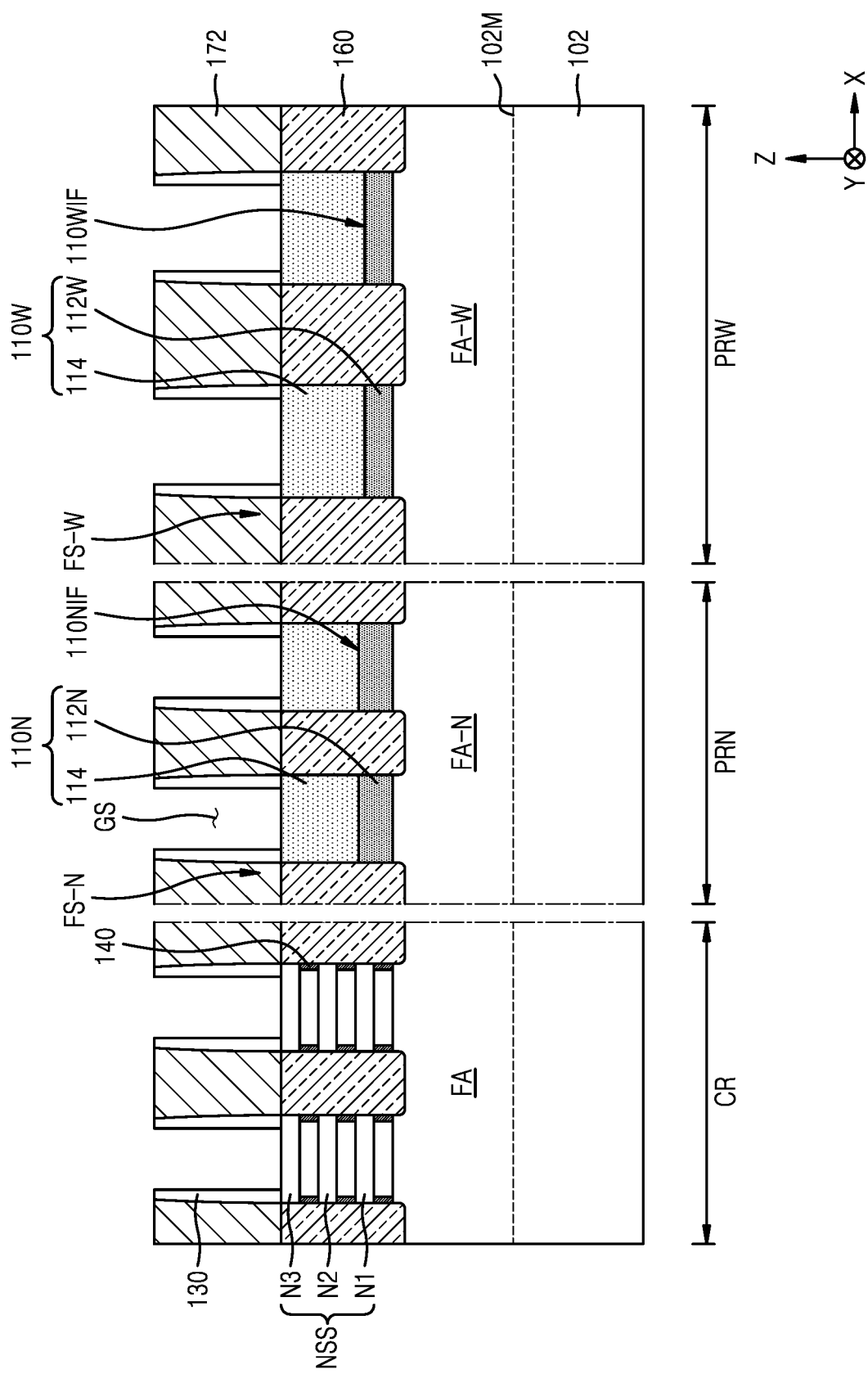

Referring to FIGS. 36 and 37 together, the dummy gate layer D14 exposed through the inter-gate insulation film 172 and the oxide film D12 below the dummy gate layer D14 are removed, and the sacrificial semiconductor layers 106S remaining on the third fin-type active regions FA in the cell region CR are at least partially removed, thereby forming a plurality of gate spaces GS.

Referring to FIGS. 37 and 38 together, the gate dielectric film 145 is formed on surfaces exposed in the gate spaces GS in the cell region CR, the first peripheral circuit region PRN, and the second peripheral circuit region PRW, and the gate electrodes 150 filling the gate spaces GS above the gate dielectric film 145 are formed. The gate electrodes 150 may extend in parallel to one another in the second horizontal direction (Y direction).

In the cell region CR, the gate electrode 150 may include the main gate portion 150M and the sub gate portions 150S connected to the main gate portion 150M. In the cell region CR, the insulation spacers 140 may be disposed on both ends of each of the sub-gate portions 150S with the gate dielectric film 145 therebetween.

In the first peripheral circuit region PRN and the second peripheral circuit region PRW, the gate electrodes 150 may include the main gate portions 150M covering the first fin-type stacked structures FS-N and the second fin-type stacked structures FS-W and may not include the sub-gate portions 150S.

Figure 39A:
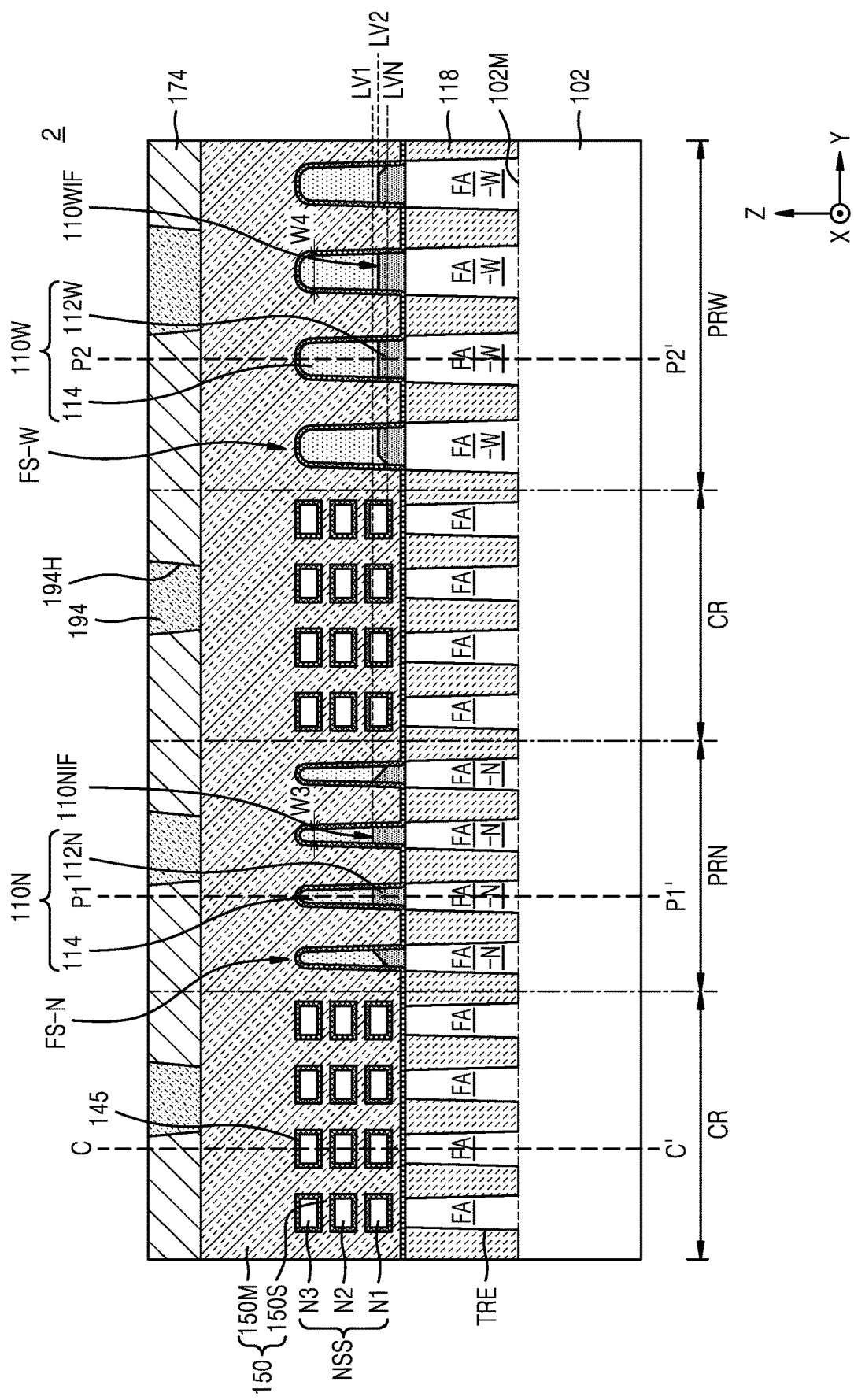
Figure 39B:
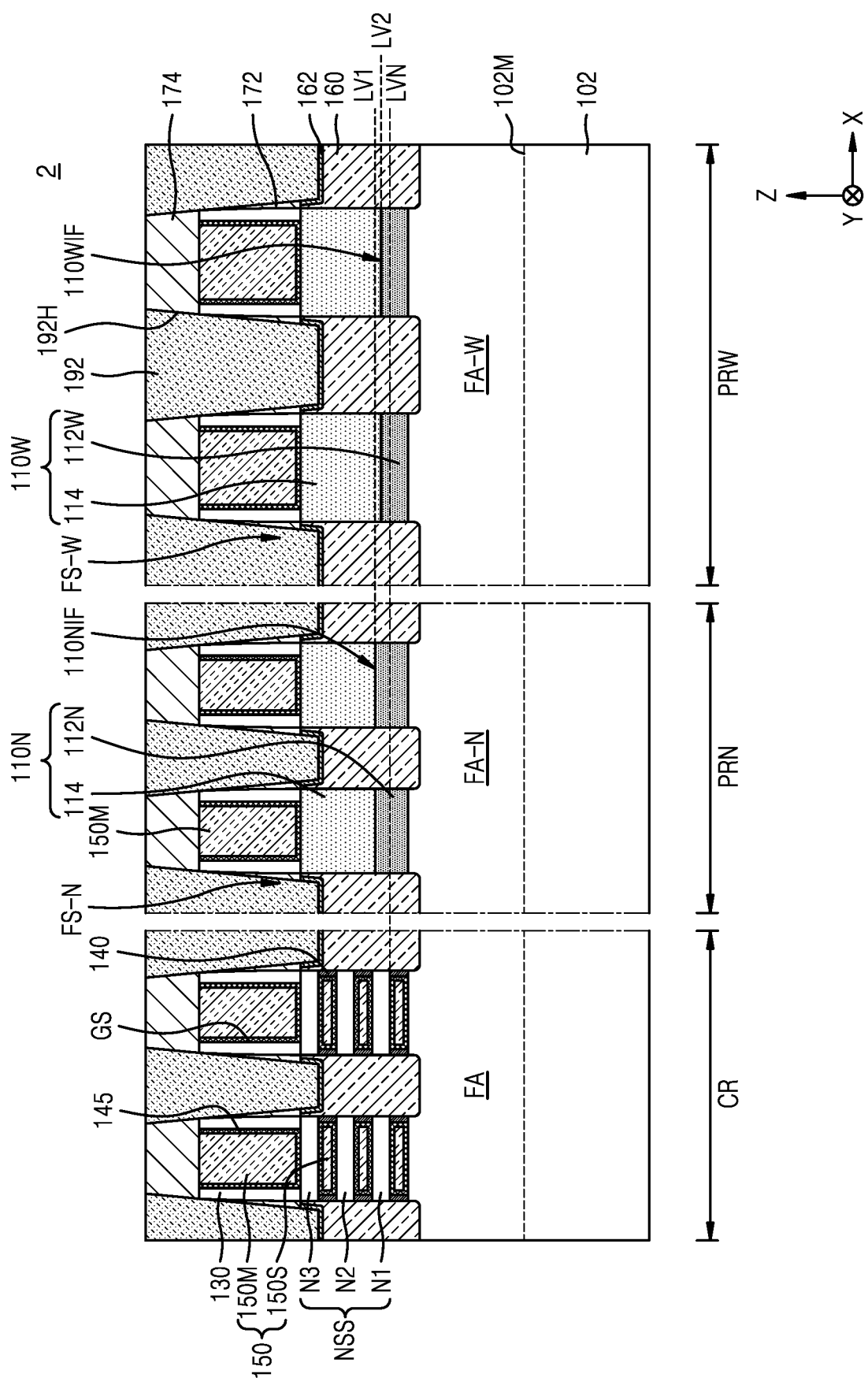

Referring to FIGS. 39A and 39B together, an integrated circuit device 2 is formed by forming the interlayer insulation film 174, forming the first contact plugs 192 filling the first contact holes 192H penetrating through the interlayer insulation film 174 and the inter-gate insulation film 172 and the second contact plugs 194 filling the second contact holes 194H penetrating through the inter-gate insulation film 174. The metal silicide films 162 may be disposed between the source/drain regions 160 and the first contact plugs 192, respectively.

The integrated circuit device 2 includes the first fin-type active regions FA-N, the second fin-type active regions FA-W, and the third fin-type active regions FA protruding upward in the vertical direction (Z direction) from the main surface 102M (e.g., top surface) of the substrate 102 and extending in the first horizontal direction (X direction) respectively in the first peripheral circuit region PRN, the second peripheral circuit region PRW, and the cell region CR, the nano-sheet stacked structure NSS facing the top surfaces of the third fin-type active regions FA at a location apart from the top surfaces of the third fin-type active regions FA, the first semiconductor layers 110N arranged on the first fin-type active regions FA-N in the first peripheral circuit region PRN, and the second semiconductor layers 110W arranged on the second fin-type active regions FA-W in the second peripheral circuit region PRW. The trenches TRE defining the first fin-type active regions FA-N, the second fin-type active regions FA-W, and the third fin-type active regions FA may be formed in the substrate 102.

The nano-sheet stacked structures NSS are apart from the top surface of the third fin-type active regions FA. The nano-sheet stacked structures NSS may include the nano-sheets N1, N2, and N3 extending on the substrate 102 in parallel to the top surface of the third fin-type active regions FA The first lower semiconductor layer 112N and the first upper semiconductor layer 114 constituting the first semiconductor layer 110N are sequentially stacked on the top surface of the first fin-type active region FA-N in the first peripheral circuit region PRN. The top surface of the first fin-type active region FA-N and the bottom surface of the first lower semiconductor layer 112N may contact each other. The top surface of the first lower semiconductor layer 112N and the bottom surface of the first upper semiconductor layer 114 may contact each other and may have the first semiconductor interface 110NIF.

In some exemplary embodiments, the first semiconductor interface 110NIF of at least one outer first semiconductor layer 110N from among the first semiconductor layers 110N arranged in the first peripheral circuit region PRN may be along a plane having a slope with respect to the top surface or the main surface 102M of the substrate 102, and the first semiconductor interface 110NIF of at least one inner first semiconductor layer 110N from among the first semiconductor layers 110N may be along a plane parallel to the top surface or the main surface 102M of the substrate 102

The second lower semiconductor layer 112W and the second upper semiconductor layer 114 constituting the second semiconductor layer 110W are sequentially stacked on the top surface of the second fin-type active region FA-W in the second peripheral circuit region PRW. The top surface of the second fin-type active region FA-W and the bottom surface of the second lower semiconductor layer 112W may contact each other. The top surface of the second lower semiconductor layer 112W and the bottom surface of the second upper semiconductor layer 114 may contact each other and may have the second semiconductor interface 110WIF.

In some exemplary embodiments, the second semiconductor interface 110WIF of at least one outer second semiconductor layer 110W from among the second semiconductor layers 110W arranged in the second peripheral circuit region PRW may have a plurality of surfaces having different slopes from one another. For example, the second semiconductor interface 110WIF of at least one outer second semiconductor layer 110W from among the second semiconductor layers 110W arranged in the second peripheral circuit region PRW may have both a surface having a slope with respect to the top surface or the main surface 102M of the substrate 102 and a surface parallel to the top surface or the main surface 102M of the substrate 102. In some exemplary embodiments, the second semiconductor interface 110WIF of at least one inner second semiconductor layer 110W from among the second semiconductor layers 110W arranged in the second peripheral circuit region PRW may be along a plane parallel to the top surface or the main surface 102M of the substrate 102.

The gate electrodes 150 may extend in the second horizontal direction (Y direction) intersecting with the first horizontal direction (X direction) on the first fin-type active region FA-N, the second fin-type active region FA-W, and the third fin-type active region FA.

The source/drain regions 160 are formed on the first fin-type active regions FA-N in the first peripheral circuit region PRN, the second fin-type active regions FA-W in the second peripheral circuit region PRW, and the third fin-type active regions FA in the cell region CR.

On the source/drain regions 160, the inter-gate insulation film 172 and the interlayer insulation film 174 are sequentially formed. The first contact plugs 192 penetrating through the interlayer insulation film 174 and the inter-gate insulation film 172 may be connected to the source/drain regions 160. The metal silicide film 162 may be between the source/drain regions 160 and the first contact plugs 192. The second contact plugs 194 penetrating through the interlayer insulation film 174 may be connected to the gate electrodes 150.

In the integrated circuit device 2 according to one or more exemplary embodiments, the first semiconductor layer 110N and the second semiconductor layer 110W may be formed in a relatively low temperature range, and thus the reliability of the integrated circuit device 2 may be secured.

Figure 40:
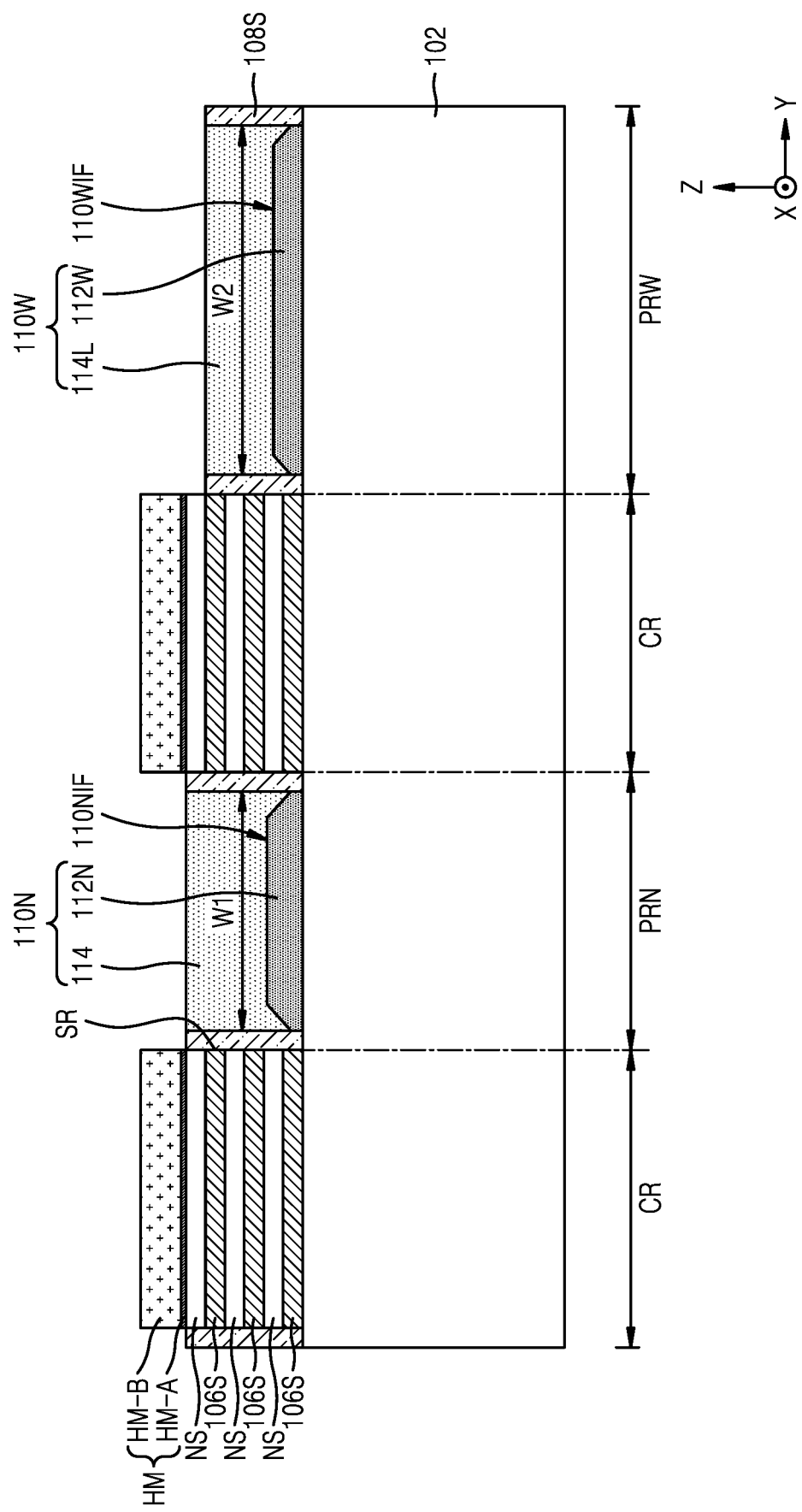
FIGS. 40 to 42 are cross-sectional views of operations of a method of manufacturing an integrated circuit device, according to one or more exemplary embodiments, and an integrated circuit device manufactured thereby.
Figure 41:
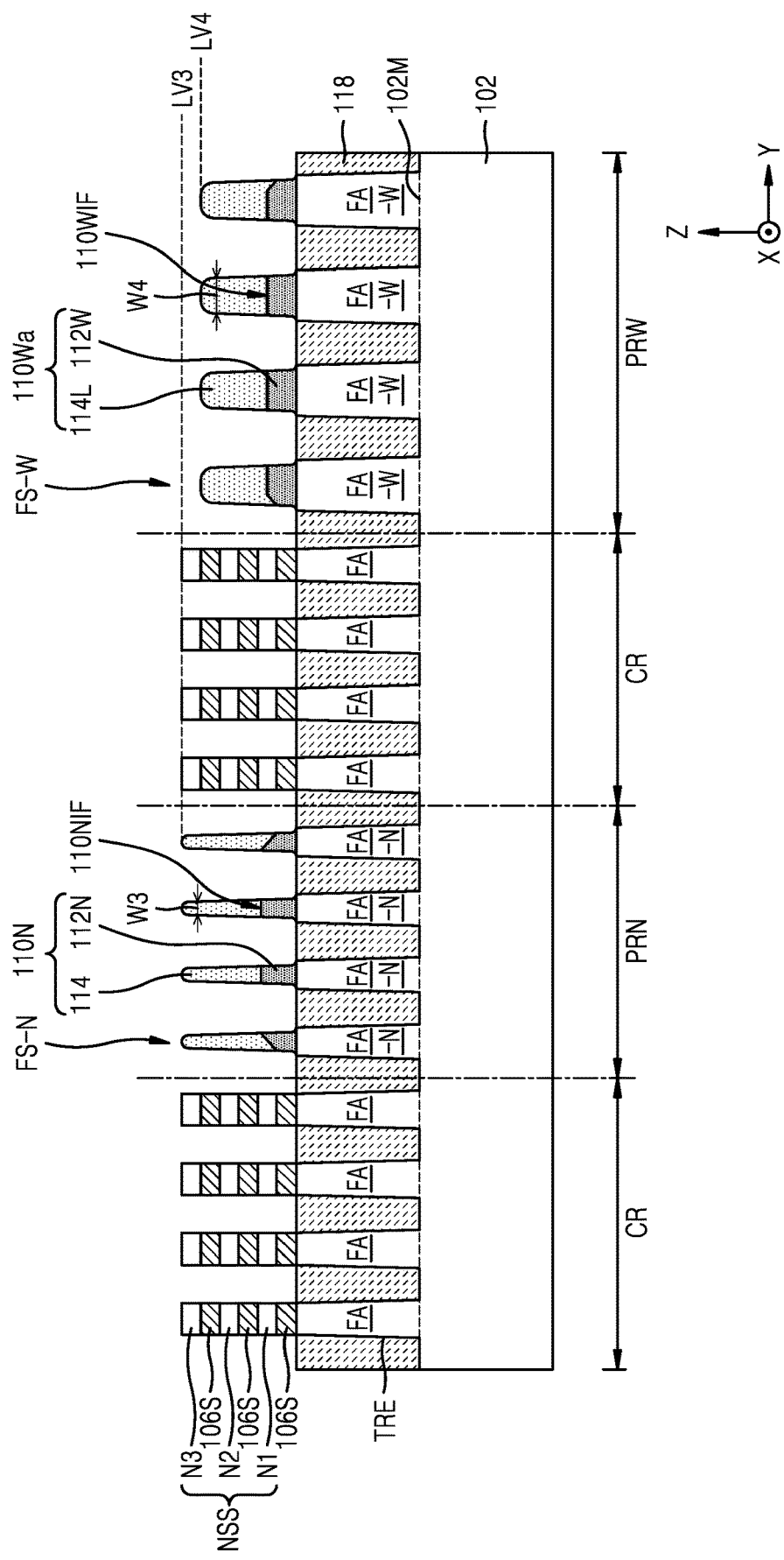
Figure 42:
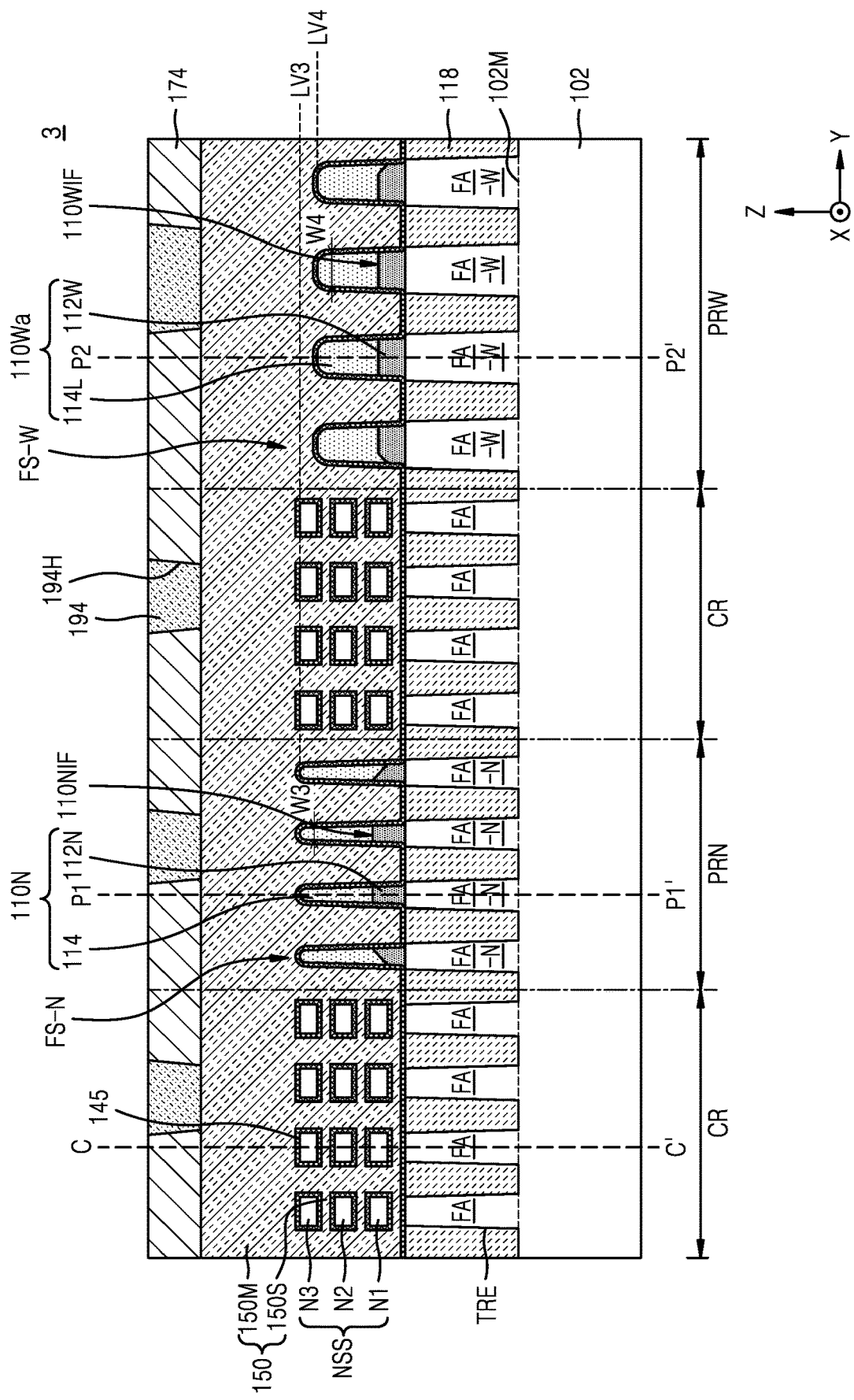

FIGS. 40 to 42 are cross-sectional views of operations of a method of manufacturing an integrated circuit device, according to one or more exemplary embodiments, and an integrated circuit device manufactured thereby. Descriptions identical or substantially similar to those given above may be omitted below. In detail, FIGS. 40 to 42 are cross-sectional views taken along the Y-Z plane.

Referring to FIGS. 27 and 40 together, the upper portion of the semiconductor crystalline layer 114 shown in FIG. 27 is removed. The upper portion of the cover spacer 108S may also be partially removed during the operation for partially removing the upper portion of the semiconductor crystalline layer 114.

In some exemplary embodiments, when the second width W2 of the stack recess SR in the second peripheral circuit region PRW defined by the cover insulation layer 108 in the second horizontal direction (Y direction) is greater than the first width W1 of the first peripheral circuit region PRN, a loading effect may occur. In this case, the upper portion of the semiconductor crystalline layer 114 removed in the second peripheral circuit region PRW may be larger than the upper portion of the semiconductor crystalline layer 114 removed in the first peripheral circuit region PRN. Thus, the level of the top surface of the semiconductor crystalline layer 114 in the second peripheral circuit region PRW may be lower than the level of the top surface of the semiconductor crystalline layer 114 in the first peripheral circuit region PRN.

Referring to FIGS. 40 and 41 together, after the hard mask pattern HM formed on the stacked structure of the sacrificial semiconductor layers 106S and the nano-sheet semiconductor layers NS is removed in the cell region CR, the stacked structure of the sacrificial semiconductor layers 106S and the nano-sheet semiconductor layers NS, the first semiconductor layer 110N, the second semiconductor layer 110W, and a portion of the substrate 102 are etched to form the trenches TRE. As a result, a plurality of first fin-type active regions FA-N defined by the trenches TRE may be formed in the first peripheral circuit region PRN, a plurality of second fin-type active regions FA-W defined by the trenches TRE may be formed in the second peripheral circuit region PRW, and a plurality of third fin-type active regions FA defined by the trenches TRE may be formed in the cell region CR.

The first semiconductor layers 110N, which are a stacked structure of the first lower semiconductor layer 112N and the first upper semiconductor layer 114, may be arranged on the first fin-type active regions FA-N in the first peripheral circuit region PRN. Second semiconductor layers 110Wa, which are a stacked structure of the second lower semiconductor layer 112W and the second upper semiconductor layer 114L, may be arranged on the second fin-type active regions FA-W in the second peripheral circuit region PRW. In the second horizontal direction (Y direction), the third width w3 of the first semiconductor layer 110N may be less than the fourth width w4 of the second semiconductor layer 110Wa. A third level LV3 of the top end of the first semiconductor layers 110N may be higher than a fourth level LV4 of the top end of the second semiconductor layers 110Wa.

The sacrificial semiconductor layers 106S and a stacked structure NSS of a plurality of nano-sheets N1, N2, and N3 may be disposed on the third fin-type active regions FA in the cell region CR.

Referring to FIG. 42, the integrated circuit device 3 includes the first fin-type active regions FA-N, the second fin-type active regions FA-W, and the third fin-type active regions FA protruding upward in the vertical direction (Z direction) from the main surface 102M (e.g., top surface) of the substrate 102 and extending in the first horizontal direction (X direction) respectively in the first peripheral circuit region PRN, the second peripheral circuit region PRW, and the cell region CR, the nano-sheet stacked structure NSS facing the top surfaces of the third fin-type active regions FA at a location apart from the top surfaces of the third fin-type active regions FA, the first semiconductor layers 110N arranged on the first fin-type active regions FA-N in the first peripheral circuit region PRN, and the second semiconductor layers 110Wa arranged on the second fin-type active regions FA-W in the second peripheral circuit region PRW. The trenches TRE defining the first fin-type active regions FA-N, the second fin-type active regions FA-W, and the third fin-type active regions FA may be formed in the substrate 102.

The nano-sheet stacked structures NSS are apart from the top surfaces of the third fin-type active regions FA and may include the nano-sheets N1, N2, and N3 extending on the substrate 102 in parallel to the top surface of the third fin-type active regions FA.

The levels of the top ends of the first fin-type active regions FA-N, the second fin-type active regions FA-W, and the third fin-type active regions FA may be substantially the same. The third level LV3 of the top end of the first semiconductor layers 110N on the first fin-type active regions FA-N may be higher than the fourth level LV4 of the top end of the second semiconductor layers 110Wa on the second fin-type active regions FA-W. In some exemplary embodiments, the top surface of a nano-sheet N3 farthest from the substrate 102 from among the nano-sheets N1, N2, and N3 may be at the third level LV3.

In the integrated circuit device 3 according to one or more exemplary embodiments, the first semiconductor layer 110N and the second semiconductor layer 110Wa may be formed in a relatively low temperature range, and thus the reliability of the integrated circuit device 3 may be secured.

While exemplary embodiments have been particularly shown and described with reference to the drawings, it will be understood that various changes in form and details may be made therein without departing from the spirit and scope of the inventive concept, the scope of which is defined at least in following claims.

What is claimed is:

1. An integrated circuit device comprising:
a plurality of fin-type active regions protruding from a top surface of a substrate and extending in a first horizontal direction;
at least one semiconductor layer, each comprising a lower semiconductor layer and an upper semiconductor layer sequentially stacked on at least one of the plurality of fin-type active regions; and
a plurality of gate electrodes extending in a second horizontal direction crossing the first horizontal direction on the plurality of fin-type active regions,
wherein the lower semiconductor layer comprises a same material as a material of the upper semiconductor layer,
wherein a semiconductor interface is provided between a top surface of the lower semiconductor layer and a lowest surface of the upper semiconductor layer,
wherein at least a portion of the semiconductor interface extends from a first end of the semiconductor interface to an interior of the semiconductor interface along a plane parallel to a top surface of the substrate and at least another portion of the semiconductor interface has a slope with respect to the top surface of the substrate and extends from the interior of the semiconductor interface to a second end of the semiconductor interface opposite the first end, and wherein the lower semiconductor layer and the upper semiconductor layer have a same crystallinity.

2. The integrated circuit device of claim 1, further comprising:

at least one source/drain region on the at least one semiconductor layer and the at least one of the plurality of fin-type active regions.

3. The integrated circuit device of claim 1, further comprising:

a nano-sheet stacked structure comprising a plurality of nano-sheets stacked apart from one another above a top surface of a fin-type active region, among the plurality of the fin-type active regions, and extending parallel to the top surface of the fin-type active region, each of the plurality of nano-sheets comprising a channel region, wherein portions of a gate electrode, among the plurality of gate electrodes, fill spaces between the nano-sheets.

4. The integrated circuit device of claim 3, wherein a topmost level of the semiconductor interface relative to the substrate in a vertical direction is higher than a level of a bottom surface of a nano-sheet, among the plurality of nano-sheets, closest to the substrate.

5. The integrated circuit device of claim 4, wherein the topmost level of the semiconductor interface relative to the substrate in the vertical direction is lower than a level of a top surface of the nano-sheet closest to the substrate.

6. The integrated circuit device of claim 1, wherein:

the at least one semiconductor layer comprises at least three semiconductor layers respectively arranged on at least three fin-type active regions arranged in the second horizontal direction at a constant pitch from among the plurality of fin-type active regions;

at least a portion of a semiconductor interface of at least one outer semiconductor layer, from among the at least three semiconductor layers, has a slope with respect to the top surface of the substrate; and a semiconductor interface of at least one inner semiconductor layer, from among the at least three semiconductor layers, is along a plane parallel to the top surface of the substrate.

7. The integrated circuit device of claim 6, wherein the semiconductor interface of the at least one outer semiconductor layer from among the at least three semiconductor layers has a first portion parallel to the top surface of the substrate and at least one second portion having a slope with respect to the top surface of the substrate.

8. An integrated circuit device comprising:

a plurality of first fin-type active regions extending from a top surface of a substrate, in a first peripheral circuit region, in a first horizontal direction;

a plurality of second fin-type active regions extending from the top surface of the substrate, in a second peripheral circuit region, in the first horizontal direction;

a plurality of first semiconductor layers on the plurality of first fin-type active regions and each comprising:

a first lower semiconductor layer and a first upper semiconductor layer sequentially stacked on a corresponding first fin-type active region among the plurality of first fin-type active regions, and a first semiconductor interface between a top surface of the first lower semiconductor layer and a lowest surface of the first upper semiconductor layer;

a plurality of second semiconductor layers on the plurality of second fin-type active regions and each comprising:

a second lower semiconductor layer and a second upper semiconductor layer sequentially stacked on a corresponding second fin-type active region among the plurality of second fin-type active regions, and a second semiconductor interface between the second lower semiconductor layer and the second upper semiconductor layer; and a plurality of gate electrodes extending in a second horizontal direction crossing the first horizontal direction on the substrate, wherein a topmost level of the first semiconductor interface relative to the substrate in the vertical direction is higher than a topmost level of the second semiconductor interface relative to the substrate in the vertical direction, and a first semiconductor interface of at least one outer first semiconductor layer from among the plurality of first semiconductor layers has a slope, extending from end to end of the first semiconductor interface, with respect to the top surface of the substrate.

9. The integrated circuit device of claim 8, wherein, in the second horizontal direction, a first width of the first peripheral circuit region is less than a second width of the second peripheral circuit region.

10. The integrated circuit device of claim 8, wherein, in the second horizontal direction, a third width of each of the plurality of first semiconductor layers is less than a fourth width of each of the plurality of second semiconductor layers.

11. The integrated circuit device of claim 8, wherein a level of a top surface of each of the plurality of first semiconductor layers is higher than a level of a top surface of each of the plurality of second semiconductor layers.

12. The integrated circuit device of claim 8, wherein:

a first semiconductor interface of at least one inner first semiconductor layer from among the plurality of first semiconductor layers is along a plane parallel to the top surface of the substrate.

13. The integrated circuit device of claim 8, wherein:

a second semiconductor interface of at least one outer second semiconductor layer from among the plurality of second semiconductor layers comprises a portion parallel to the top surface of the substrate and at least one other portion having a slope with respect to the top surface of the substrate; and a second semiconductor interface of at least one inner second semiconductor layer from among the plurality of second semiconductor layers is along a plane parallel to the top surface of the substrate.

14. An integrated circuit device comprising:

a plurality of fin-type active regions protruding from a top surface of a substrate, which includes a cell region and a peripheral circuit region, and extending in a first horizontal direction;

a nano-sheet stacked structure comprising a plurality of nano-sheets stacked apart from one another above a top surface of a fin-type active region in the cell region, among the plurality of the fin-type active regions, and extending parallel to the top surface of the fin-type active region, each of the plurality of nano-sheets comprising a channel region;

at least one semiconductor layer each comprising:

a lower semiconductor layer and an upper semiconductor layer sequentially stacked on at least one of the plurality of fin-type active regions, and a semiconductor interface between the lower semiconductor layer and the upper semiconductor layer; and a plurality of gate electrodes extending in a second horizontal direction crossing the first horizontal direction on the plurality of fin-type active regions, wherein, in the peripheral circuit region, the lower semiconductor layer and the upper semiconductor layer have a same crystallinity, and wherein at least a portion of the semiconductor interface extends from a first end of the semiconductor interface to an interior of the semiconductor interface along a plane parallel to a top surface of the substrate and at least another portion of the semiconductor interface has a slope with respect to the top surface of the substrate and extends from the interior of the semiconductor interface to a second end of the semiconductor interface opposite the first end.

15. The integrated circuit device of claim 14, wherein a topmost level of the semiconductor interface relative to the substrate in a vertical direction is lower than a level of a top surface of a nano-sheet, among the plurality of nano-sheets, closest to the substrate.

16. The integrated circuit device of claim 14, wherein, in the peripheral circuit region, a fin-type active region, among the plurality of fin-type active regions, the lower semiconductor layer, and the upper semiconductor layer have the same crystallinity.

* * * * *